(12) United States Patent
Hubbard et al.

(10) Patent No.: US 11,085,114 B2
(45) Date of Patent: Aug. 10, 2021

(54) ELECTROSTATIC COATING OF METAL THIN LAYERS WITH ADJUSTABLE FILM PROPERTIES

(71) Applicant: Arizona Board of Regents on Behalf of the University of Arizona, Tucson, AZ (US)

(72) Inventors: Lance R. Hubbard, Richland, WA (US); Anthony Muscat, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 94 days.

(21) Appl. No.: 15/814,260

(22) Filed: Nov. 15, 2017

(65) Prior Publication Data

US 2018/0135184 A1 May 17, 2018

Related U.S. Application Data

(60) Provisional application No. 62/423,085, filed on Nov. 16, 2016.

(51) Int. Cl.
*C23C 18/16* (2006.01)
*C23C 18/38* (2006.01)
(Continued)

(52) U.S. Cl.
CPC ...... *C23C 18/1687* (2013.01); *C23C 18/1637* (2013.01); *C23C 18/1642* (2013.01);
(Continued)

(58) Field of Classification Search
CPC .................................................. C23C 18/1687
See application file for complete search history.

(56) References Cited

U.S. PATENT DOCUMENTS

2015/0194242 A1\* 7/2015 Muscat .................... B22F 9/24
427/123

OTHER PUBLICATIONS

Inoue et al. (2012) "Electroless Copper Bath Stability Monitoring with UV-VIS Spectroscopy, pH, and Mixed Potential Measurements," J. Electrochem. Soc., vol. 159, No. 7, pp. D437-D441.

(Continued)

*Primary Examiner* — Alex A Rolland
(74) *Attorney, Agent, or Firm* — Lathrop GPM LLP

(57) ABSTRACT

Methods for forming thin, pinhole-free conformal metal layers on both conducting and non-conducting surfaces, where the morphology and properties of the metal layers are tuned to meet desired parameters by adjusting the concentration of ionic liquids during the deposition process. The formed metal films contain tunable properties for solar and electronic use and provide specific advantages for non-conducting surfaces, which are otherwise unsuitable for electroplating without the presence of the formed metal films. The disclosed methods do not require the presence of a voltage or external electric field but form the metal films through an electroless technique using electrostatic interactions between negatively charged nanoparticles. In addition, the disclosed methods are compatible with solution phase processing and eliminate the need to transfer the surfaces into a vacuum chamber for a chemical or physical vapor deposition to form a metal layer.

23 Claims, 55 Drawing Sheets

(51) Int. Cl.
 *C23C 18/18* (2006.01)
 *H01L 21/768* (2006.01)
 *H01L 21/288* (2006.01)

(52) U.S. Cl.
 CPC ...... *C23C 18/1692* (2013.01); *C23C 18/1834* (2013.01); *C23C 18/1882* (2013.01); *C23C 18/38* (2013.01); *H01L 21/288* (2013.01); *H01L 21/768* (2013.01); *H01L 21/76873* (2013.01); *H01L 21/76898* (2013.01)

(56) References Cited

OTHER PUBLICATIONS

Armini et al. (2010) "Materials Engineering for Future Interconnects: "Catalyst-Free" Electroless Cu Deposition on Self-Assembled Monolayer Alternative Barriers," J. Electrochem. Soc., vol. 157, No. 1, pp. D74-D80.
Kawasaki et al. (2011) "Microwave-assisted polyol synthesis of copper nanocrystals without using additional protective agents," Chem. Comm., vol. 47, pp. 7740-7742.

\* cited by examiner

Molybdenum: CuNPs on Moly:

Post-Sinter SEM Surface Image:

CuNPs on Si:

SEM Surface Image:

Post Sinter CuNPs on SiO$_2$:

Post Sinter CuNPs-APTMS on SiO$_2$:

Post-sinter CuNPs on SiO$_2$:

CuNPs on SiO$_2$:

Control, no I.L.:

[bmim][BF$_4$] I.L.:

ELECTROSTATIC COATING OF METAL THIN LAYERS WITH ADJUSTABLE FILM PROPERTIES

CROSS REFERENCE TO RELATED APPLICATIONS

This application claims priority from U.S. Provisional Application No. 62/423,085, filed Nov. 16, 2017, which is incorporated by reference herein to the extent that there is no inconsistency with the present disclosure.

BACKGROUND OF THE INVENTION

Chemical and physical deposition techniques have been implemented as a fabrication platform for forming high quality metal structures for a range of applications including microelectronics. Chemical deposition typically forms metal films via chemical or electrochemical reactions of deposition precursors on a substrate surface often at elevated temperatures. In typical physical deposition techniques, metals are condensed on a surface from a plasma or a gas, typically generated by vacuum, evaporation, electron beam evaporation or sputtering methods. Given the versatility of these methods, a range of chemical and physical deposition techniques have been specifically developed for fabrication of integrated circuits. Techniques such as Atomic Layer Deposition (ALD) or Chemical Vapor Deposition (CVD) provide useful tools for forming thin metal films for active and passive components of integrated circuits. Applications of these techniques for making integrated circuits include fabrication of multilayer structures including seed layers, adhesion layers, barrier layers, deposition layers, etc. providing physical and chemical properties beneficial for a range of device components, such as electrical interconnections, gate electrodes and contacts.

As chemical and physical deposition are vacuum deposition techniques, these methods require the substrate undergoing processing to be provided in a high vacuum environment. Accordingly, state of the art chemical and physical deposition is not directly compatible with solution phase processing for making certain components of integrated circuits. In addition, use of chemical and physical deposition techniques for coating or filling surfaces having a nonplanar morphology, such as a via or trench structure, is challenging due to formation of pinholes or voids arising from issues involving gas phase transport of precursors to a surface undergoing processing.

Alternative deposition techniques such as electrodeposition and electroplating, while being compatible with solution phase processing require the application of a voltage to a surface to be coated with a metal. These techniques, therefore, can be significantly limited in their ability to coat or fill the surfaces of non-conducting substrates, such as dielectrics and insulators.

In view of the foregoing, there is a need for improved methods and processes for coating metal structures, such as thin metal films and layers. There is also a need for methods and processes that are able to tune the desired properties of metal layers and films through the coating process. Techniques are also needed that are compatible with lower cost, liquid phase processing that are capable of depositing high quality metal films for components of integrated circuits and electronic devices.

SUMMARY OF THE INVENTION

The invention is in the field of processing or fabrication of metallic structures, such as thin metal films, layers, and coatings. The invention relates generally to liquid phase processing involving deposition of metallic nanoparticles on a surface, for example, to form void free, cohesive metal films and other structures for a range of electronic, optical and electro-optic systems. Furthermore, the morphology and properties of the formed metallic structures, such as electrical conductivity, photoluminescence, and absorbance, are tuned to meet desired parameters by adjusting the concentration of ionic liquids during the deposition process. The present invention provides, for example, methods of making high quality, metallic structures that have tunable properties for solar and electronic use and that are complementary to current state of the art liquid phase processing for microelectronics.

Aspects of the invention involve solution phase processes for generating metallic nanoparticles having a negatively charged outer layer that reduces the rates of agglomeration and oxidation of the nanoparticles in solution. Aspects of the invention involve solution phase processes whereby electrostatic interactions between metallic nanoparticles having a negatively charged outerlayer and a positively charged substrate surface result in deposition without the need of an applied electric field or voltage. In addition, aspects of the invention eliminate the need to transfer the surfaces into a vacuum chamber for a chemical or physical vapor deposition to form a metal layer. Embodiments of the invention, for example, involve use of particles with dimensions of less than 50 nm to achieve certain benefits including a) lowering the temperature needed in the annealing step to achieve a cohesive and electrically conductive film, b) forming metal films with thicknesses of 1500 nm or less on surfaces, and c) filling small features such as vias.

In an aspect, the invention provides methods for forming metal films by generating nanoparticles in situ in a nonaqueous solution in contact with a suitably prepared surface in which the surface has a net positive charge and in which the nanoparticles include a net negative charge and are thus electrostatically attracted to the positively charged surface. The present invention enables solution phase processing and provides for the formation of metal films comprising metals which would otherwise oxidize quickly in the presence of air. The inventions includes deposition of metallic nanoparticles having a negatively charged outerlayer on surfaces to form cohesive metallic films exhibiting high purity and an absence of voids, pinholes or grains. In addition, the present invention allows the formation of metal films on non-conducting surfaces which are otherwise unsuitable for electroplating, but also allow for subsequent deposition over the formed metal films by conventional techniques like electroplating.

In an aspect, the invention provides methods for forming a conformal metal layer on a surface of a substrate. A specific method comprises the steps of: contacting a surface having a net positive charge with a nonaqueous solution comprising a nonaqueous polar solvent, a metal particle precursor and an ionic liquid; generating in the nonaqueous solution a plurality of metal nanoparticles at least partially coated with a negatively charged outer layer comprising the ionic liquid or a reaction product or component thereof; and depositing the metal nanoparticles onto the surface to form a conformal metal layer, such as a conformal metal thin film. The metal nanoparticles are formed from the metal particle precursor. In an embodiment, the ionic liquid has a concentration in the nonaqueous solution between about 0 mM and 5.0 mM, preferably between about 0.5 mM and 4.5 mM, preferably between about 2.0 mM and 2.5 mM or between 2.1 mM and 2.4 mM. In an embodiment, the conformal metal layer formed on the substrate has a thickness between about 3 nm to 1500 nm, preferably between about 20 nm to 500 nm, or preferably between 100 nm to 400 nm.

The optical properties and electrical properties, as well as the morphology, of the conformal metal layer are able to be selected and tuned according to the concentration of the ionic liquid. Such optical properties, electrical properties, and morphology include, but are not limited to, electrical conductivity, light absorbance, photoluminescence, presence and amount of voids, surface roughness, and interparticle interactions. For example, performing the method using an ionic liquid concentration between about 2.1 mM and 2.5 mM results in increased light absorbance, photoluminescence, and conductivity. Alternatively, these properties can be decreased by using an ionic liquid concentration outside of this range.

Thus, selecting the appropriate ionic liquid concentration allows the optical properties or electrical properties of the conformal metal layer to be tuned to a desired range. In an embodiment, the conformal metal layer has an electrical conductivity between 0.5 S/m*$10^7$ and 3.0 S/m*$10^7$. In a further embodiment, the conformal metal layer has an electrical conductivity between 1.0 S/m*$10^7$ and 2.8 S/m*$10^7$. In an embodiment, the conformal metal layer has a light absorbance of 0.16 AU or greater for wavelengths from 400 nm to 800 nm. In another embodiment, the conformal metal layer has a light absorbance of 0.12 AU or less for wavelengths from 500 nm to 800 nm.

In an embodiment, the process generates metal nanoparticles having cross sectional dimensions less than 20 nm, and optionally for some applications less than 3 nm. In an embodiment, at least 50%, optionally 80%, of the surface area of the metal nanoparticles are coated with the negatively charged outer layer. In an embodiment, the metal nanoparticles are fully coated with the negatively charged outer layer.

In a specific embodiment, the conformal metal layer is a cohesive nanofilm that is substantially free of pinholes or voids, for example, wherein less than 3% of the structure comprises voids having a volume larger than $10^{-6}$ µm$^3$ (1000 nm$^3$). In an embodiment, for example, electrostatic interactions between the nanoparticles at least partially coated with the negatively charged outer layer and the surface having a net positive charge provide for the deposition of the metal nanoparticles onto the surface. In an embodiment, for example, the step of depositing the metal nanoparticles results in nanoparticles deposited with much of their ionic layers intact. In an embodiment, for example, the negatively charged outerlayer is substantially, or in some embodiments entirely, removed during the nanoparticle deposition, thereby resulting in high purity, cohesive metallic films. In an embodiment, for example, depositing the metal nanoparticles is carried out in the absence of an applied electric field or an applied voltage. In an embodiment, for example, the negatively charged outer layer is removed from the metal nanoparticles during their deposition onto the surface.

A specific embodiment further comprises a step of stopping the step of depositing the metal nanoparticles onto the surface when the conformal metal layer reaches a thickness selected from the range of 3 nm to 1500 nm, 20 nm to 500 nm, or 100 nm to 400 nm. In an embodiment, for example, the conformal metal layer is a metal nanolayer. In an embodiment, for example, the conformal metal layer is a metal layer with a thickness of one particle. In some embodiments, the conformal metal layer comprises a seed layer, barrier layer or adhesion layer for a subsequent electrodeposition or electroplating process. In an embodiment, for example, methods of this aspect further comprise electrodeposition or electroplating additional metal onto the conformal metal layer after stopping the deposition. In an embodiment, for example, methods of this aspect further comprise a step of sintering or annealing the conformal metal layer.

Certain methods of embodiments of the invention are carried out in a nonaqueous solution, such as a solution comprising a nonaqueous solvent. Use of a nonaqueous solution provides specific advantages including, for example, the ability to eliminate, minimize or reduce oxidation of the metal nanoparticles as they are formed. This permits use of metals which oxidize quickly, such as copper, nickel and aluminum, though methods of the invention are also useful for formation of films comprising noble metals or precious metals or transition metals. In a specific embodiment, the nonaqueous solution is substantially free of dissolved oxygen. In one embodiment, the present method utilizes degassed glycols and/or oxygen contaminated solvents, for example, wherein evaporation of water and glycol from the liquid line provides a method to purify and remove contamination. Accordingly, solvents useful in the present methods do not have to be degassed, and optionally the solvents can be open to the air making practical implementation easier. In an embodiment, the nonaqueous solution has a pH selected from the range of 8.5 to 13. In an embodiment, for example, the metal nanoparticles are generated and the pH of said nonaqueous solution is decreased from an initial value greater than or equal to 11 to a subsequent value less than or equal to 8.5 In embodiments, the nonaqueous solution has an ionic strength selected from the range of 0.01 M to 0.1 M. In a specific embodiment, the nonaqueous polar solvent is selected from the group consisting of ethylene glycol, ethylene glycol, propylene glycol and any combination of these. In an embodiment, for example, the nonaqueous solvent comprises an inorganic aprotic solvent. In an embodiment, for example, the nonaqueous solvent comprises an organic aprotic solvent. Optionally, the nonaqueous solvent has a high boiling point and/or a high viscosity, such as a viscosity and boiling point equal to or greater than water. In embodiments, the nonaqueous solvent comprises one or more of 2-methoxyethyl ether, N-methylpyrrolidinone, dimethylformamide, sulfolane ($C_4H_8SO_2$), dimethyl sulfoxide and propylene carbonate.

In embodiments, the metal particle precursor used to generate the metal nanoparticles comprises metal ions or a source of metal ions, such as a dissolved metal-containing salt. For example, in embodiments, the metal ions are selected from the group consisting of copper ions, $Cu^{2+}$ ions, nickel ions, $Ni^{2+}$ ions, aluminum ions, $Al^{3+}$ ions, cobalt ions, $Co^{2+}$ ions, Au ions, Pt ions, Pd ions, Ru ions, Fe ions, Ti ions, Fe—Pt ions, Ir ions, Os ions, Re ions, W ions, Ta ions, Hf ions, and aggregates and clusters of these and any combination of these. The final conformal metal layer may comprise a single metal or a mixture of two or more metals. For example, the metal particle precursor may comprise two or more different metal ions or sources for two or more different metal ions so as to form a conformal metal layer containing a mixture of the two or more metal ions. Additionally, the metal particle precursor may comprise one or more non-metal components that form a portion of the conformal metal layer. For example, the metal particle precursor may comprise a graphene component, such as graphene oxide or reduced graphene oxide, which results in a conformal metal layer containing graphene and one or more metals. In an embodiment, the metal ions are provided by dissolution of a metal salt in the nonaqueous polar solvent, such as a metal salt selected from the group consisting of $CuCl_2$, $CuBr_2$, $NiCl_2$, $NiBr_2$, $AlCl_3$, $AlBr_3$, $CoCl_2$, $CoBr_2$, $PtCl_2$, $PdCl_2$, $RuCl_2$, $FeCl_2$, and $IrCl_2$ and any combination of these. In specific embodiments, the metal ions have a concentration in the nonaqueous solution selected from the range of $10^{-3}$ M to 0.05 M. In an embodiment, the conformal metal layer is a thin film comprising copper, aluminum, nickel, cobalt, gold, silver, iron, platinum, palladium, iridium, osmium, rhenium, tungsten, tantalum, hafnium, ruthenium, titanium, iron-platinum alloys and any combinations of these.

The present invention utilizes one or more ionic liquids in the nonaqueous solution, so as to form coatings around the metal nanoparticles formed in the nonaqueous solution. Use of ionic liquids provides additional advantages including, for example, further reduction in the oxidation rate of the metal nanoparticles that form as well as a reduction in the growth rate and/or agglomeration rate of the metal nanoparticles that form. Without being bound by any theory, it is believed that the ionic liquid provides a negative charge to the nanoparticles, such as by forming a negatively charged outer layer around the nanoparticles, and electrostatic repulsions between neighboring nanoparticles reduces the rate at which the nanoparticles touch, thereby reducing the rate of agglomeration in solution. In an embodiment, for example, the negatively charged outer layer prevents or decreases the rate of agglomeration and/or oxidation of the metal nanoparticles.

In specific embodiments, the ionic liquid comprises one or more of: 1-butyl-3-methylimidazolium tetrafluoroborate ([bmim][$BF_4$]), 1-butyl-3-methylimidazolium bromide ([bmim][Br]), 1-butyl-3-methylimidazolium chloride ([bmim][Cl]), 1-butyl-3-methylimidazolium hexafluorophosphate ([bmim][$PF_6$]), 1-ethyl-3-methylimidazolium tetrafluoroborate ([emim][$BF_4$]), 1-ethyl-3-methylimidazolium nitrate [(emim)[$NO_3$]), 1-ethyl-3-methylimidazolium perchlorate ([emim][$ClO_4$]), 1-ethyl-3-methylimidazolium triflate ([emim][$CF_3SO_3$]), 1-ethyl-3-methylimidazolium hexafluorophosphate ([emim][$PF_6$]), 1-(2-hydroxyethyl)-3-methylimidazolium tetrafluoroborate ([hydemim][$BF_4$]), 1-butylpyridinium chloride ([bpy][Cl]), and 1-butyl-3-methypyridinuim tetrafluoroborate ([bmpy][$BF_4$]). In an embodiment, for example, the ionic liquid comprises a cation and an anion. Useful cations for ionic liquids include, but are not limited to a cation selected from the group consisting of 1-butyl-3-methylimidazolium ([bmim]), 1-ethyl-3-methylimidazolium ([emim]), 1-(2-hydroxyethyl)-3-methylimidazolium ([hydemim]), 1-butylpyridinium ([bpy]), 1-butyl-3-methypyridinuim ([bmpy]) and any combination of these. Useful anions for ionic liquids include, but are not limited to an anion selected from the group consisting of tetrafluoroborate, bromide, chloride, hexafluorophosphate, nitrate, perchlorate, triflate and any combination of these. In an embodiment, for example, the ionic liquid has a concentration in the nonaqueous solution selected from the range of $1.5 \times 10^{-3}$ M to 0.075 M. In another embodiment, the ionic liquid has a concentration in the nonaqueous solution between about 0 mM and 5.0 mM, preferably between about 0.5 mM and 4.5 mM, preferably between about 2.0 mM and 2.5 mM, more preferably between about 2.1 mM and 2.4 mM.

Methods of embodiments of the invention are useful for forming conformal metal layers on nonconducting surfaces or nonconducting substrates. Certain embodiments of the invention, however, are also useful for forming conformal metal layers on conducting or semiconducting surfaces, such as semiconductor, metal or alloy surfaces. In an embodiment, for example, the substrate comprises a non-metallic substrate. In an embodiment, for example, the substrate comprises a dielectric or insulating substrate. In an embodiment, for example, the substrate comprises a doped substrate. In specific embodiments, the substrate comprises one or more materials selected from the group consisting of $SiO_2$, silicon, glass, paper, ceramic, polymer, plastic, metal, metal oxide, dielectric, semiconductor and biopolymers.

Use of metallic nanoparticles formed in situ for deposition provides certain advantages for embodiments of the invention. In some embodiments, for example, forming conformal metal layers from nanoparticles provides for forming pinhole free films, films free of voids, films free of islands, continuous films, cohesive films, and films of varying thickness. In certain embodiments, for example, the composition, thickness and structure of the metal films can be further controlled by the chemical and/or physical properties of the nonaqueous solution, such as the pH, ionic strength, temperature, composition, dissolved salt concentration or dissolved gas concentration. These and other embodiments are possible because methods of the invention optionally generate metal nanoparticles in situ within the nonaqueous solution in physical contact with the substrate undergoing processing, and, thus, the nanoparticles are available for deposition on the substrate surface on short time scales.

In an embodiment, generation on the metal nanoparticles is achieved by decreasing the pH of the nonaqueous solution. Thus, by optionally controlling a starting pH of the nonaqueous solution, various properties of the conformal metal film can be controlled. In one embodiment, for example, an initial pH value of the nonaqueous solution is greater than or equal to 11 and is decreased to a subsequent value less than or equal to 10 as the metal nanoparticles are generated. In a specific embodiment, the pH of the nonaqueous solution before nanoparticles are generating is selected from the range of 11 to 13 and the pH of the nonaqueous solution decreases to a value selected from the range of 8 to 10 as the nanoparticles are generated.

In a specific embodiment, the metal nanoparticles are generated by increasing a temperature of the nonaqueous solution to greater than or equal to 190° C. In an embodiment, the temperature of the nonaqueous solution is increased to a value within 10° C. of the boiling point of the nonaqueous solvent. In one embodiment, an initial temperature of the nonaqueous solution is less than 22° C. and the temperature is increased to greater than 193° C. to generate the nanoparticles. In an embodiment, for example, the temperature of the nonaqueous solution is ramped at a rate selected from the range of 10° C./minute to 30° C./minute.

In certain embodiments, the cross sectional dimensions of the metal nanoparticles are selected from the range of 1 nm to 10 nm or from the range of 1 nm to 5 nm or from the range of 2 nm to 4 nm. In an embodiment, the nanoparticles deposited onto said surface have cross sectional dimensions less than or equal to 10 nm. In an embodiment, for example, the metal nanoparticles are nanocrystals such as single crystalline nanocrystals. In exemplary embodiments, the metal nanoparticles comprise copper, aluminum, nickel or cobalt. In an exemplary embodiment, the conformal metal layer is substantially free of oxidized metal. In a preferred embodiment, the conformal metal layer comprises elemental metal.

Methods of embodiments of the invention optionally include a step of functionalizing the surface so as to provide a net positive charge to the surface. In embodiments, functionalizing the surface provides advantageous characteristics to the conformal metal layer formed, such as an increased conductivity or reduced sheet resistance as compared to metal films formed in the absence of surface functionalization. In embodiments, use of functionalized surfaces also provides, for example, an adhesion layer for stronger attachment of the metal nanoparticles to the surface. Use of functionalized surfaces also optionally results in reduced island growth or reduction in the number of voids or pinholes in the surface.

In one embodiment, functionalizing the surface comprises pretreating the surface prior to generating metal nanoparticles or prior to contacting the surface with the nonaqueous solution. In specific embodiments, pretreating the surface comprises forming a monolayer or adlayer comprising an amine, a thiol, a hydroxyl, hydrogen or any combinations of these on the surface. In an embodiment, for example, pretreating the surface comprises one or more steps selected from the group consisting of: washing the surface in an ultrasonic bath; exposing the surface to a piranha solution; exposing the surface to an acid solution; and exposing the surface to a reagent comprising an amino or a thiol group.

For example, pretreating the surface optionally comprises washing the surface in an ultrasonic bath comprising acetone, deionized water or any combination of these. In an embodiment, for example, pretreating the surface comprises exposing the surface to a piranha solution, such as for a period of time selected from the range of 1 minute to 120 minutes. In an embodiment, for example, a piranha solution containing sulfuric acid ($H_2SO_4$, 96\%) and hydrogen peroxide ($H_2O_2$, 30\%) in a 1:3 mixture by volume for 30 minutes is used to hydroxylate the surface. Optionally, ratios of 1:2 to 1:5 may also be used. Optionally, pretreating the surface comprises exposing the surface to an acid selected from the group consisting of sulfuric acid, nitric acid, hydrofluoric acid or hydrochloric acid. In an embodiment, for example, the surface is exposed to the acid solution for a period of time selected from the range of 1 minute to 180 minutes.

In a specific embodiment, pretreating the surface comprises exposing the surface to an alkoxysilane having an amino functional group or a thiol functional group, thereby forming a positive charge on the substrate surface undergoing processing. In certain embodiments where the surface comprises silicon, silicon oxide or hydroxyl groups, exposing the surface to an alkoxysilane results in the formation of a self-assembled monolayer of the alkoxysilane on the surface. In an embodiment, for example, the alkoxysilane is selected from the group consisting of 3-aminopropyltrimethoxysilane (APTMS), 3-aminopropyl-triethoxysilane (APTES), 3-aminopropyl-diethoxy-methylsilane (APDEMS), 3-aminopropyl-dimethyl-ethoxysilane (APDMES), 3-mercaptopropyl-trimethoxysilane (MPTMS), 3-mercaptopropyl-methyl-dimethoxysilane (MPDMS), 3-mercaptopropyltrimethoxysilane (MPTMS) and any combination of these.

In some embodiments, pretreating the surface does not result in the functionalization of the surface with organic ligands. In other embodiments, pretreating the surface functionalizes the surface with organic ligands. In some embodiments, pretreating the surface does not result in the functionalization of the surface with a polymer. In other embodiments, pretreating the surface functionalizes the surface with a polymer.

In embodiments, methods of the invention provide for control over the thickness of the conformal films by controlling the deposition rate and solution phase characteristics of the metal nanoparticles (e.g., amount of particles, size distribution, etc.). In one embodiment, the step of depositing metal nanoparticles onto the surface is carried out for a time period selected over the range of 5 seconds to 1800 seconds. In an exemplary embodiment, a method of the invention further comprises a step of stopping the step of depositing metal nanoparticles onto surface after formation of a conformal metal layer having a preselected thickness. Useful techniques for stopping the deposition of metal nanoparticles onto the surface include but are not limited to: decreasing a concentration of ionic liquid in the nonaqueous solution; flushing the nonaqueous solution with a solvent; removing the surface of the substrate from the nonaqueous solution or removing the nonaqueous solution from contact with the surface of the substrate.

In embodiments, methods of the invention optionally further comprise a step of sintering or annealing the conformal metal layer. Sintering or annealing the conformal metal layer is advantageous for certain embodiments for reducing defects in the conformal metal layer, eliminating pinholes or voids in the conformal metal layer, increasing electrical conductivity or decreasing a sheet resistance of the conformal metal layer. Various properties of the sintering or annealing step are useful for controlling the resultant physical properties of the sintered conformal metal layer, such as the sintering or annealing time, the sintering or annealing temperature and the composition and pressure of the atmosphere in which sintering or annealing takes place. In a specific embodiment, sintering or annealing the conformal metal layer results in fusing at least a portion of the deposited metal nanoparticles. In an embodiment, for example, the sintering or annealing step comprises raising a temperature of the conformal metal layer to a temperature selected from the range of 200° C. to 500° C. In an embodiment, for example, the sintering or annealing step takes place for a period of time selected from the range of 5 minutes to 3 hours. In embodiments, the sintering or annealing step comprises exposing the conformal metal layer to an atmosphere comprising one or more gases selected from the group consisting of $N_2$, $H_2$, carbon monoxide, an endothermic gas, a noble gas and any combination of these or vacuum. In a specific embodiment, the atmosphere comprises 5 mol % $H_2$ in $N_2$. In a specific embodiment, there is no gas atmosphere and the sample is heated in vacuum.

Embodiments of the invention are useful for a variety of applications and for generating conformal metal layers on the surfaces of a variety of substrates and structures, including planar surfaces and nonplanar substrate surfaces. In certain embodiments, the surface comprises a microstructured or nanostructured surface. In an embodiment, the methods of the present invention are used for back-end electrical contact formation and are designed to form the seed layer for electroplating to fill trenches and vias. A main advantage of this process is that the seed layers are deposited using a liquid solution and can be more easily integrated with an electroplating bath compared to the gas phase techniques such as atomic layer, chemical, or physical vapor deposition that are currently used. Advantages of the process include reducing process time, cost, steps, and contamination as the seed layers can then be processed by electroplating in a very similar solution of copper salts. In an embodiment, for example, the surface comprises a component of an integrated circuit or electronic device, such as via or trench structures. In an embodiment, for example, the surface comprises another metal (e.g., a metal different than that of the nanoparticles), a metal oxide, a semiconductor or any combination of these. In an embodiment, for example, the surface is a surface of a particle such as an organic particle and/or a nanoparticle. In an embodiment, for example, the surface of another free floating particle or structure can be coated with metal. The surface can be another metal or metal oxide particle or a semiconductor particle or an organic structure containing proteins, sugars, and other biomolecules.

For example, in one embodiment, the substrate comprises a via, a trench or a dual damascene structure. In an embodiment, for example, the metal layer conformally covers a surface of the via, trench or dual damascene structure. In one embodiment, a via 10 nm or larger is filled since a fraction of the particles are about 3 nm in diameter. In one embodiment, the top and walls of trenches that are 10 µm wide or larger and 25 µm deep or larger are covered with a continuous layer of nanoparticles. In certain embodiments the surface comprises one or more raised features, one or more recessed features or combinations of raised features and recessed features. In an embodiment, for example, the metal layer conformally covers at least a portion of the raised features and/or the recessed features. In a specific embodiment the raised features and/or recessed features have dimensions, such as depths, heights or widths, selected from the range of 20 nm to 1 mm. Methods of embodiments of the invention are useful for forming conformal metal layers over or within such features.

Properties of the conformal metal layer can be controlled by various aspects of the methods described herein. In an embodiment, for example, the thin metal film has a sheet resistance selected from the range of $10^{-2}$ Ω/sq to $10^3$ Ω/sq. In an embodiment, for example, the conformal metal layer is substantially void free or substantially pinhole free. In an embodiment, for example, the conformal metal layer is substantially free of grains, agglomerates or islands. In an embodiment, for example, the conformal metal layer has a high degree of purity.

An embodiment of the invention provides a method of tuning one or more optical properties or electrical properties of a conformal metal layer formed on a surface of a substrate, where the method comprising the steps of: a) contacting the surface with a nonaqueous solution; wherein the surface has a net positive charge; and wherein the nonaqueous solution comprises a nonaqueous polar solvent, a metal particle precursor and an ionic liquid; b) generating a plurality of metal nanoparticles in the nonaqueous solution in contact with the surface, wherein the metal nanoparticles are at least partially coated with a negatively charged outer layer comprising the ionic liquid or a reaction product thereof; and c) depositing the metal nanoparticles onto said surface, thereby forming said conformal metal layer, wherein the one or more optical properties or electrical properties of the conformal metal layer are tuned to a desired level by adjusting the concentration of the ionic liquid in the nonaqueous solution during the generating step, deposition step, or both, to an ionic liquid concentration corresponding to the desired one or more optical properties or electrical properties.

An embodiment of the invention provides a device for forming a conformal nanoparticle metal layer on a surface of a substrate. The device comprises a) a chamber able to hold the substrate and contact a nonaqueous nanoparticle solution with the surface of the substrate; b) one or more reservoirs containing components of the nonaqueous nanoparticle solution; c) one or more inputs connecting the chamber with the one or more reservoirs for transporting the components of the nonaqueous nanoparticle solution into the chamber; and d) one or more outputs able to transport the nonaqueous nanoparticle solution out of the chamber. The components of the nonaqueous nanoparticle solution comprise at least a nonaqueous polar solvent, a metal particle precursor and an ionic liquid, where the metal particle precursor and ionic liquid can be added independently of one another through different inputs. Preferably, the device further comprises a controller or means for controlling the amount and concentration of ionic liquid transported into the chamber. For example, the device may comprise a sensor able to measure the concentration of the ionic liquid in the chamber and increase or decrease the amount and/or concentration of ionic liquid being added to the chamber to achieve a pre-determined concentration level. The device may also comprise one or more wash reservoirs able to deliver a wash solution to the chamber after the nonaqueous nanoparticle solution has been transported out of the chamber.

In a further embodiment, the device further comprises a heating unit able to heat the substrate and the nonaqueous nanoparticle solution in the chamber. Suitable types of heating units include, but are not limited to, ovens able to encompass the chamber and electric heaters. The device may also comprise upper and lower supports above and below the substrate and means, such as fasteners or clips, for sealing the chamber. In a further embodiment, the device further comprises a microreactor having one or more channels able to form a pattern on the surface of the substrate.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

Figure 1A:
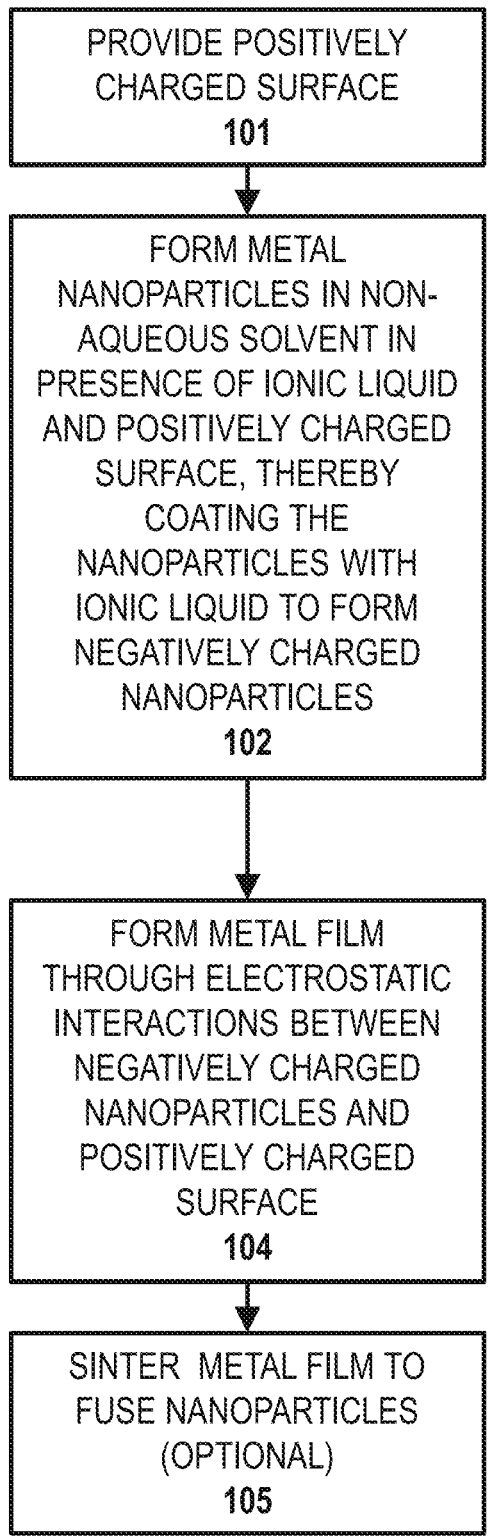
FIG. 1A, FIG. 1B and FIG. 1C provide overviews of exemplary methods for forming metal films.

In general the terms and phrases used herein have their art-recognized meaning, which can be found by reference to standard texts, journal references and contexts known to those skilled in the art. The following definitions are provided to clarify their specific use in the context of the invention.

"Conformal" refers to the physical characteristics of a layer of deposited on a surface, such as a substrate surface. Conformal films preferably lack gaps or voids within the bulk phase of the conformal film or positioned between the film and the surfaces of a feature coated by the film, for example voids having a volume larger than $10^{-6}$ µm$^3$. Some conformal films of the invention have uniform thickness at any surface of the feature (with variation less than about 20%). Conformal films in the present invention may optionally have a uniform composition throughout the layer, such as a uniform metallic composition. In some embodiment, the methods of the invention generate conformal films on a nonplanar surface, such as a trench or via structure of a device substrate. The invention includes methods for making conformal metal films.

"Substantially free of pinholes or voids" refers to structures, such as thin film structures, wherein less than 5% of the structure comprises voids having a volume larger than $10^{-6}$ µm$^3$. Preferably for some embodiments, less than 3% of the structure comprises voids having a volume larger than $10^{-6}$ µm$^3$ (1000 nm$^3$).

"Nonaqueous solution" refers to a mixture of a nonaqueous solvent and one or more dissolved compositions or solutes. In an embodiment a nonaqueous solution comprises a nonaqueous polar solvent and one or more dissolved ionic compounds, such as metal salts or ionic liquids. In some embodiments a nonaqueous solution is free of or substantially free of the presence of water. In some embodiments, a nonaqueous solution comprises a mole fraction of water that is less than 0.01 or less than 0.001 or less than 0.0001.

"Nonaqeuous solvent" refers to a liquid used for the dissolution of one or more solutes, in which the liquid is not water. In an embodiment, a nonaqueous solvent comprises a polar solvent, such as a solvent in which the molecular constituents possess a nonzero dipole moment. In an embodiment, a nonaqueous solvent comprises a protic solvent, such as a solvent having one or more hydroxyl groups or amine groups. In an embodiment, a nonaqueous solvent comprises an aprotic solvent, such as a solvent lacking an acidic hydrogen atom.

"Nanoparticle" refers to an object having dimensions, such as a cross-sectional dimension (e.g., diameter, width, length, etc.), less than 1000 nm, and optionally for some application less than or equal to 100 nm. In some embodiments, a nanoparticle has a cross-sectional dimension less than or equal to 20 nm. In some embodiments, a nanoparticle has a cross-sectional dimension selected between 1 nm and 5 nm. Nanoparticles of the invention may have spherical shapes or nonspherical shapes. In some embodiments, nanoparticles of the invention are nanocrystals. In further embodiments, the nanocrystals are single crystals.

"Ionic liquid" refers to an organic salt that melts at low temperature without decomposing or vaporizing. For example, in embodiments, an ionic liquid has a melting temperature of less than 100° C. One embodiment of an ionic liquid is 1-butyl-3-methylimidazolium tetrafluoroborate ($[C_8H_{15}N_2]^+BF_4^-$), also referred to herein as "[bmim][BF$_4$]") which melts at −75° C. to form a fluid containing 1-butyl-3-methylimidazolium cations and tetrafluoroborate anions. In embodiments, cations useful in ionic liquids include but are not limited 1-butyl-3-methylimidazolium (also referred to herein as "[bmim]"), 1-ethyl-3-methylimidazolium (also referred to herein as "[emim]"), 1-(2-hydroxyethyl)-3-methylimidazolium (also referred to herein as "[hydemim]"), 1-butylpyridinium (also referred to herein as "[bpy]"), 1-butyl-3-methypyridinuim (also referred to herein as "[bmpy]"). In embodiments, anions useful in ionic liquids include but are not limited to tetrafluoroborate ($BF_4^-$), bromide ($Br^-$), chloride ($Cl^-$), hexafluorophosphate ($PF_6^-$), nitrate ($NO_3^-$), perchlorate ($ClO_4^-$), triflate (trifluoromethanesulfonate, $CF_3SO_3^-$). In embodiments, an ionic liquid comprises a cation having an over bonded nitrogen. In embodiments, an ionic liquid comprises an anion that is smaller than the cation. In embodiments, an ionic liquid comprises a cation having two or more constituents comprising 1 to 7 carbon atoms.

"Coating" or "outer layer" refers to a full or partial layer of a composition (e.g., ion or other substance) present on an external surface of an object that forms by a variety of processes such as those involving self-assembly. The invention includes processes involving metallic nanoparticles having a negatively charged outerlayer. In embodiments, the negatively charged outerlayer is an ionic liquid coating that is a layer of an ionic liquid, a component thereof or a reaction product thereof present on the surface of an object, for example a nanoparticle. In some embodiments, an outerlayer comprises a monolayer or a multilayer. In some embodiments, an outerlayer is a partial coating. In some embodiments, an outerlayer on a particle provides an overall charge to the particle, such as a net negative charge, or the outermost layer has a net negative charge.

"Metal particle precursor" refers to a source of metal in a solution that is available for converting to a metal particle. In embodiments, a metal particle precursor is a metal nanoparticle precursor. In embodiments, a metal particle precursor comprises metal cations in a solution. In embodiments, metal cations are reduced to elemental metal and formed into crystalline particles in a particle generating process.

"Electroplating" and "electrodeposition" refer to a process using electrical current to reduce metal cations dissolved in solution to an elemental metal such that a metal coating is formed on a surface.

"Seed layer" refers to a layer of metal useful in a deposition process for receiving a subsequently provided overlying metal layer. In an embodiment, a seed layer comprises a thin metal layer generated by deposition of nanoparticles.

"Sintering" refers to a process where particulate components are fused to create a larger body. In embodiments, a sintering process takes place in an oxygen free atmosphere. In embodiments, a sintering process takes place in a reducing atmosphere. In embodiments, a sintering process comprises heating particulate components to a temperature less than the melting point of the particulate material.

"Void" refers to an absence of material in an otherwise continuous layer or film. In some embodiments, a void comprises a pore or opening in an otherwise continuous layer or film. In some embodiments, a void is present through an entire thickness of an otherwise continuous layer or film as an opening. In some embodiments, a void is only present through a portion of the thickness of an otherwise continuous layer or opening.

"Agglomerates" refers to a group of two or more distinct objects that together form a larger object. In embodiments, agglomerates comprise two or more nanoparticles, three or more nanoparticles, five or more nanoparticles, ten or more nanoparticles or 50 or more nanoparticles.

"Reaction product" refers to the product of one or more chemical reactions. In an embodiment, for example, a negatively charged outer layer of a metal nanoparticle is a reaction product involving components of a nonaqueous solution, such as a polar solvent, metal particle precursor or an ionic liquid, and or chemical species on the surface or in the bulk of the metal nanoparticle.

A "cohesive thin film" refers to a thin film comprising a substantially integral or unitary structure, such as a thin film structure wherein 80% or more by mass of the structure corresponds to an integral or unitary structure.

Figure 3:
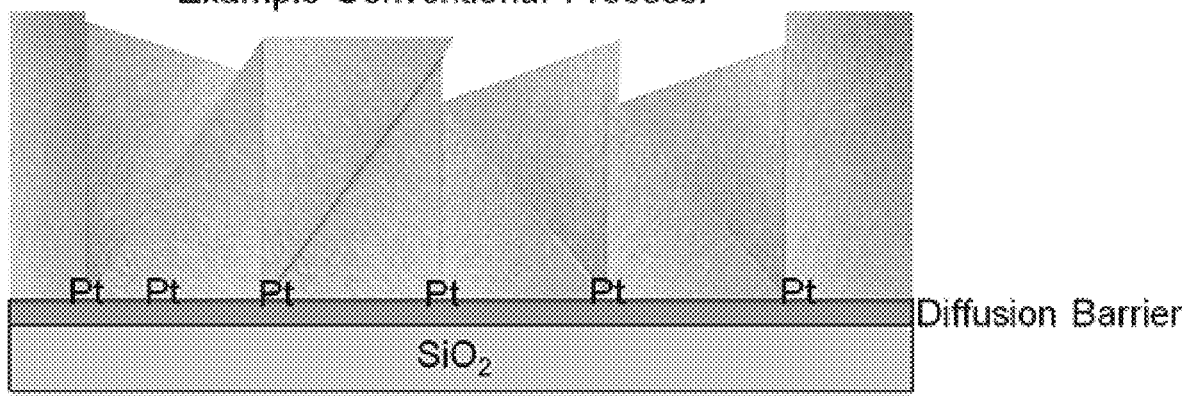
FIG. 3 provides a diagram illustrating a conventional electroplating coating process (top) and an electrodeless coating process of the invention (bottom).
Figure 3:
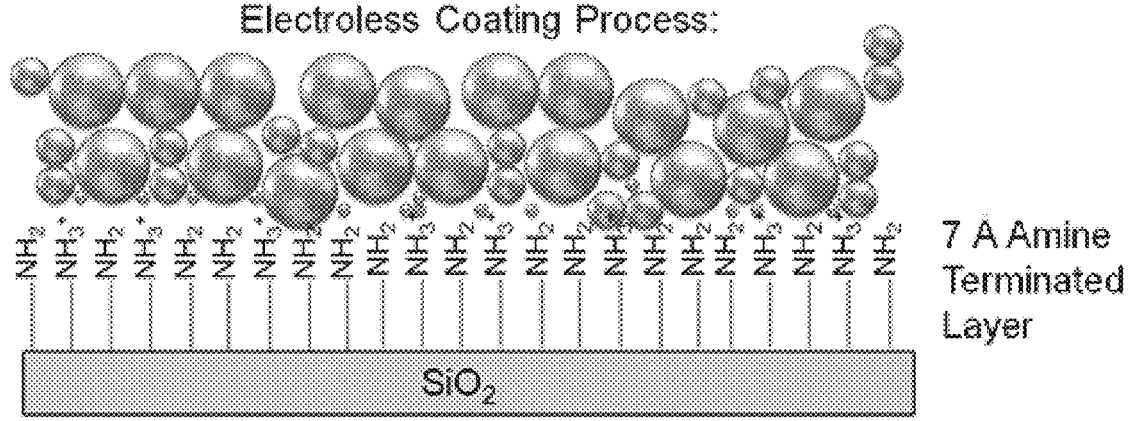

The methods described herein are useful for forming thin, pinhole-free conformal metal films on both conducting and non-conducting surfaces where the optical properties and electrical properties, as well as the morphology, of the conformal metal layer are able to be selected and tuned according to the concentration of the ionic liquid. The formed metal films provide a useful structure or seed layer for further deposition of metal onto the surfaces using conventional techniques like electroplating. Using the formed metal films as a seed layer for electroplating is particularly useful for non-conducting surfaces, which are otherwise unsuitable for electroplating without the presence of the formed metal films. Unlike electroplating, the disclosed methods, however, do not require the presence of a voltage or external electric field at the surface to drive the film formation (illustrated in FIG. 3). Instead, the films are formed through the electrostatic interactions between a negatively charged outerlayer on a metallic nanoparticles and a positively charged surface. In addition, the disclosed methods are compatible with solution phase processing and, thus, eliminate the need to transfer the surfaces into a vacuum chamber for a chemical or physical vapor deposition to form a metal layer.

FIG. 1A provides an overview of an exemplary method embodiment for forming a metal film on a surface. In this method, a positively charged surface is provided (101). Next, metal nanoparticles are formed in a non-aqueous solution containing a ionic liquid and the positively charged surface (102). The ionic liquid or a reaction product thereof forms a complete or partial outerlayer on the nanoparticles having a net negative charge. The negatively charged nanoparticles are electrostatically attracted to the positively charged surface, resulting in the formation of the metal film (104). In some embodiments, for example, deposition of the nanoparticles to the surface of the substrate results in removal of the negatively charged outerlayer, thereby generating a thin metallic film exhibiting a uniform composition and high purity. In an embodiment, for example, once the metal film is formed the film is sintered to fuse the metal nanoparticles comprising the film (105). Sintering can be useful, for example, for forming a metal film having a higher conductivity or lower sheet resistance. In one embodiment, the outer edge of the slipping plane of the nanoparticles has a zeta potential in the range of −60 to −30 mV measured with a "u" shaped cuvette with gold contacts compared to a standard hydrogen electrode. For example, the surface contains approximately 1 net positive charge per nanoparticle cross-section at a pH of 10 and 20 net positive charges per nanoparticle cross-section at a pH of 9.4. In this embodiment, deposition occurs in the pH range from 12 to 9. The net negative charge of the outer slipping plane of the nanoparticles is attracted to the charge(s) on the surface resulting in nanoparticle adsorption. In an embodiment, this process occurs concurrent with nanoparticle formation although the deposition steps can be separate.

Figure 1B:
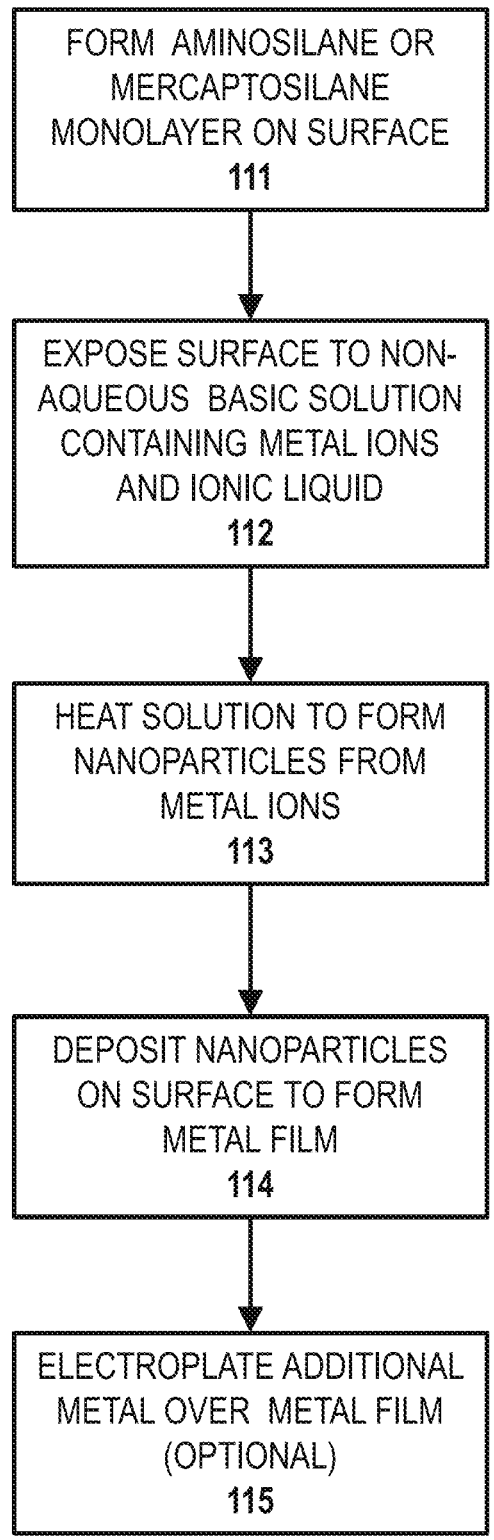

FIG. 1B provides an overview of another exemplary method embodiment for forming a metal film on a surface. In this method, an aminosilane or mercaptosilane monolayer is formed on the surface (111), thereby providing a net positive charge. In embodiments, including an aminosilane or mercaptosilane layer on the surface is useful for providing a positive charge to the surface, for increasing the adhesion of a metal film formed on the surface or for decreasing the sheet resistance or increasing the conductivity of the metal film formed on the surface. Next, the surface is exposed to a non-aqueous basic solution containing metal ions and ionic liquid (112). The solution is then heated to form metal nanoparticles via precipitation of the metal ions in the solution (113). The metal nanoparticles are then deposited on the surface to form the metal film (114). In an embodiment, for example, additional metal is electroplated over the metal film (115), such as to provide a thicker metal layer or a metal layer of a different composition.

Figure 1C:
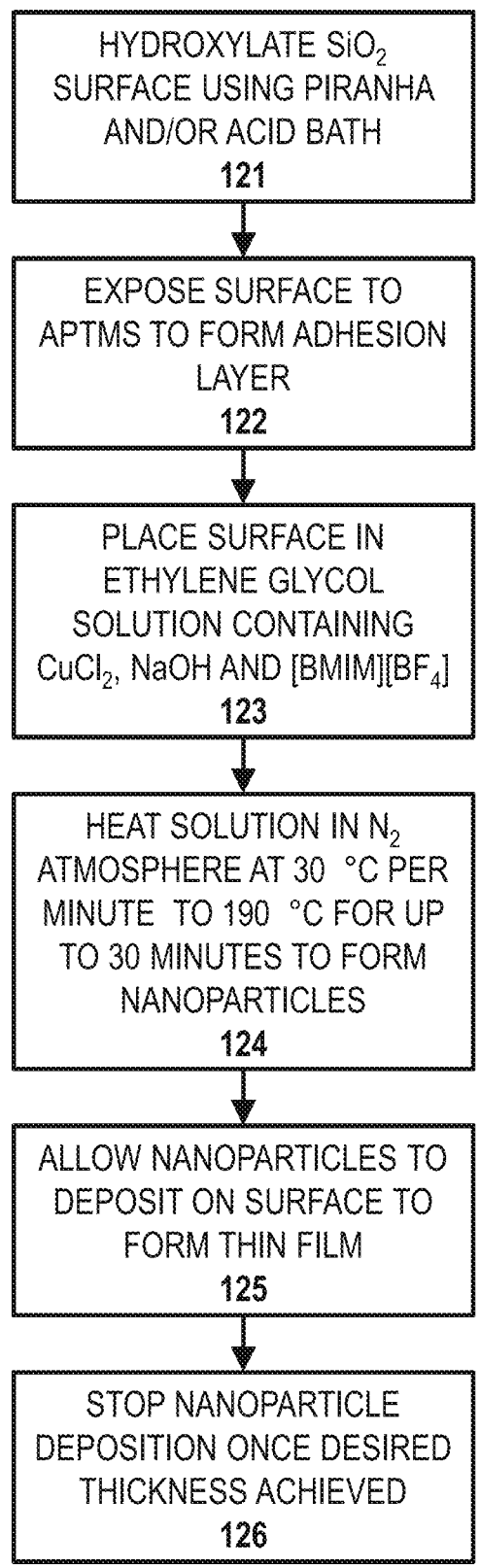
Figure 2:
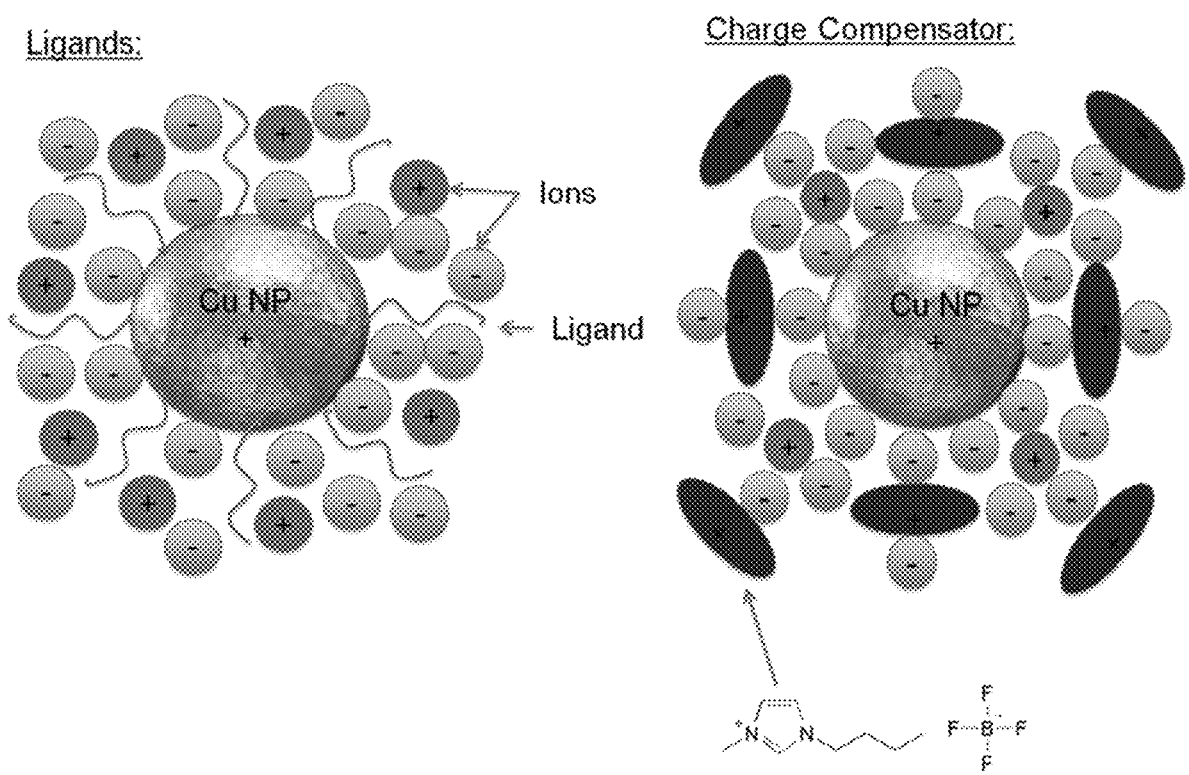
FIG. 2 provides a diagram illustrating ions associating with a copper nanoparticle with the presence of a ligand (left) or a charge compensator (right).

FIG. 1C provides an overview of another exemplary method embodiment for forming a copper film on a $SiO_2$ surface. In this method, the $SiO_2$ surface is hydroxylated by treating the surface in a piranha bath and/or an acid bath (121). Useful acid bath treatments include, but are not limited to, HF, HCl, and $H_2SO_4$. The surface is then exposed to ATPMS to form an adhesion layer on the surface (122). Next, the surface is exposed to an ethylene glycol solution containing $CuCl_2$, NaOH and [bmim][$BF_4$] ionic liquid (123). The solution is then heated in a $N_2$ atmosphere to 190° C. for up to 30 minutes at a ramp rate of 30° C. per minute to form copper nanoparticles from the metal ions (124). During this time, the copper nanoparticles are allowed to begin depositing on the surface to form the copper film (125). Once the desired copper film thickness is reached, the nanoparticle deposition is stopped (126). As with other methods, the copper films are optionally sintered and/or used as a seed layer for deposition of thicker films, such as by electroplating. FIG. 2 illustrates how ions can associate with a copper nanoparticle with the presence of a ligand (left) or an ionic liquid such as [bmim][$BF_4$] (right). As described further below, the use of an ionic liquid in the present methods can result in a thinner and more cohesive film.

FIG. 2 is a schematic (not to scale) showing differences between a more conventional (marked as 'Ligands') NP passivation strategy compared to the charge compensated approach of the present invention. A more conventional approach applies (i.e. complexes from solution) an long chain organic molecule to the surface of the NPs via either an ion exchange or pH change process. The organic molecule impedes NP agglomeration, oxidation, settling, and/or flocculation via steric hinderance with adjacent organic molecules on other NPs. The charge compensated approach also impedes all of the above failure modes by an electrostatic impedance of an ion that moves with the NP (marked as 'Charge Compensator'). This charge compensator is usually an ionic liquid as they are less likely to form a ligand with the surface due to delocalized charge within the central ring of the ionic liquid. The ions of the ionic liquid stay in the Hemholtz layer of the particle and movie with it in suspension (i.e. between the slipping plane and the Stern layers). The main difference between the two approaches is that the ligand approach leaves an organic residue in the ELD NP film that may impede electrical conductivity as there is a molecule bound to the surface of the metallic NPs. In the charge compensated approach, the ELD film still has the ions (as shown by the FTIR in FIG. 35) but they are able to move on the surface of the NPs and thus during the sintering process they do not appear to impede the formation of conductive electrical pathways as much as a ligand. There is also the possibility of charge transfer through the ion layer surrounding the NPs in the ELD film. The use of a charge compensator (ion) over a ligand leads to better electrical performance of an ELD NP film.

The invention may be further understood by the following non-limiting examples.

Example 1: Electrostatic Coating of Surface with Metallic Nanoparticles

This example describes the formation of a thin layer of metal, for example between about 3 nm to 1500 nm, 20 nm to 500 nm, or 100 nm to 400 nm, on non-metallic substrates (i.e. thermal silica or glass) from metal (i.e. copper) nanoparticles by only the electrostatic interaction between the nanoparticles and a suitably prepared substrate surface (i.e. —H, amine, or thiol monolayers). This process originates from the inherent surface chemistry of the nanoparticles in a polar solvent, which produces particles with outer surfaces that are negatively charged. A surface treatment (either molecular monolayer or high pH acidic wash) leaves the deposition surface with an overall positive electrical charge. Addition of the substrate to the bath of particle reagents before particle synthesis leads to the formation of a thin layer of metallic particles that form in solution and are electrically attracted to the substrate. Subsequent thermal treatment of the thin particle layer, optionally, promotes particle fusion into a cohesive electrically conductive thin sheet.

Electrostatic plating of these particles using the methods described herein allows for a method of coating non-traditional substrates such as but not limited to glass and fused silica; this process removes the need for an applied voltage in electro-plating of metals thus insulator materials such as ceramics or polymers may be coated inexpensively with a thin layer of metal. Thus, this example provides a simple one-pot method to cover silica or glass in a thin metal layer.

This coating technique was noticed during a reaction synthesis of copper nanoparticles when an acid washed steel wire was dipped into the reaction mixture. After the reaction synthesis of the particles, the acidic surface of the steel was covered with a thin layer of particles as evidenced by a change in color of the wire. A sinter at 200° C. in nitrogen for 1 hour was performed; subsequent electrical testing found an enhancement of the electrical conductivity of the steel substrate by the copper nanoparticle layer.

Advantages.

The methods described herein improve on electroplating by removing the need for an applied voltage during the electroplating process and improve on state-of-the-art electroless plating via the removal of a seed layer. Typically, physical vapor deposition (PVD) or atomic layer deposition of a thin layer of metal (may be non-continuous) on top of an amine/thiol altered substrate surface is needed to coat a surface in metal without an applied voltage. Common industrial methods require the use of palladium, gold, platinum, and to a lesser extent nickel, zinc, and iron for this initial seed or catalyst layer. Upon formation of the seed layer the substrate is dipped into a warm (70-180° C.) bath containing copper ions which nucleate on the metal seeds forming a continuous metal layer composed of grains of metal, specifically copper in this case. The methods described herein, however, require only that the surface maintain a positive charge, or can be altered via the addition of a linker molecule to attain such, thus allowing for the electrostatic attraction of the nanoparticles as they form in the liquid reagent solution. By eliminating the need for a seed layer, process time could be shortened and expensive precious metal reagents are removed from the coating process, thus reducing overall production time and operation cost of a copper coating tool/technique/process.

Current state-of-the-art in electroless plating allows for the growth only of metal grains (micron to millimeter scale particles). The resultant metal sheet is composed of these grains. The methods described herein make use of nanometer scale metallic particles. These are ~1/1,000 to 1/1,000,000 the diameter of grains, thus leading to novel uses such as catalysis supports and nanoscale applications. Nanoporous formations may be achieved with this novel coating technique thus allowing for a cheap one-pot method to activate substrates for use with copper catalysis.

Aqueous Deposition Techniques.

F. Inoue, J. Electrochem. Soc., vol. 159, no. 7, pp. D437-D441, January 2012, and S. Armini, J Electrochem. Soc., vol. 157, no. 1, p. D74, 2010 propose aqueous methods with the addition of soluble polymers to slow the rate of particle oxidation.

The technique described by Armini, however suffer from the following limitations: the copper film does not deposit over the entire surface; aqueous solutions of up to pH 9+ are used which decreases the electrochemical potential between particles and substrate; ethylenediaminetetraacetic acid (EDTA) is used as a ligand, which increases the repulsive force/radius of the particles; these limitations reduce the possibility of forming a cohesive/electrically conductive film. Additionally, AFM images of Armini's films show a lack of a cohesive film over a ~1 micron$^2$ distance.

The technique described by Inoue also suffers from limitations: the methods form ~300 nm thick void filled layers, caused by addition of polyethylene glycol (PEG) and EDTA to their particles; the organic molecules form large voids that isolate the particles from one another; the solvation in PEG isolates the particles from the solution which reduces the electrochemical driving force between them and the substrate; the ~300 nm thick void filled layer would not be useful for filling small features used routinely in integrated circuit manufacturing; the silica substrate is exposed.

The disclosed methods provide the following beneficial attributes: formation of 20 nm to 500 nm thick, void-free thin layer of metallic particles; films are optionally formed without organic ligands/polymers; particles fall out of solution faster than is the case for the literature cited above; the films formed covers silica in a monolayer or greater film without voids; the chemical driving force in the presence of pH 12-13 forms a much more uniform thin film compared to the literature; the optional lack of polymers allows for particle-film formation in solutions of pH 12-13; there is a larger electrochemical driving force between the particles and the substrate; optionally, a 2nd porous layer forms over the thinner APTMS-attached films, though the solution exhibit a pH of between 9 and 9.5 when this 2nd layer forms; no organic polymers or ligand are required to isolate the particles; ionic liquids are optionally used as a charge compensator to solvate particles, though their presence influences particle diameter dispersion, allows increased uniformity of the particle film and reduces particle nucleation, but not electrostatic coating potential; ethylene glycol is optionally used as a reducing agent, while conventional methods typically employ a much greater ionic strength reducing agents, such as glyoxylic acid, dimethylamine borane or citric acid; ethylene glycol and sodium hydroxide are environmentally friendly compared to use of acidic reducing agents; the methods use less corrosive reagents; the methods use temperature to control the formation of nanoparticles.

In addition, the methods described herein allows for the coating of glass or silica in thin layers of metal with little surface alteration (i.e. monolayers). The methods described herein also provide for a one-pot method for coating a surface in a metallic layer. Optionally, the resultant film thickness can be controlled via the initial reaction solution pH and/or concentration of copper reagent in the coating bath. For example, by reducing the copper ion concentration and/or pH of the reaction solution, thinner films can be formed. Optionally, the disclosed methods coat multiple types of surfaces in a thin layer of nanoparticles, including, for example, a copper coating on a polysaccharide substrate (i.e. copy paper). Methods of the invention are also useful for coating polymer/biopolymer substrates. Furthermore, methods of the invention provide for coating of 3-D substrates and substrates having raised and recessed features.

Example 2: Synthesis and Deposition of Copper Nanoparticles

This and the following examples describe the synthesis of copper nanoparticles (CuNPs) and characterization and modulation of their size and shape. In addition, the protection of the nanoparticles against oxidation is investigated using various precursors, ligands and solvents. This example also describes the deposition of copper nanoparticles to form cohesive, electrically conductive films.

Experimental Procedure for CuNPs.

Figure 4:
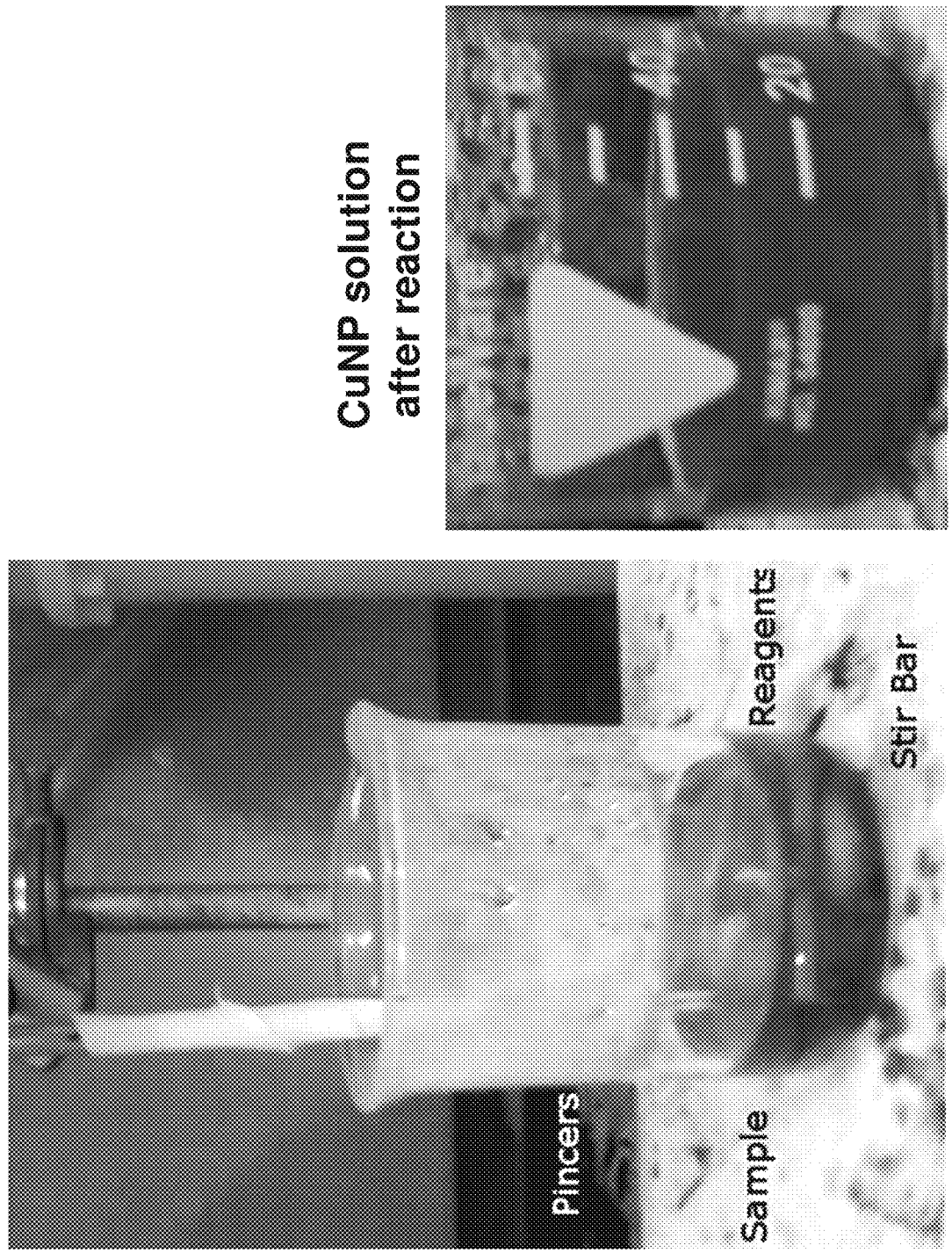
FIG. 4 provides photographs of reagent solution before and after formation of nanoparticles in the solution.

A similar synthesis procedure was followed as was described in Kawasaki et al. Chem. Comm., vol. 47, issue 27, (2011) pg. 7740-2. The materials used included 8 mL ethylene glycol (EG, 99.998% pure), 10.22 mg $CuCl_2$, 45.65 mg NaOH, 4 µL ionic liquid (1-butyl-3-methylimidazolium)$^{+-}$ (tetrafluoroborate). In general, the procedure involved dissolving $CuCl_2$/ionic liquid in 2 mL EG via sonication; dissolving NaOH in 6 ml EG via sonication; mixing both solutions and stirring for 10 minutes at room temperature, in air. FIG. 4 provides a photograph of the solution (left).

Next the flask was heated to 190° C. for 30 minutes at a ramp rate of ~30° C./min. in $N_2$. The color of the solution changed from clear blue to murky dark brown/red and a photograph of the solution after formation of the nanoparticles is shown in FIG. 4 (right). The solution was then cooled to 100° C. and 10 mL ethanol was added. This solution was then centrifuged for 30 minutes and the CuNP phase was extracted. The extraction was repeated 3 times. The nanoparticles were dried in $N_2$ and disperse in deposition solvents.

Preliminary Film Deposition: Surface Preparation and Reaction Coating.

In advance of deposition, a $SiO_2$ surface was prepared by first ultrasonicating in acetone for 10 minutes. Next the surface was placed in a piranha bath for 30 minutes followed by exposure to a dilute $H_2SO_4$ bath for 60 minutes to hydroxylate the surface. Various deposition experiments were performed with further treatment of the surface by exposure to 3-aminopropyltrimethoxysilane (APTMS) or 3-mercaptopropyltrimethoxysilane (MPTMS). This treatment formed a thin (e.g., monolayer) of the siloxane on the $SiO_2$ surface to enhance coupling between the surface and the nanoparticles. In addition, this treatment exhibited an increase in film uniformity and adhesion to surface. The surface was then dipped in a solution, such as described above, and the synthesis of the copper nanoparticles was completed. Following this, the thin copper film formed on the surface was sintered in an $N_2$ or $H_2/N_2$ atmosphere between 200° C. and 400° C. for up to 60 minutes. A post-sinter tape test indicated that there was little to no loss of film during sintering.

Initial Characterization of CuNPs.

Figure 5A:
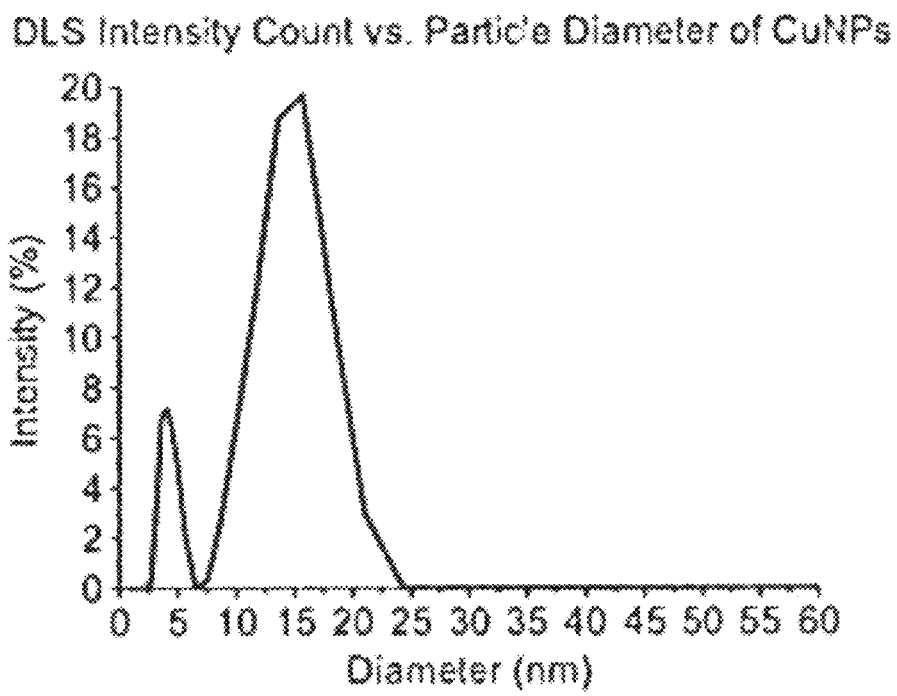
FIG. 5A provides data showing the initial diameter distribution of nanoparticles.
Figure 5B:
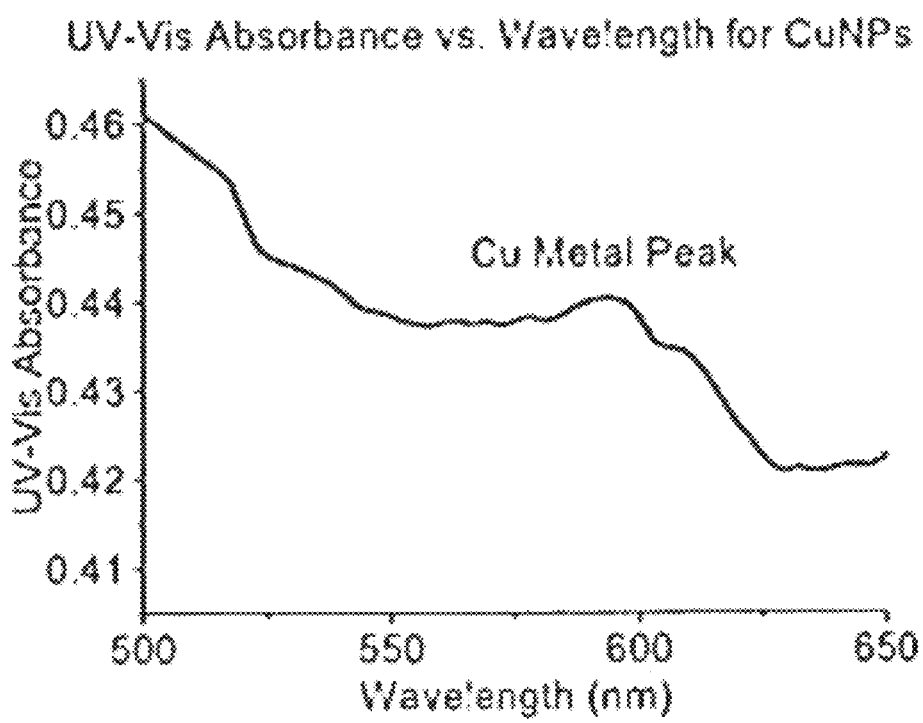
FIG. 5B provides data showing the absorbance of a solution containing copper nanoparticles.

The copper nanoparticles described above were characterized using dynamic light scattering and ultraviolet-visible (UV-Vis) absorption. The dynamic light scattering characterization determined that a bimodal distribution of nanoparticles were formed including a distribution centered at about 3 nm in diameter and a distribution centered at about 15 nm in diameter (FIG. 5A). Upon exposure to air, the particles appeared to oxidize in about 3 minutes, as no protective ligands were present on the nanoparticle surface. The UV-Vis measurements confirms that metal Cu was present (FIG. 5B).

CuNPs in Solvent: Stabilization.

Figure 6A:
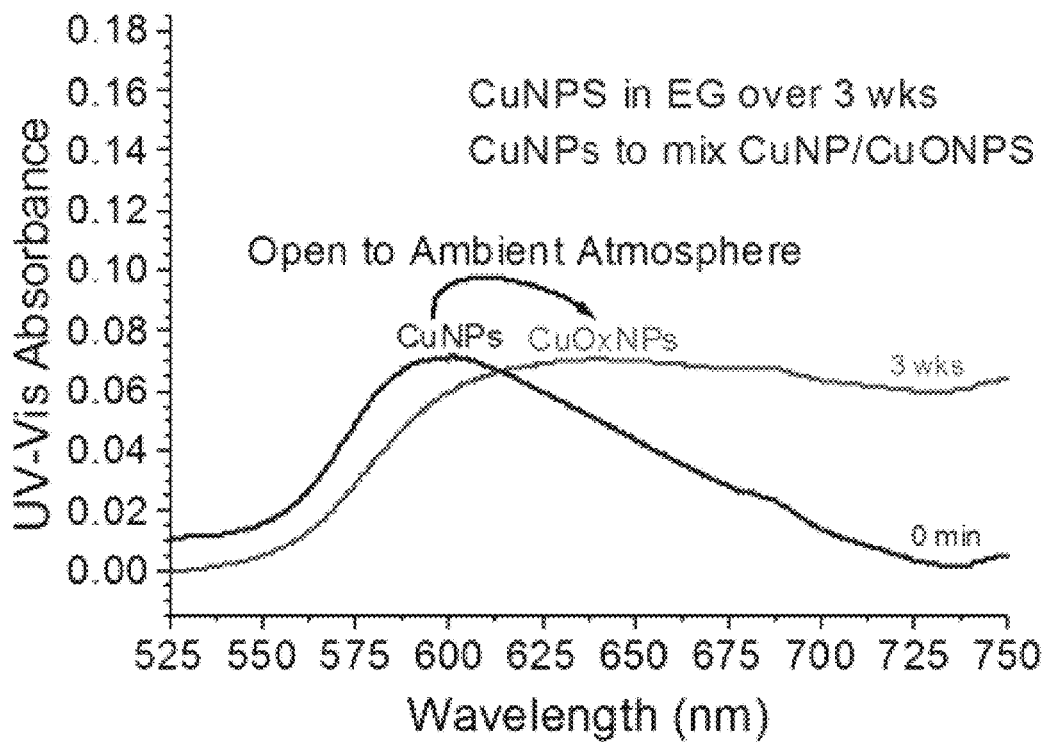
FIG. 6A provides absorption spectra showing the oxidation of copper nanoparticles over time (UV-Vis absorbance vs. wavelength for CuNPs in ethylene glycol over 3 weeks).
Figure 6B:
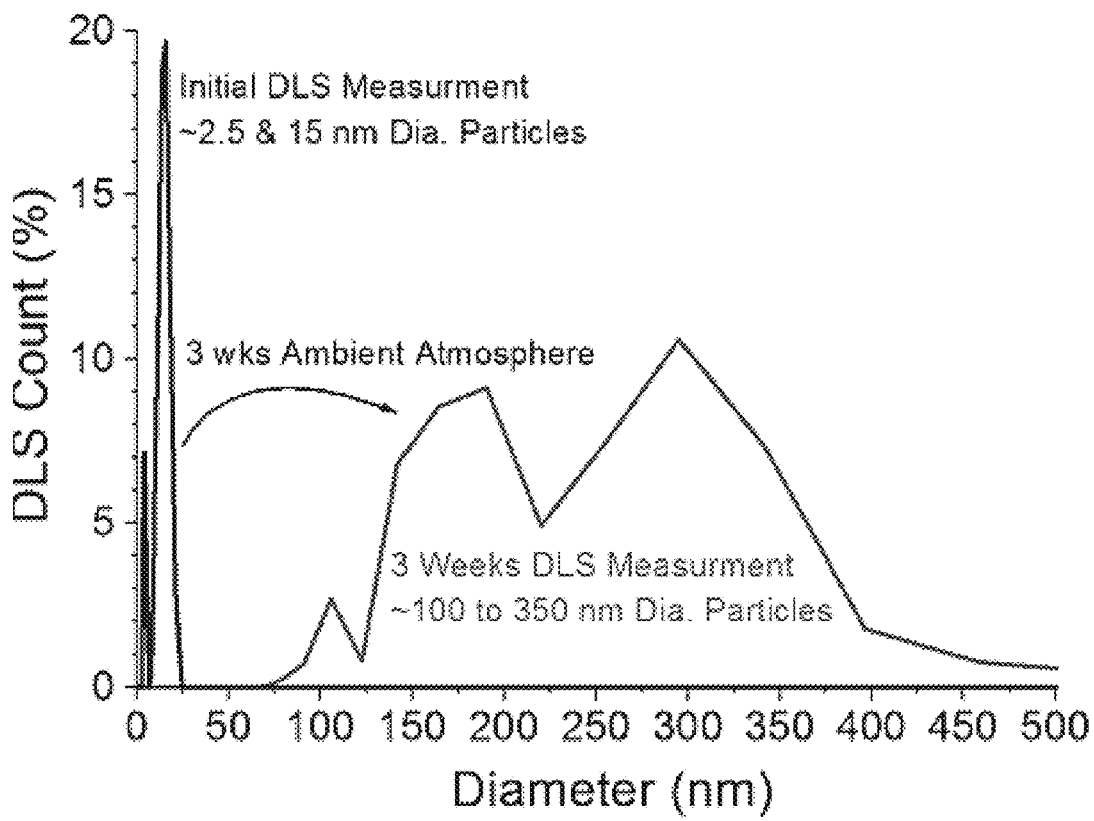
FIG. 6B provides particle diameter distributions showing the growth and/or oxidation of copper nanoparticles over time (DLS count vs. particle diameter for CuNPs in ethylene glycol over 3 weeks).
Figure 7:
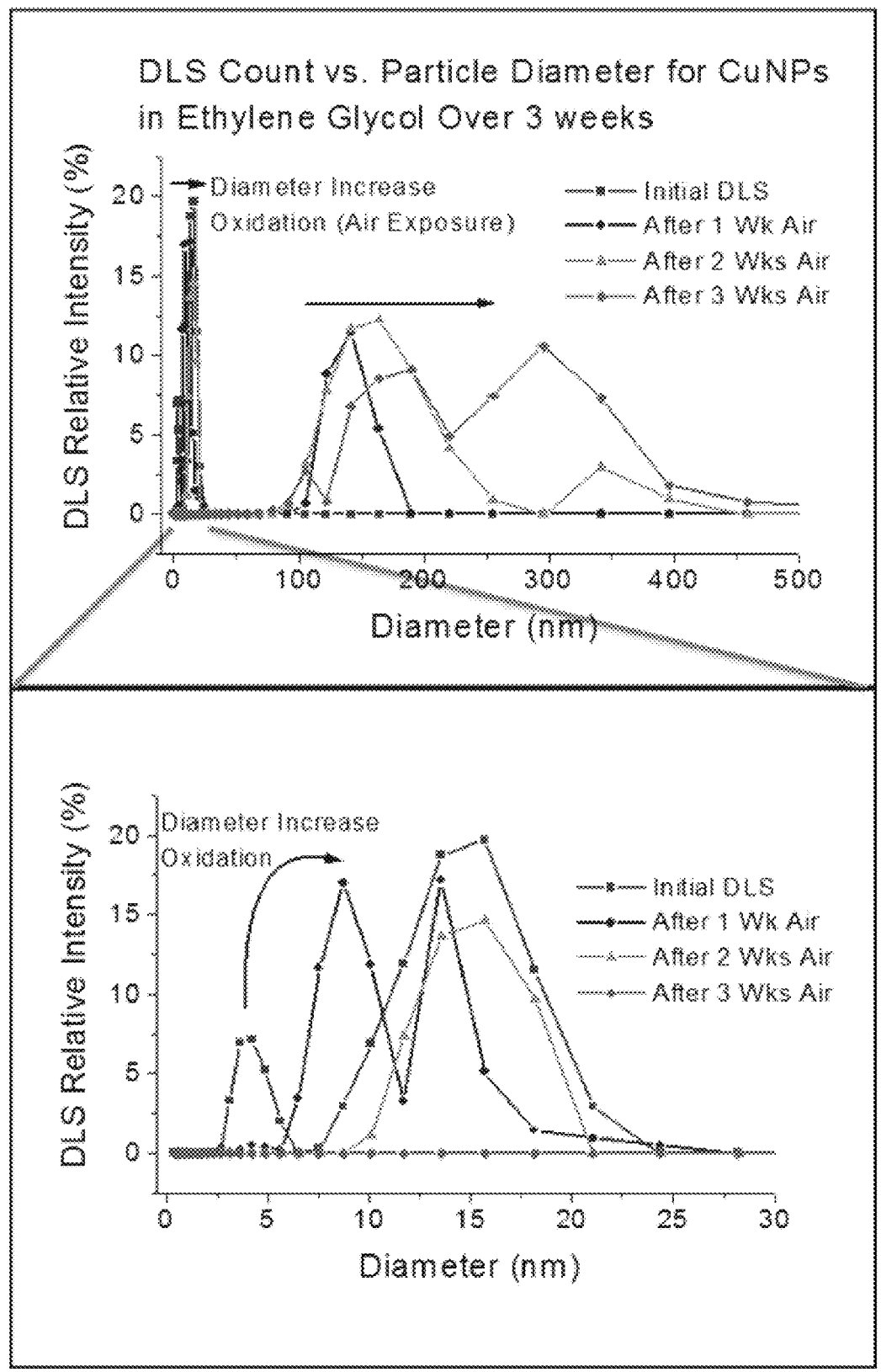
FIG. 7 provides particle diameter distributions showing the growth and/or oxidation of copper nanoparticles over time. The bottom panel shows a magnified view of the 0 to 30 nm range.

Using ethylene glycol as the solvent slowed the oxidation of the nanoparticles to about 3 weeks with the sample vial open to air (FIG. 6A). Increased agglomeration of particles was observed over the course time with particle sizes observed on the order of hundreds of nanometers (FIG. 6B and FIG. 7). Inclusion of minute amounts (e.g., microliters) of an ionic liquid (bmim-$BF_4$) appeared to extend the oxidation time to months. Again, no ligands were directly attached to the nanoparticles.

Figure 8:
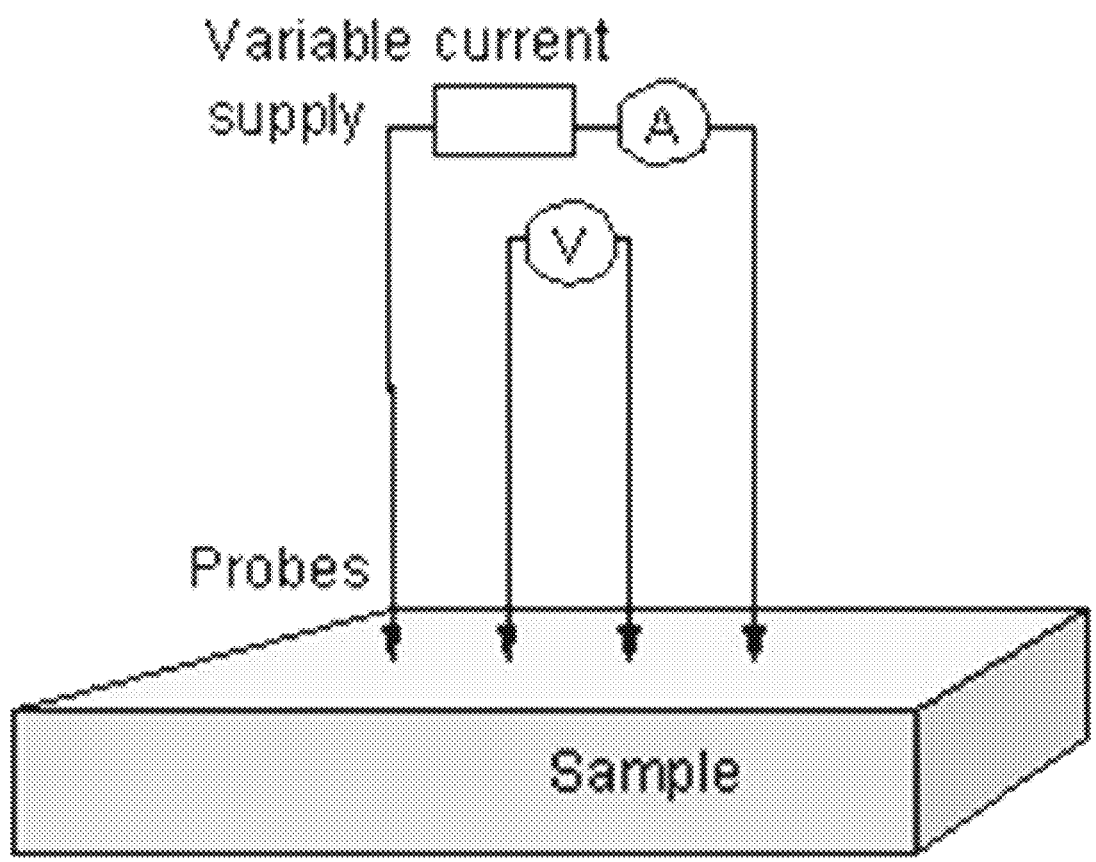
FIG. 8 illustrates a four point probe conductivity diagram for a technique used to measure film conductivity.

Conductivity Measurements. A four point probe was used to perform conductivity measurements by measuring voltage as a function of current (FIG. 8). The conductivity was defined as (current/voltage)*width*thickness/length. Here, the use of separate current/voltage electrodes eliminates errors due to wire impedance and contact resistances. As an example, an approximately 80 µm CuNP film on molybdenum exhibited a conductivity of $4.21 \times 10^7$ S/m, approximately equal to 70% of the conductivity value of bulk Cu ($5.96 \times 10^7$ S/m) and greater than that of molybdenum ($1.85 \times 10^7$ S/m).

Example 3: CuNP Film Deposition on Steel

Figure 9:
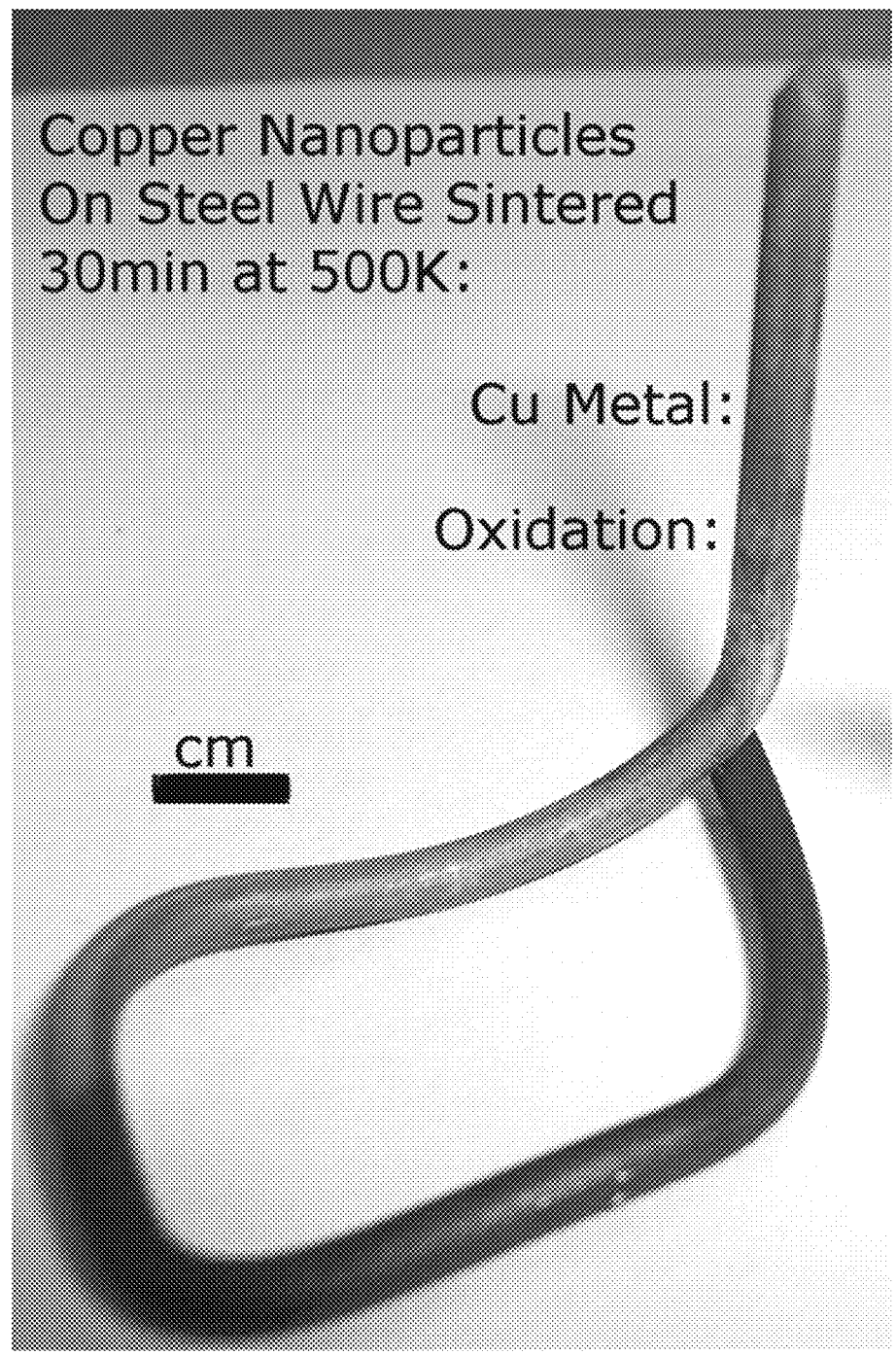
FIG. 9 provides a photograph of a steel wire partially coated with copper nanoparticles.

A steel wire was prepared for coating with a metal layer by deposited nanoparticles by etching for 30 minutes in 37 mol % hydrochloric acid. The steel wire was rinsed in deionized water and submersed in 20 ml ethylene glycol, 10 mg $CuCl_2$, and 45 mg NaOH dissolved in the glycol (pH 12.5). The wire and solution was heated to 192° C. for 15 min at a ramp rate of 30° C./min in an ambient atmosphere. The wire was removed and sintered in 10 cc/min flowing nitrogen at 200° C. An approximately 35 µm thick film of copper was deposited on the surface, as described above. The steel wire and copper film were sintered for 30 minutes at 200° C. in air. A red film was observed on the surface of the steel wire (FIG. 9). The film conductivity was determined to be $1.28 \times 10^7$ S/m, approximately equal to 21% of the conductivity value of bulk Cu ($5.96 \times 10^7$ S/m) and greater than that of steel ($6.95 \times 10^6$ S/m).

Example 4: CuNP Film Deposition on Molybdenum

Figure 10:
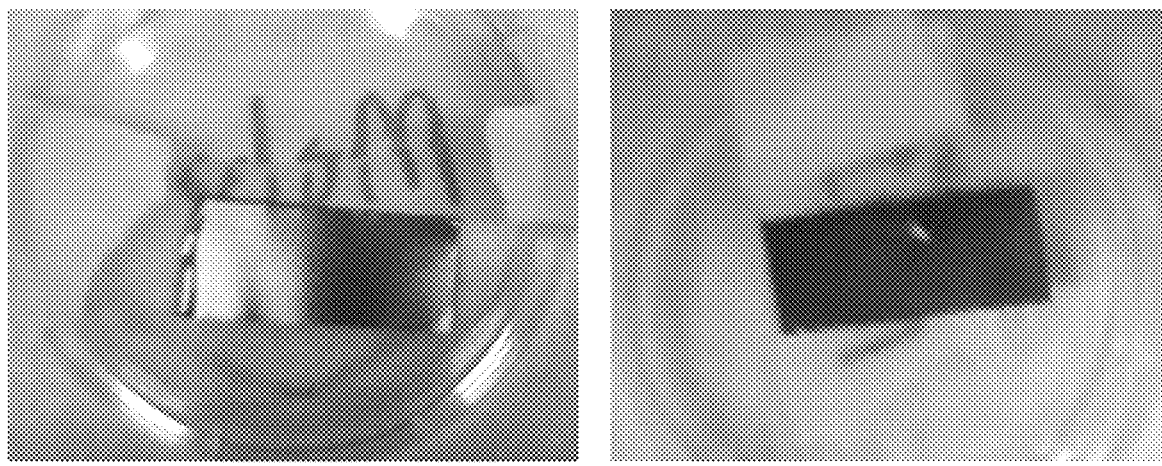
FIG. 10 provides photographs of molybdenum before and after coating with copper nanoparticles and includes an electron micrograph image of nanoparticles after sintering.
Figure 10:
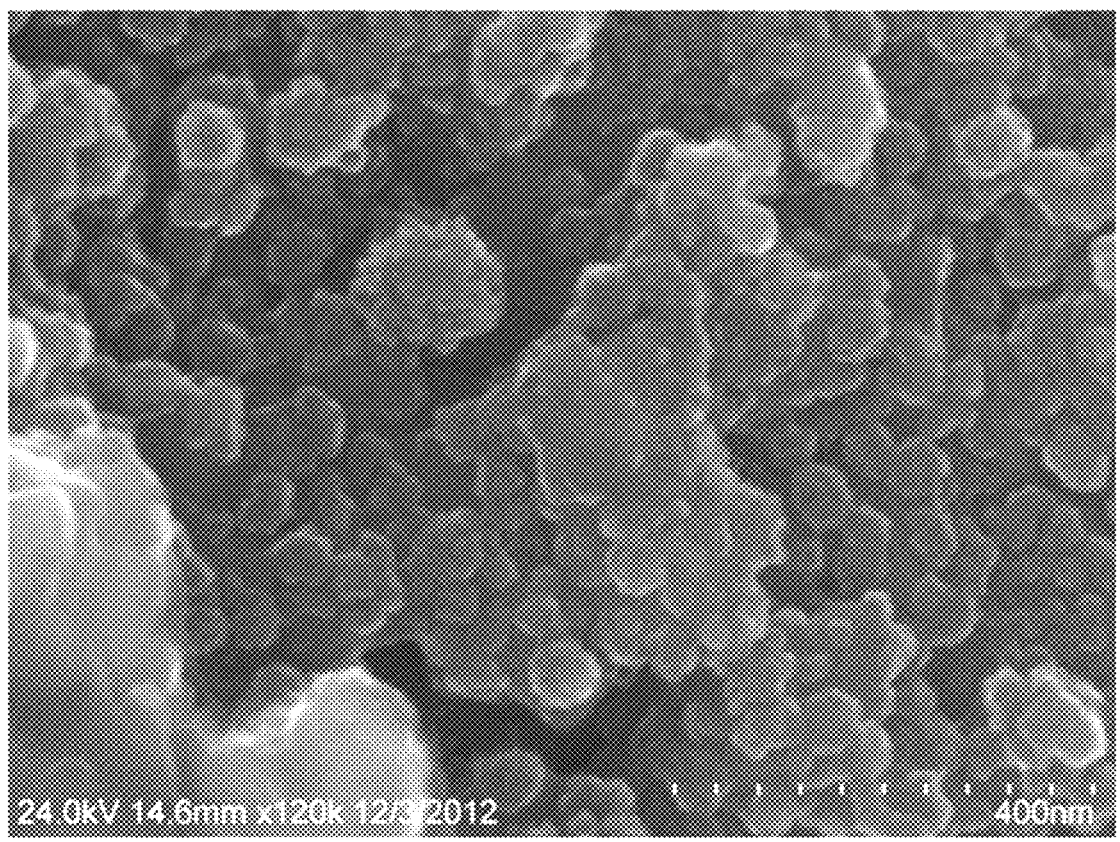

A molybdenum plate was prepared for coating with a metal layer by deposited nanoparticles by etching for 30 minutes. The plate was sonicated in acetone for 15 min, rinsed in deionized water, dryed in $N_2$, and submersed in 20 ml ethylene glycol, 10 mg $CuCl_2$, and 45 mg NaOH dissolved in the glycol (pH 12.5). The plate and solution was heated to 193° C. for 30 min at a ramp rate of 30° C./min in an ambient atmosphere. The plate was removed and sintered in 10 cc/min flowing nitrogen at 200° C. from 5 min to 3 hrs. An approximately 80 μm thick film of copper was deposited on the surface, as described above. The molybdenum plate and copper film were sintered for 1 hour at 200° C. in flowing $N_2$. The red film was observed on transform to an orange brown metallic film (FIG. 10). A scanning electron micrograph image of the surface revealed about 40 nm diameter particles on the surface of the molybdenum (FIG. 10), with the diameter decreasing closer to the molybdenum surface. The film conductivity was determined to be $4.21 \times 10^7$ S/m, approximately equal to 70% of the conductivity value of bulk Cu ($5.96 \times 10^7$ S/m) and greater than that of molybdenum ($1.85 \times 10^7$ S/m).

Example 5: CuNP Film Deposition on Si

Figure 11:
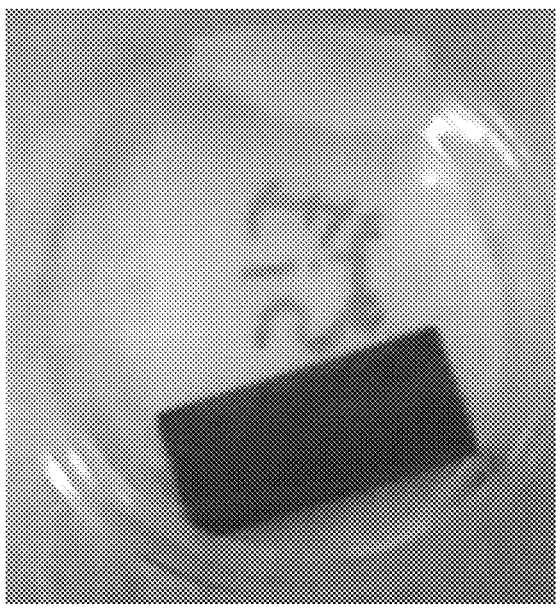
FIG. 11 provides a photograph of copper nanoparticles on a silicon surface and includes an electron micrograph image of the surface.
Figure 11:
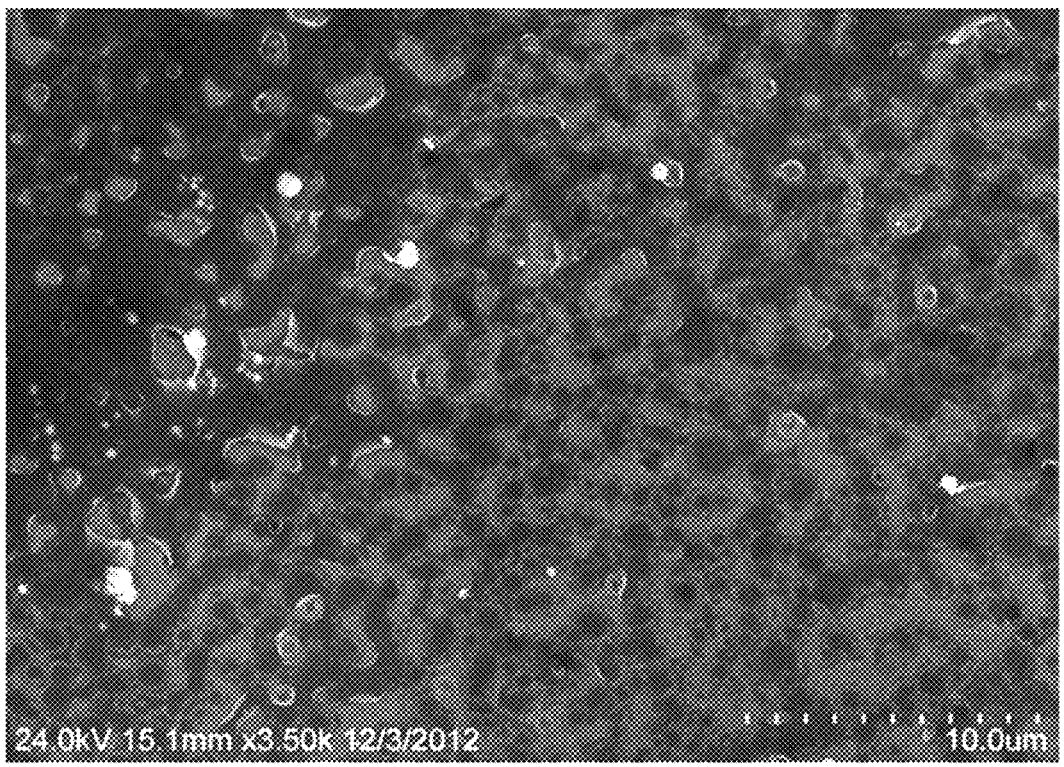

A silicon plate was prepared for coating with a metal layer by deposited nanoparticles by etching for 30 minutes. The plate was sonicated in acetone for 15 min, rinsed in deionized water, dryed in $N_2$, and submersed in 20 ml ethylene glycol, 10 mg $CuCl_2$, and 45 mg NaOH dissolved in the glycol (pH 12.5). The plate and solution was heated to 193° C. for 30 min at a ramp rate of 30° C./min in an ambient atmosphere. The plate was removed and sintered in 10 cc/min flowing nitrogen at 200° C. An approximately 1 to 2 μm thick film of copper was deposited on the surface, as described above. Damage to the film from the stir bar present in the reaction vessel was observed. The silicon plate and copper film were sintered for 1 hour at 200° C. in $N_2$. A red film was observed on the surface of the silicon (FIG. 11). A scanning electron micrograph image of the surface revealed a conductive but non-continuous layer of copper nanoparticles on the silicon surface (FIG. 11). The film conductivity was determined to be $3.18 \times 10^5$ S/m, approximately equal to 0.5% of the conductivity value of bulk Cu ($5.96 \times 10^7$ S/m) but an approximately $10^8$ improvement of that of Si ($1.56 \times 10^{-3}$ S/m).

Example 6: CuNP Film Deposition on $SiO_2$

Figure 15:
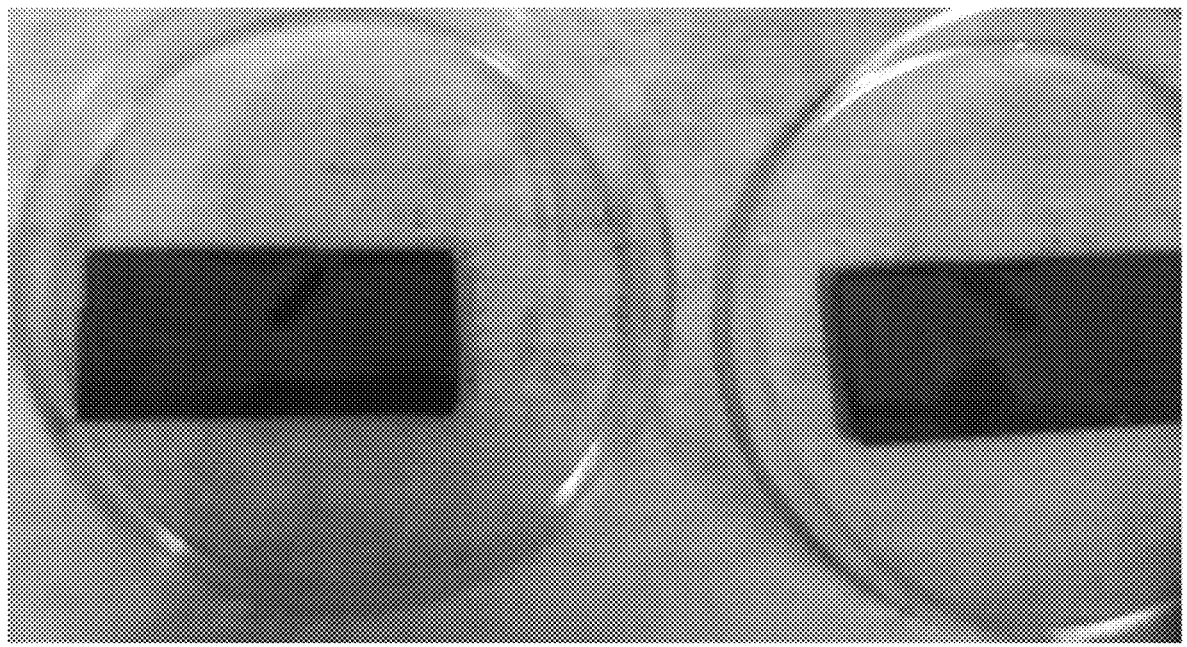
FIG. 15 provides photographs of copper films on silicon dioxide surfaces.
Figure 15:
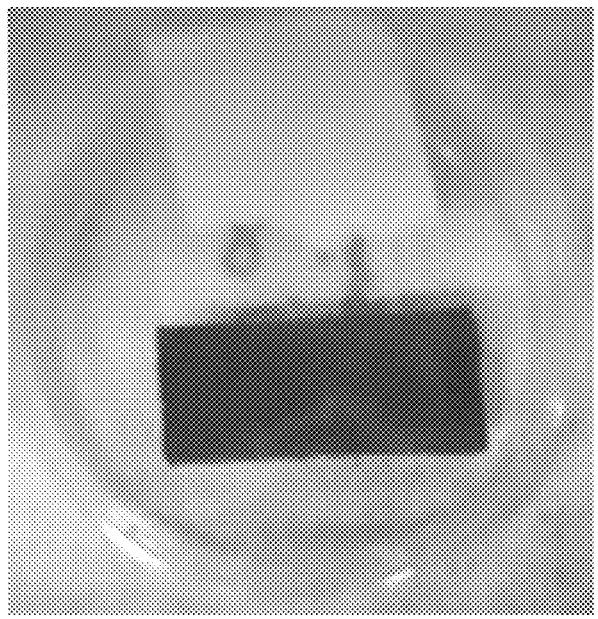

A $SiO_2$ surface was prepared for coating with a metal layer by deposited nanoparticles by etching for 15 minutes in piranha solution (3:1 by volume $H_2SO_4$—$H_2O_2$). The surface was sonicated in acetone for 15 min, rinsed in deionized water, dryed in $N_2$, and submersed in 20 ml ethylene glycol, 10 mg $CuCl_2$, and 45 mg NaOH dissolved in the glycol (pH 12.5). The plate and solution was heated to 193° C. for 30 min at a ramp rate of 30° C./min in an ambient atmosphere. The plate was removed after 5 min of reaction and sintered in 10 cc/min flowing nitrogen at 200° C. An approximately 0.5 to 1 μm thick film of copper was deposited on the surface, as described above. The film was sintered for 1 hour at 200° C. in $N_2$. A dark red film was observed on the surface of the silicon (FIG. 15, bottom). This film was observed to oxidize over the course of 2 days in air. The film conductivity was determined to be 6.84 S/m, showing an approximately $10^{18}$ improvement of that of $SiO_2$ ($1.86 \times 10^{-13}$ S/m).

Example 7: CuNP Film Deposition on $SiO_2$

A $SiO_2$ surface was prepared for coating with a metal layer by deposited nanoparticles by etching for 15 minutes in piranha solution (3:1 $H_2SO_4$—$H_2O_2$). The surface was sonicated in acetone for 15 min, rinsed in deionized water, dryed in $N_2$, and submersed in 20 ml ethylene glycol, 10 mg $CuCl_2$, and 45 mg NaOH dissolved in the glycol (pH 12.5). The plate and solution was heated to 193° C. for 30 min at a ramp rate of 30° C./min in an ambient atmosphere. The plate was removed after 2 min of reaction and sintered in 10 cc/min flowing nitrogen at 200° C. An approximately 500 nm to 630 nm thick film of copper was deposited on the surface, as described above. The film was sintered for 1 hour at 200° C. in $N_2$. A dark red film was observed on the surface of the silicon. This film was observed to oxidize over the course of 2 days in air. The film conductivity was determined to be $1.18 \times 10^{-5}$ S/m, showing an improvement of that of $SiO_2$ ($1.86 \times 10^{-13}$ S/m).

Example 8: CuNP Film on $SiO_2$ Using APTMS Adhesion

Figure 12:
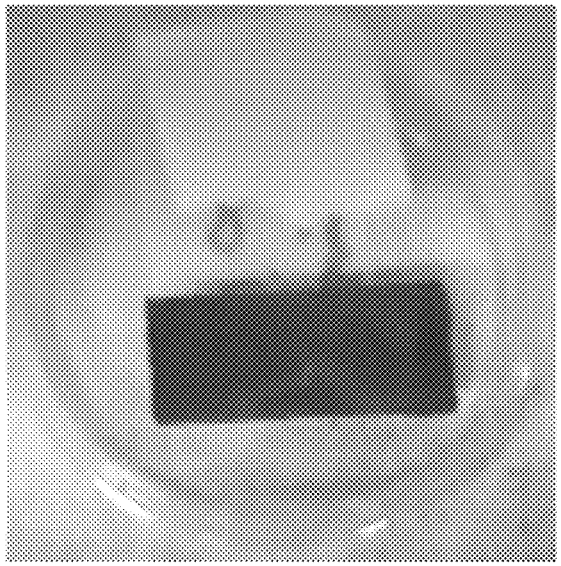
FIG. 12 provides photographs of copper nanoparticle films on silicon dioxide surfaces after sintering.
Figure 12:
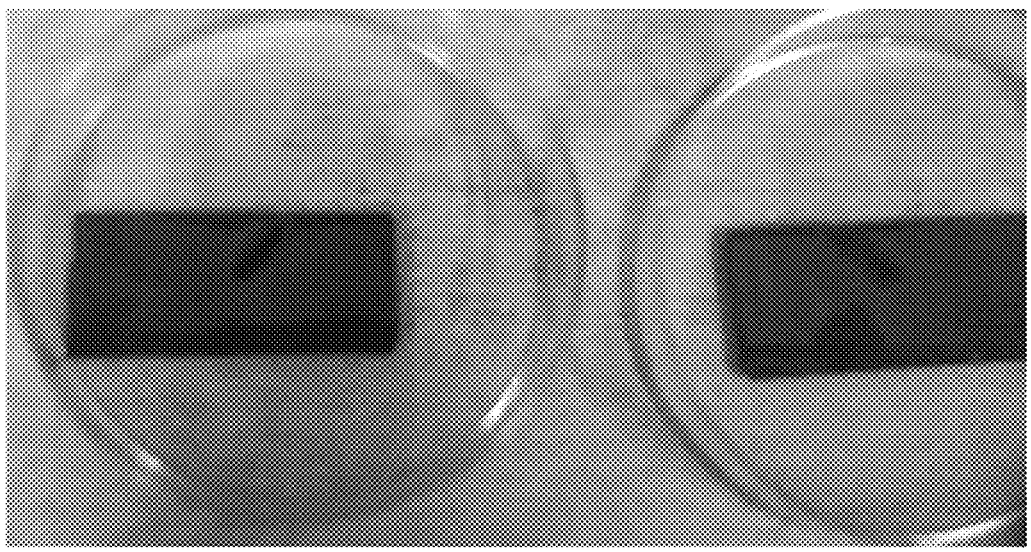

Copper films having thicknesses between 130 nm and 235 nm were prepared on silicon dioxide. Four $SiO_2$ surface treatments were explored including $H_2SO_4$ acid treatment followed by APTMS: HCl followed by APTMS; 5 minutes of HF exposure followed by APTMS (50 μL APTMS/50 mL methanol); 10 minutes of HF exposure followed by APTMS (50 μL APTMS/50 mL methanol); and HF followed by piranha solution followed by APTMS (50 μL APTMS/50 mL methanol). All APTMS exposure at room temperature for 15 min followed by a 5 min anneal in flowing nitrogen at 155° C. The surface was then submersed in 20 ml ethylene glycol, 10 mg $CuCl_2$, and 45 mg NaOH dissolved in the glycol (pH 12.5). The plate and solution was heated to 193° C. for 30 min at a ramp rate of 30° C./min in an ambient atmosphere. The plate was removed after 2 min of reaction and sintered in 10 cc/min flowing nitrogen at 200° C. from 5 min to 3 hrs. The treated surfaces were coated with copper nanoparticle films, as above. The films were sintered for 1 hour at 200° C. in $N_2$. Photographs of several of the observed copper films after sintering are shown in FIG. 12. The conductivity of each film was measured: the HCl-APTMS surface had a conductivity of $1.18 \times 10^{-5}$ S/m; the 5 min. HF-APTMS surface had a conductivity of 0.118 S/m. The 10 min. HF-APTMS surface had a conductivity of 6.84 S/m; the HF-Piranha-APTMS had a conductivity of $1.61 \times 10^6$ S/m. All films showed an improvement in conductivity over $SiO_2$ ($1.86 \times 10^{-18}$ S/m), though only the HF-Piranha-APTMS film had a conductivity near that of bulk Cu ($5.96 \times 10^7$ S/m).

Figure 13A:
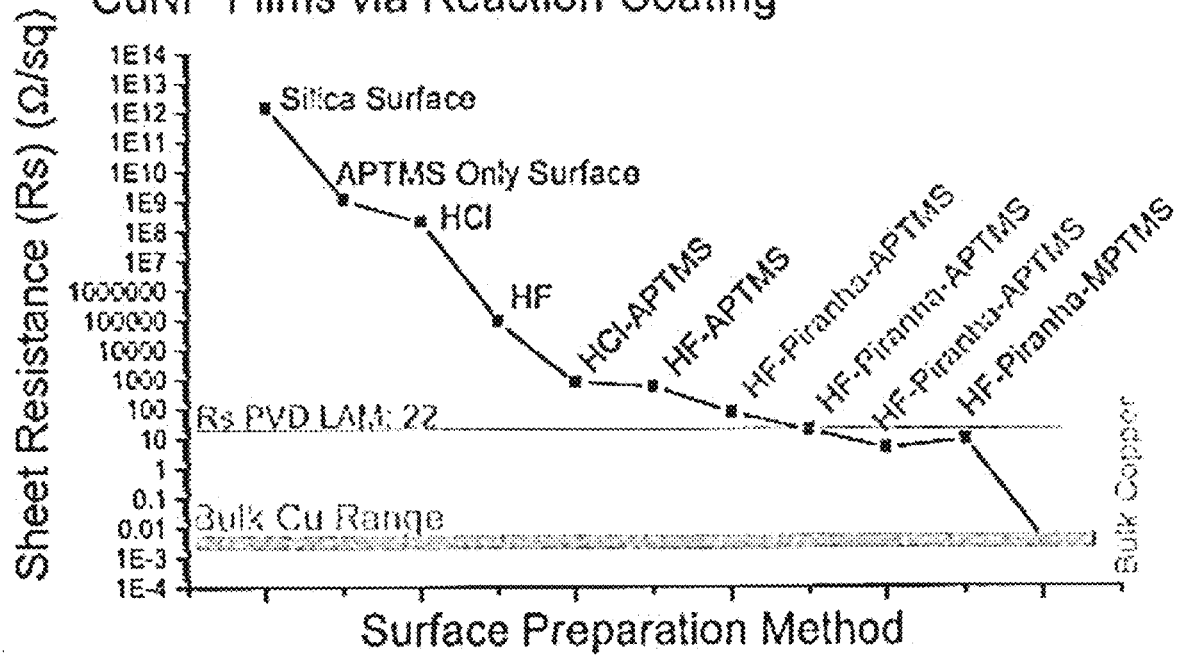
FIG. 13A provides data showing measured sheet resistance for copper films formed on various prepared surfaces.
Figure 13B:
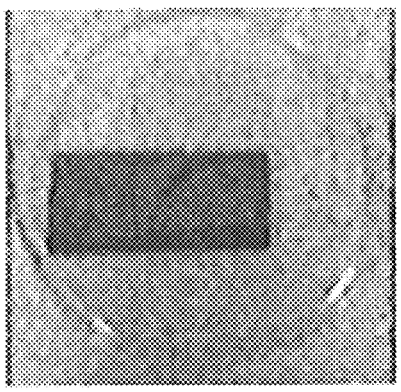
FIG. 13B provides photographs of copper films on silicon dioxide surfaces after sintering.
Figure 13B:
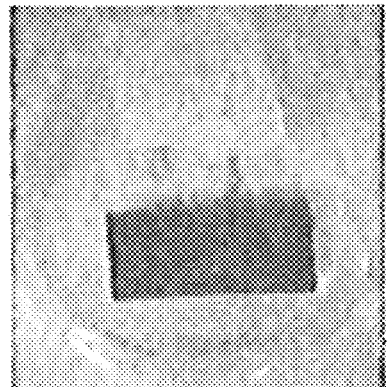
Figures 14A, 14B:
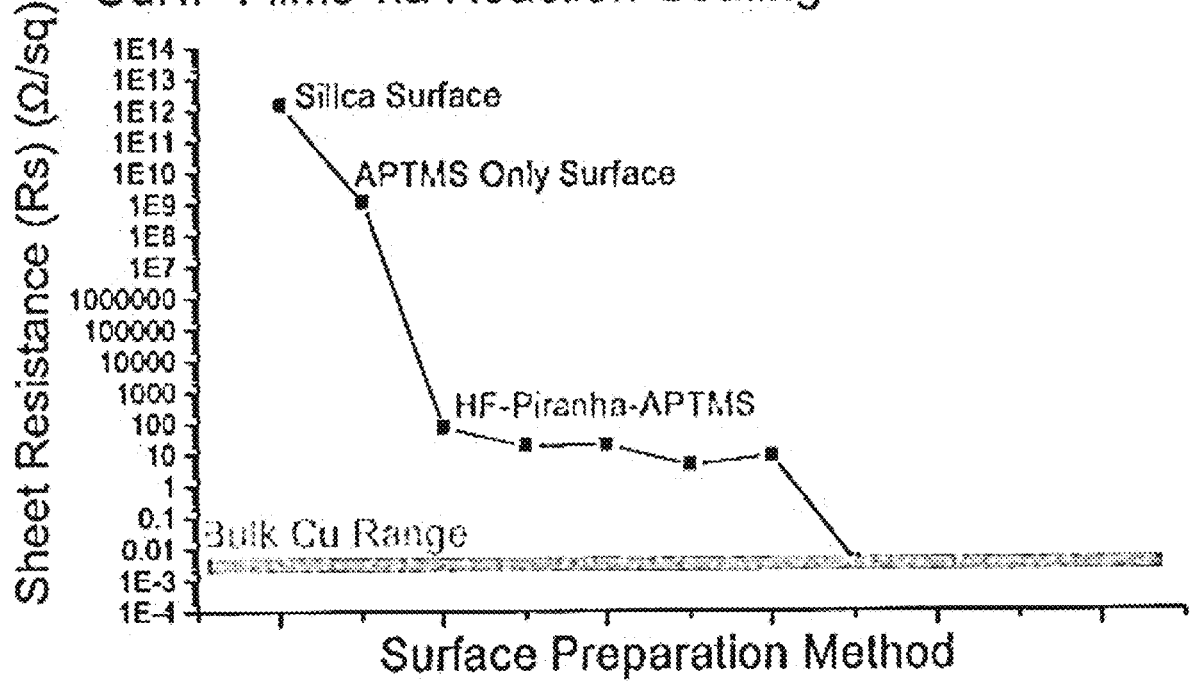
FIG. 14A provides data showing measured sheet resistance for copper films formed on various prepared surfaces.
FIG. 14B provides photographs of copper films on silicon dioxide surfaces after sintering.

The ATPMS adhesion layer was observed to increase the film conductivity and reduce island growth. Various films were sintered for 1 hour at between 200° C. and 400° C. in $N_2$. FIGS. 13A and 13A show the measured sheet resistances for various films, and FIGS. 13B, 14B and 15 (top) show photographs of various post-sintered nanoparticle films on $SiO_2$.

In summary, it was observed that the nanoparticle film formation increases conductivity on $SiO_2$. The HF-Piranha-APTMS surface preparation allows for film formation with increased CuNP surface adhesion and little mass loss based on tape test. Alternate film deposition methods can optionally allow for better control of film parameters, such as spin coating.

Example 9: Copper Nanoparticle Response vs. Sinter Temperature

Figure 16A:
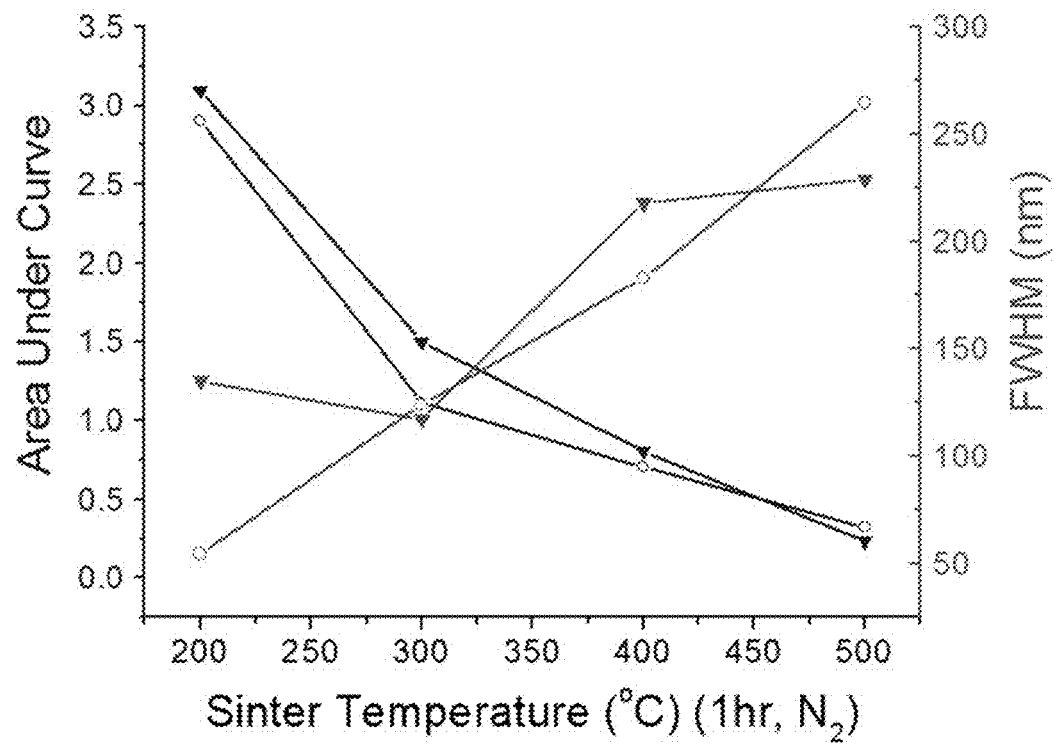
FIG. 16A provides data showing the effects of sintering at progressively increasing temperatures on a drop cast film.
Figure 16B:
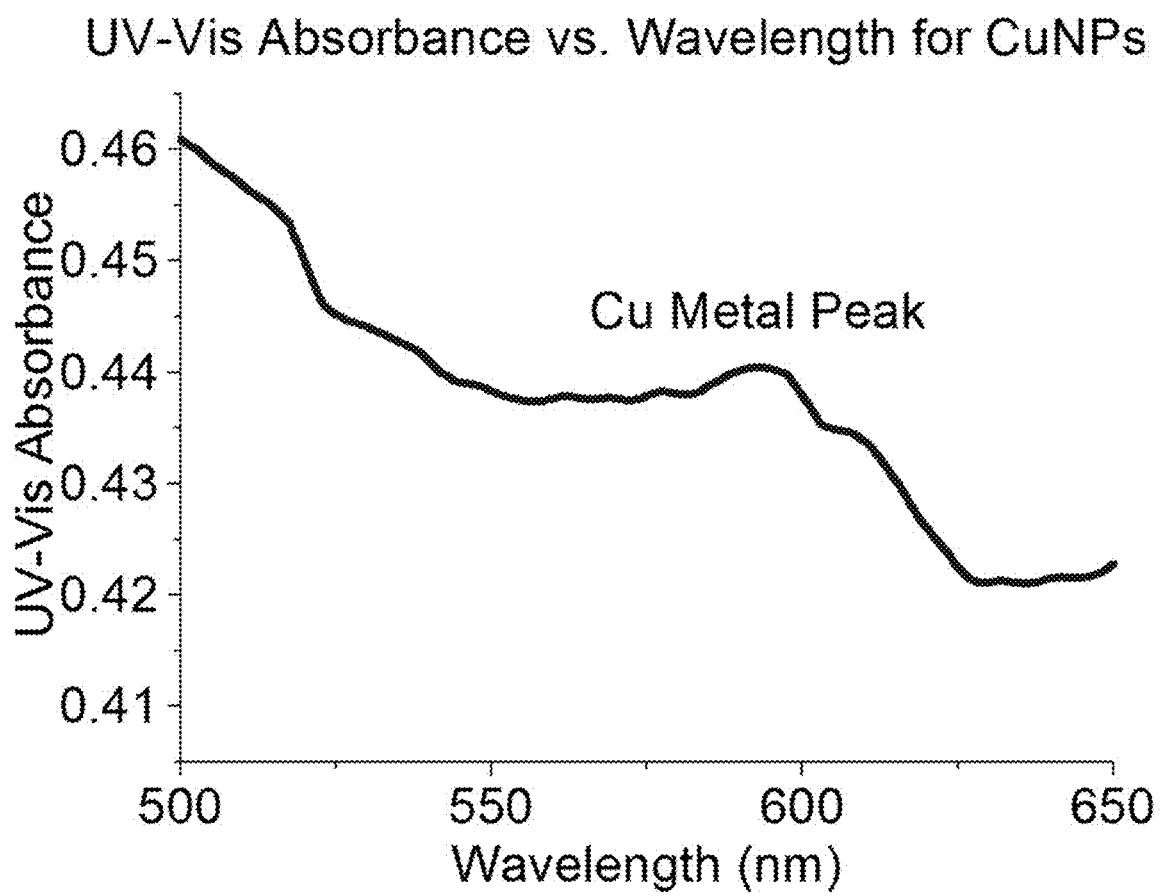
FIG. 16B provides an example UV-Vis spectrum showing a peak attributable to metallic copper.
Figure 35:
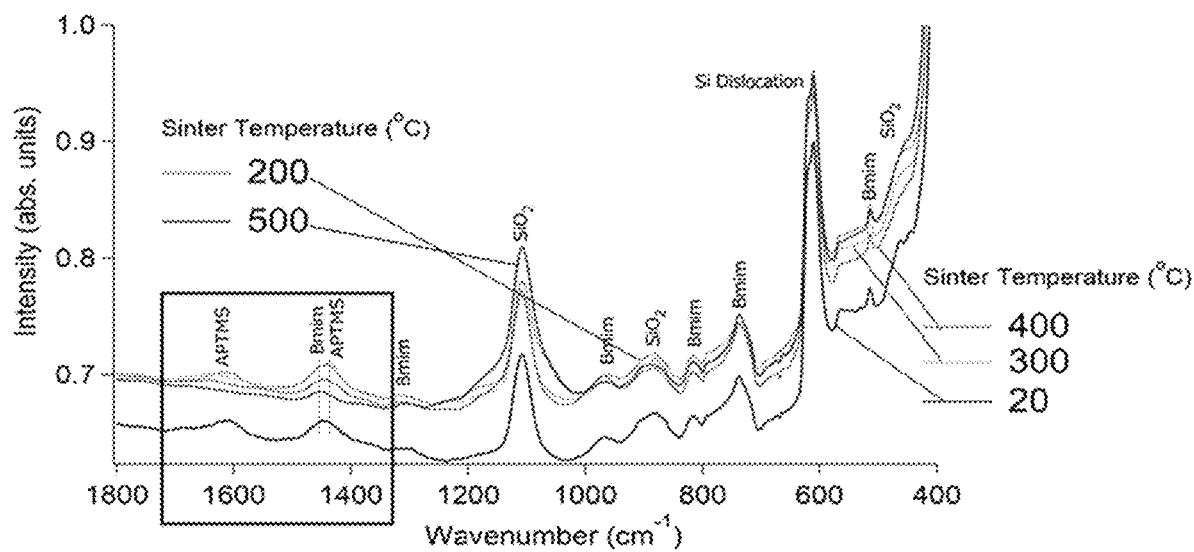
FIG. 35 provides FTIR data showing the effect of sinter temperature on degradation of the amine termination and ionic liquid.
Figure 36:
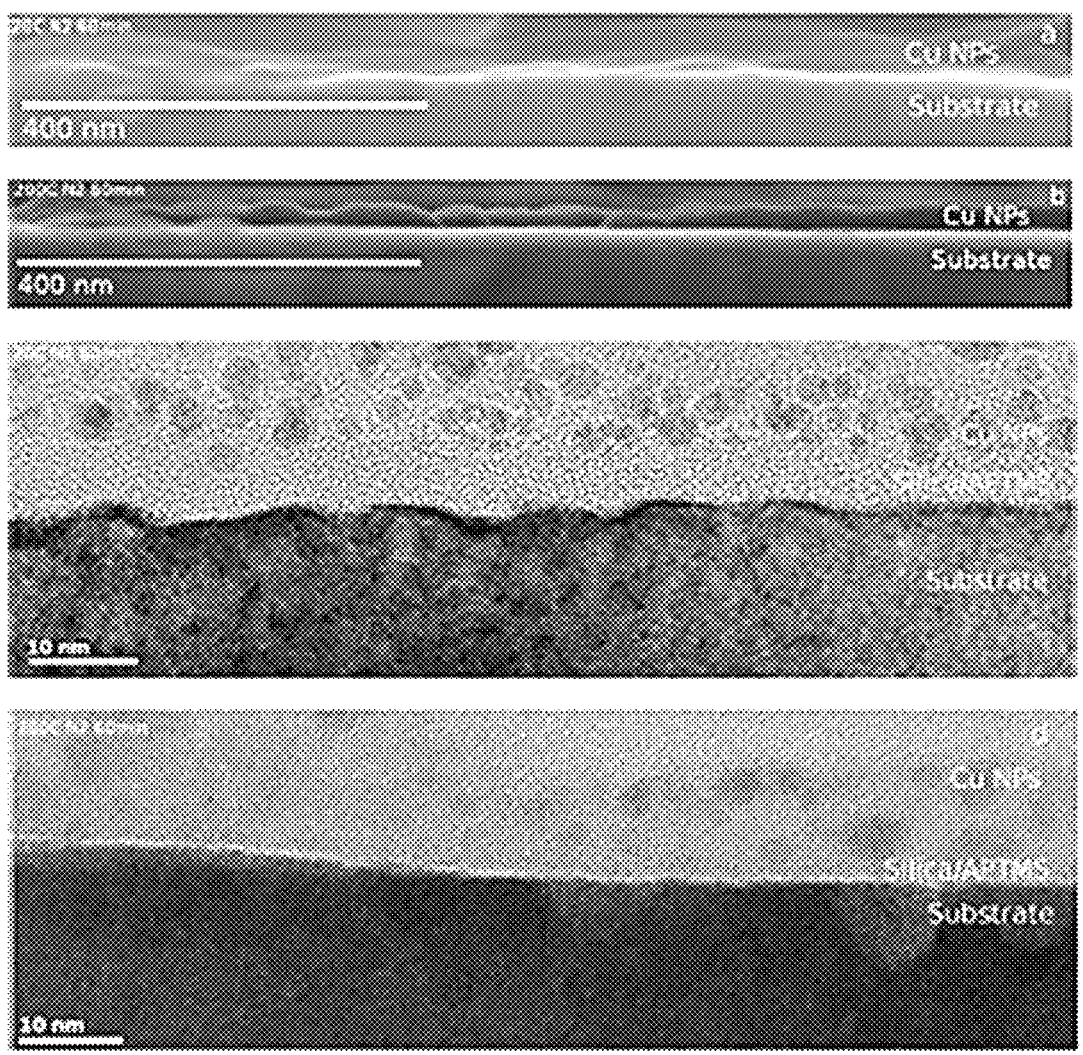
FIG. 36 provides SEM images and data showing the effect of sinter temperature on film thickness.
Figure 36:
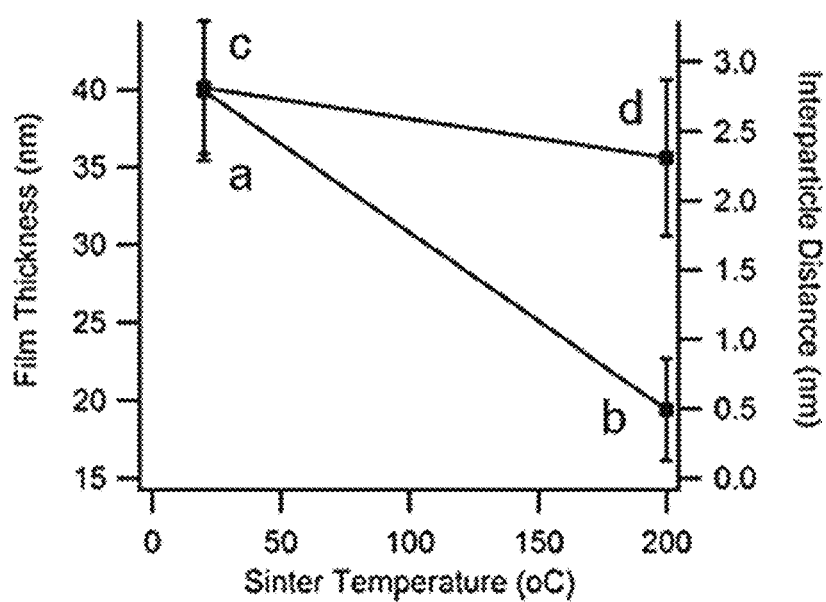
Figure 37:
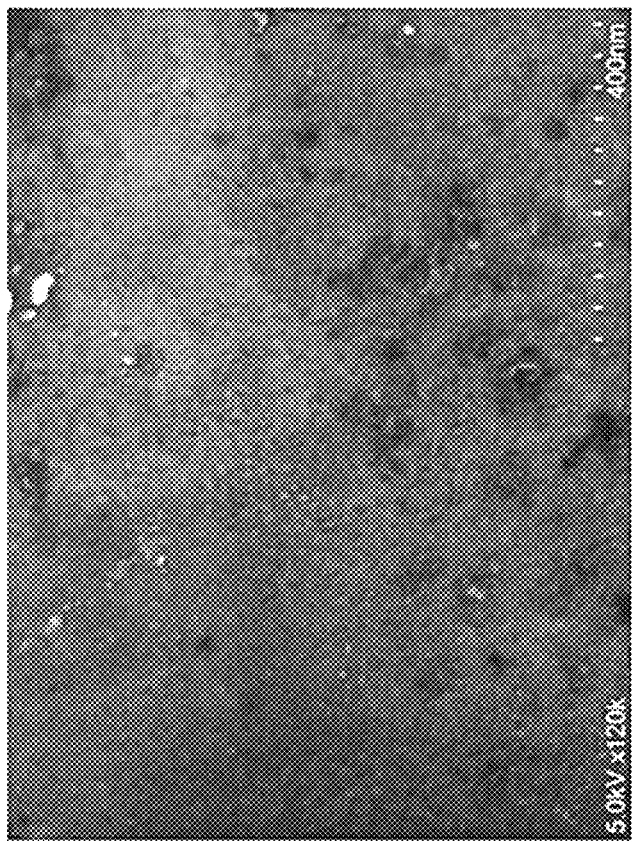
FIG. 37 provides SEM images of a copper nanoparticle films of the present methods performed at 20° C. (left) and performed using a 200° C. sintering temperature (right).
Figure 37:
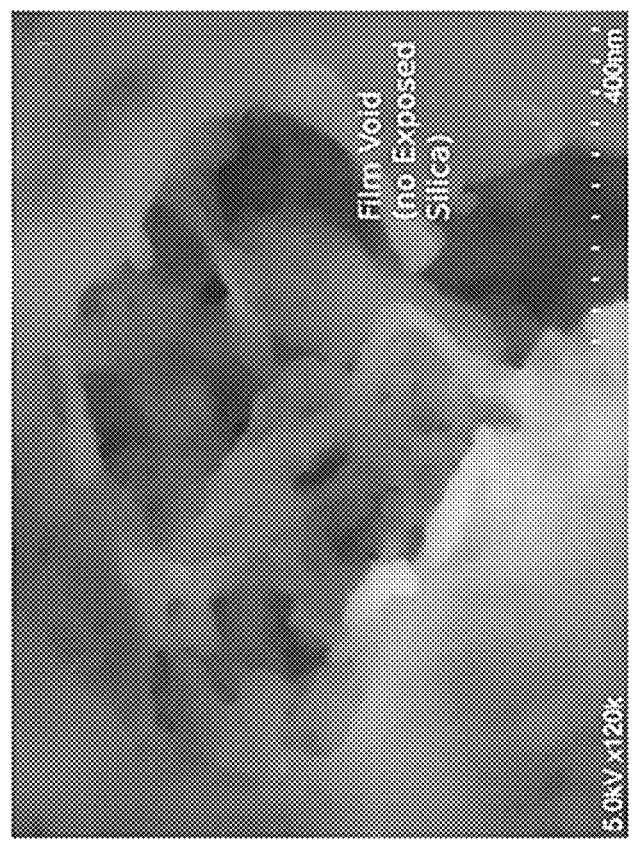
Figure 38:
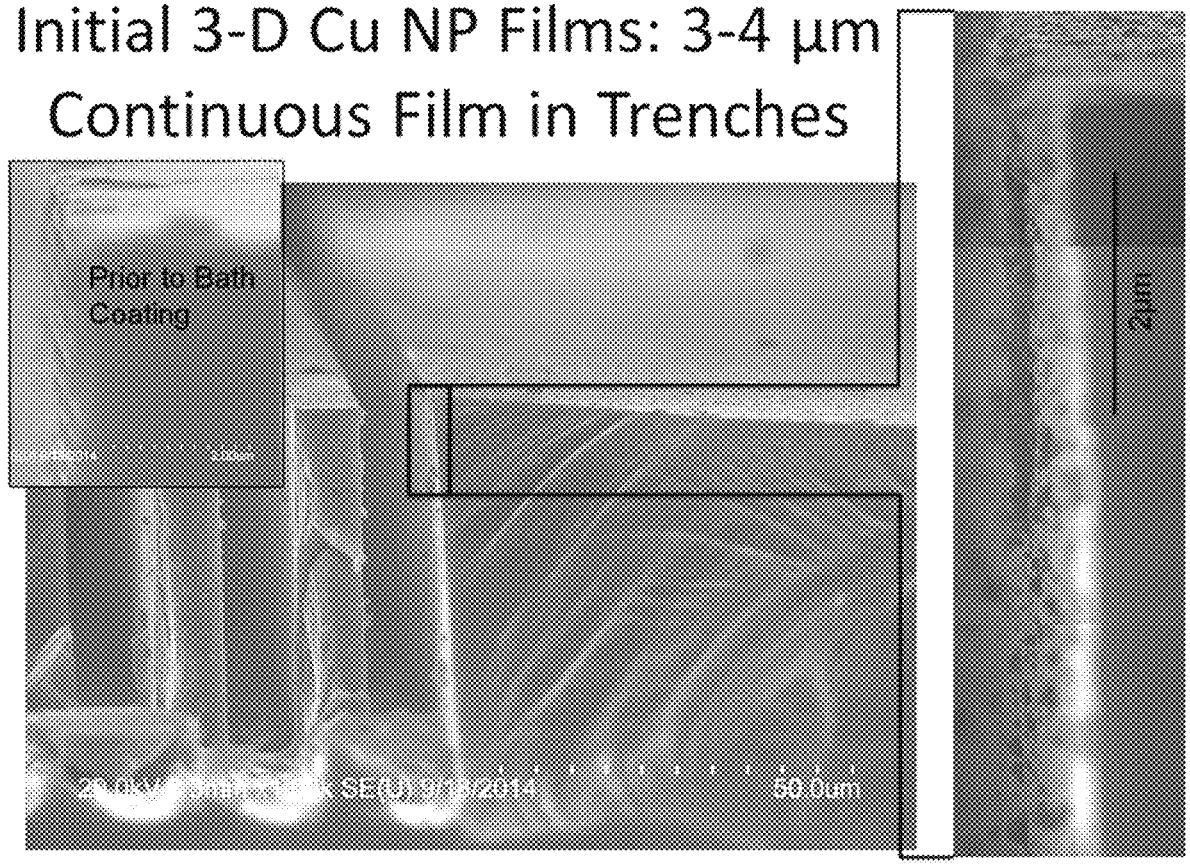
FIG. 38 provides scanning electron micrographs of a continuous copper nanoparticle film in a trench formed by the methods of the present invention.

Glass substrates were prepared and treated with APTMS, similar to the above described $SiO_2$ substrates. CuNP films using another technique (drop casting 15 μl/drop×50 drops) were formed on the substrates at 190° C. in $N_2$. UV-Vis measurements indicated a presence of surface-plasmon resonance with a decreased response that possibly allowed for film formation. Measurements of the absorption peak at 585 nm as a function of sinter temperature exhibited a decreasing area under the curve/increasing full width at half maximum (FIG. 16A). An example UV-Vis spectrum is shown in FIG. 16B. An increased sinter temperature resulted in a decreased CuNP peak response and increased film width along with a change in film morphology, showing grain growth and island formation (FIGS. 36 and 37). Sintering partially contributes to the decrease in film thickness seen in SEM images and even reduced irregularities in the Cu nanoparticle (NP) film, which can expose the underlying silica substrate. As shown in FIG. 35, increased sintering temperature can degrade the amine termination surface but will not degrade the ionic liquid (Bmim). FIGS. 35-37 show that the NPs rearrange during sintering at low temperatures. FIG. 35 is an FTIR graph showing that the ionic liquid (Bmim) is stable up to 500° C. but that the amino (APTMS) layer begins to degrade after a sinter temperature of 400° C. is reached. FIG. 36 is composed of both SEM and TEM images of the ELD film both before and after sintering which demonstrate that the the film undergoes macroscopic (i.e. micron scale) adjustments to form into a conformal film upon sintering. Nanoscale adjustments (i.e. change in internanoparticle distance) does not change significantly. FIG. 37 also shows that due to sintering the surface of the NP ELD film smooths as seen by the disappearance of the surface irregularity upon sintering.

Example 10: Initial Forming Gas to $N_2$ Sinter Comparison

Figure 17A:
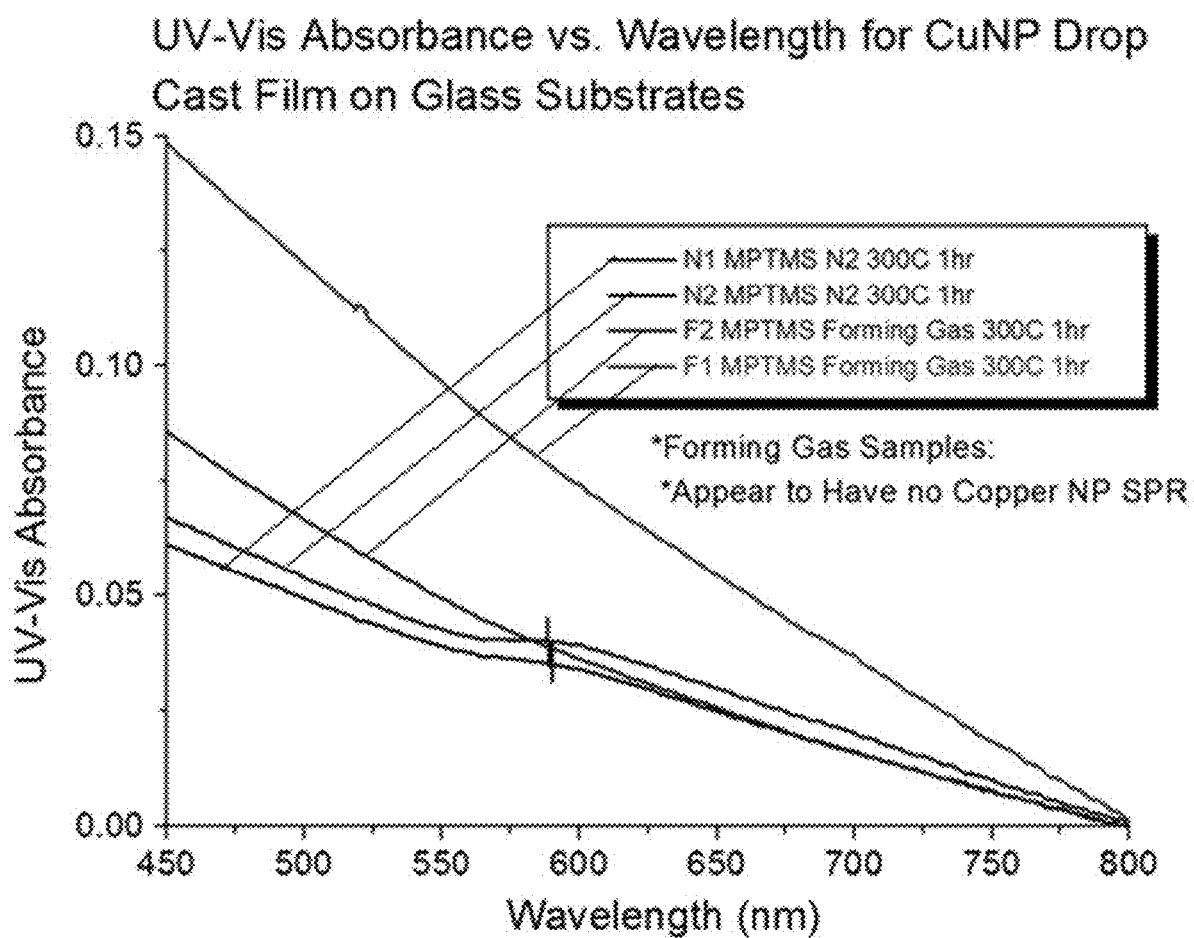
FIG. 17A provides UV-Vis spectra showing the effects of composition changes to the forming gas/sintering atmosphere.
Figure 17B:
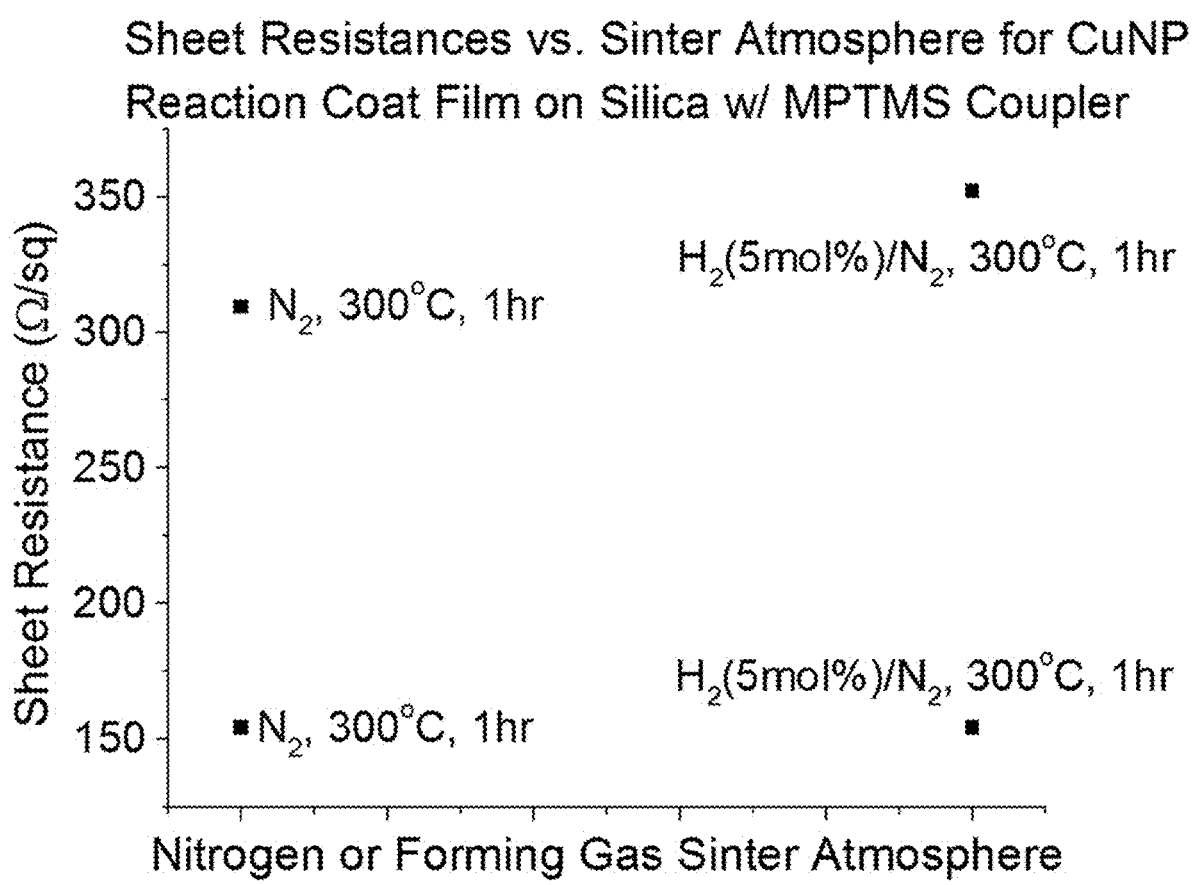
FIG. 17B provides data showing changes in sheet resistance dependent upon the forming gas/sintering atmosphere.
Figure 18A:
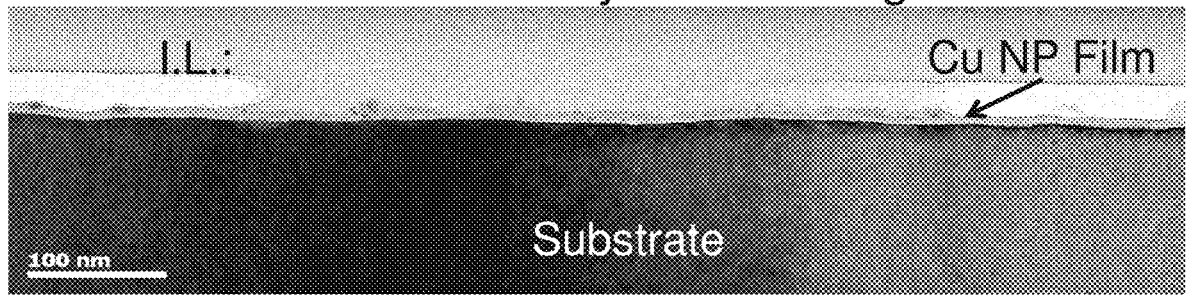
FIG. 18A, FIG. 18B, FIG. 18C and FIG. 18D provide electron micrograph images of metallic films on substrates generated via the present methods illustrating the ability to generate smooth films substantially free of voids, pinholes and grains.
Figure 18B:
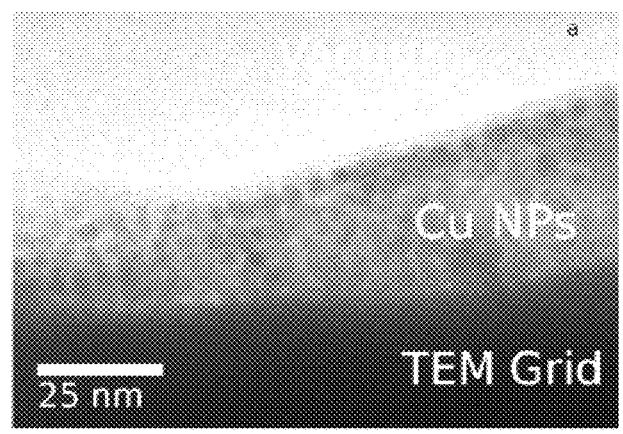
Figure 18C:
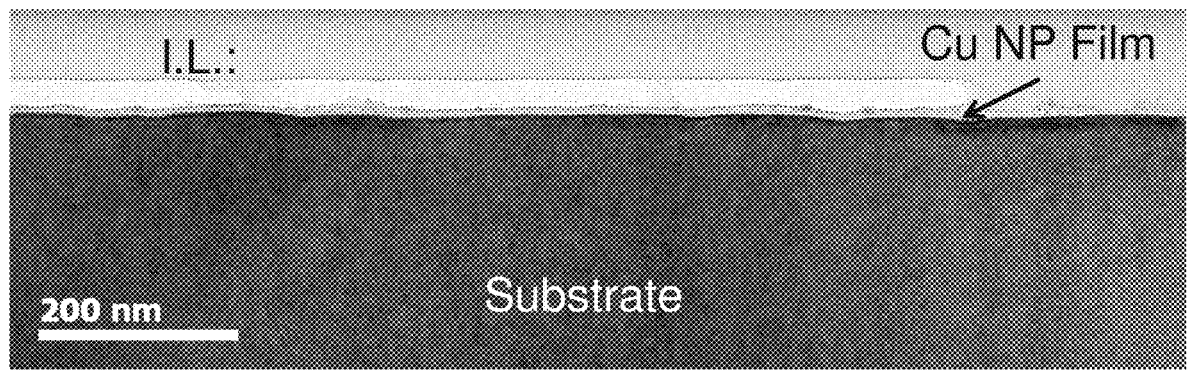
Figure 18D:
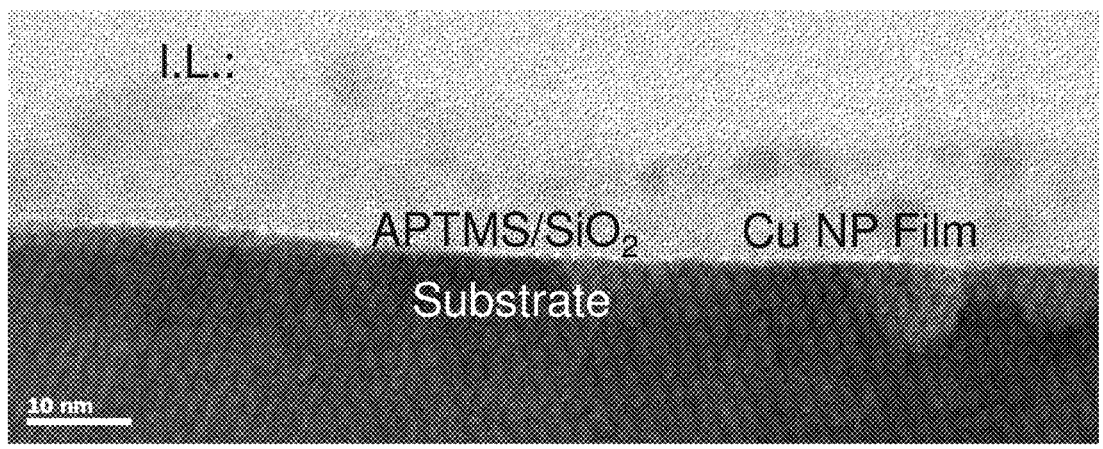

Effects of the initial forming gas and sinter gas were investigated. The results of UV-Vis absorption indicated that the forming gas atmosphere alters film morphology (FIG. 17A) and potentially indicate an absence of copper nanoparticle surface-plasmon resonance. Both gas flow rates were 10 cc/min STP, a plug flow furnace at 200° C. The initial conductivity measurements are shown in FIG. 17B and indicate that the forming gas/sintering gas effects film morphology.

Example 11: SEM and TEM Cross Section Images

Silica samples were prepared for coating with nanoparticle films using an APTMS coating formed in a similar method to the above coating procedures. Both reaction and drop cast coated films were prepared. The films were sintered in $N_2$ at 200° C. or 400° C. for 1 hour.

FIG. 18A, FIG. 18B, FIG. 18C and FIG. 18D provide electron micrograph images of metallic films on substrates generated via the present methods illustrating the ability to generate smooth films substantially free of voids, pinholes and grains. The thin cohesive metallic film shown in FIG. 18A has a thickness of about 20 nm. The thin cohesive metallic films shown in FIGS. 18C and 18D demonstrate the advantages of using an ionic liquid for particle formation and deposition steps, such as formation of a smooth film without voids and grains.

Figure 19A:
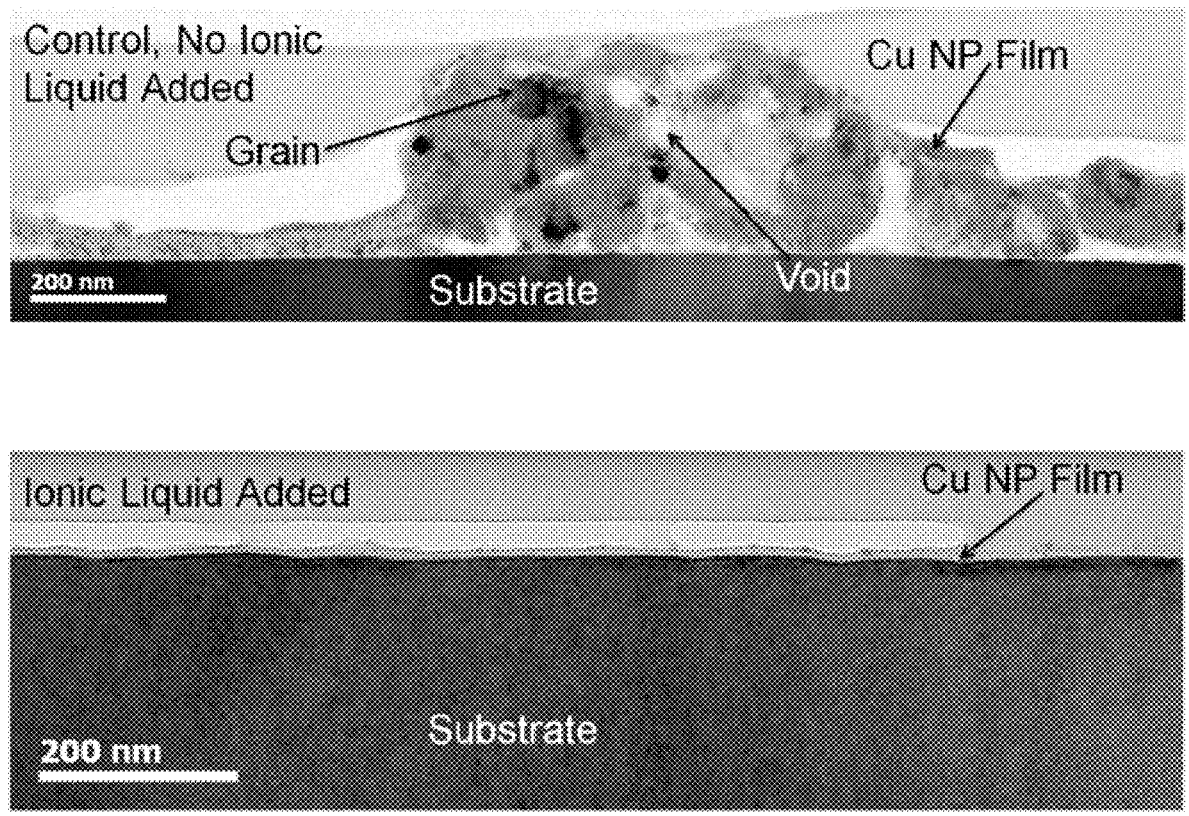
FIGS. 19A and 19B provide TEM images of copper nanoparticle films formed on substrates without the use of an ionic liquid (top in both figures) and with the use of an ionic liquid (bottom in both figures).
Figure 19B:
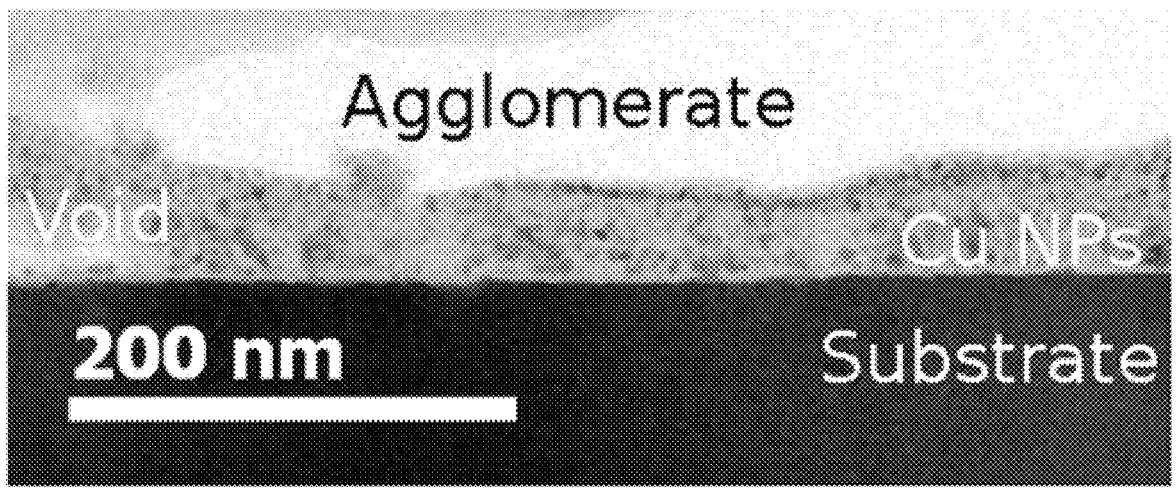
Figure 19B:
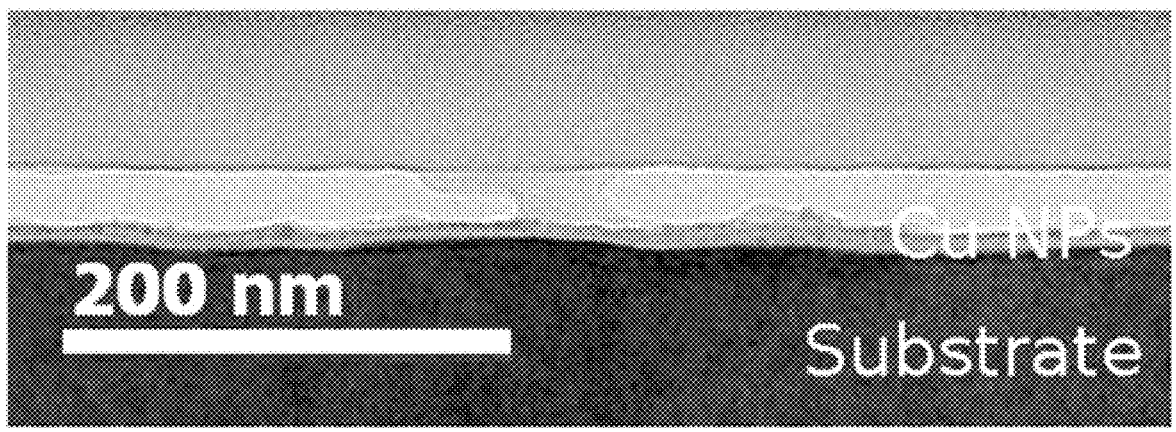

FIGS. 19A and 19B provide TEM images of copper nanoparticle films formed on substrates without the use of an ionic liquid (top in both figures) and with the use of an ionic liquid (bottom in both figures). As can be seen, the films formed utilizing the ionic liquid are significantly smoother and continuous.

SEM-Cross Section Summary. The drop cast technique produced films with a high degree of voids and particle agglomeration and the use of increased sinter temperature also produces island growth (FIG. 21B).

Figure 21A:
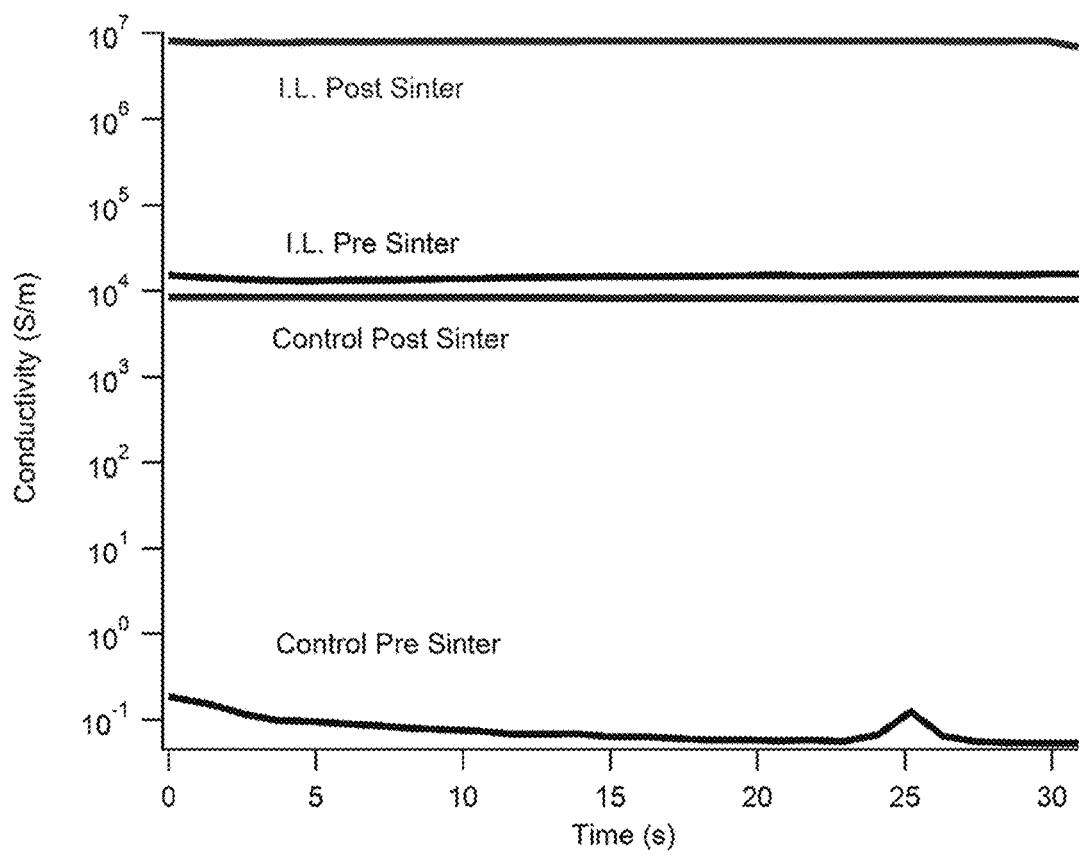
FIG. 21A provides plots of conductivity (S/m) verses time(s) for Cu films generated via the present methods illustrating that that the thin copper film deposited using nanoparticles has a conductivity that is about one-tenth that of bulk copper. The plots in FIG. 21A include Cu films made via the present methods before (I.L. Pre Sinter) and after (I.L. Post Sinter) sinter processing and control films before (Control Pre Sinter) and after (Control Post Sinter) sinter processing.
Figure 21B:
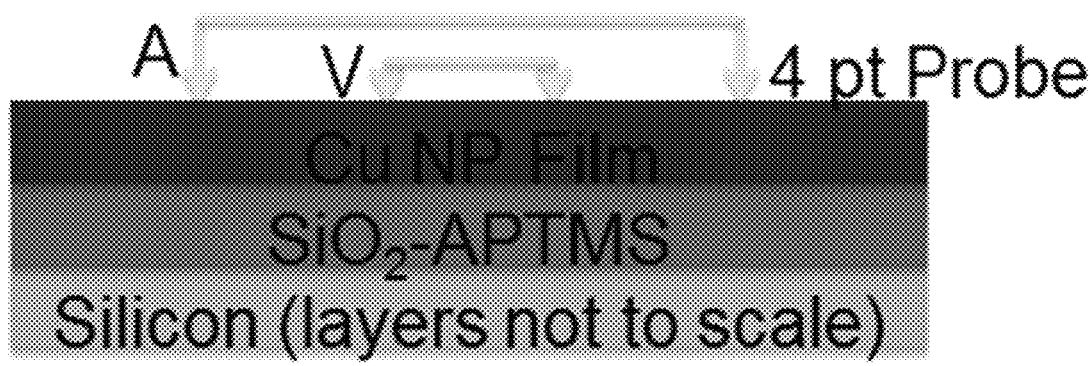
FIG. 21B provides a schematic showing the thin film layout and 4 pt probe geometry for making these measurements.

FIG. 21A provides plots of conductivity (S/m) verses time(s) for Cu films generated via the present methods illustrating that that the thin copper film deposited using nanoparticles has a conductivity that is about one-tenth that of bulk copper. The plots in FIG. 21A include Cu films made via the present methods before (I.L. Pre Sinter) and after (I.L. Post Sinter) sinter processing and control films before (Control Pre Sinter) and after (Control Post Sinter) sinter processing. FIG. 21B provides a schematic showing the thin film layout and 4 pt probe geometry for making these measurements.

Example 12: Solution Cycle Coating of CuNPs

Copper nanoparticles were created as in Example 2 and concentrated by mixing with ethanol, centrifuging for 30 minutes and repeating 3 times. Extraction of the Cu NP phase was performed by decantation. The CuNP phase was then redispersed in ethanol via sonication for 30 min. All experimental steps were performed at ambient conditions. The UV-Vis spectra of the particles showed little oxidation during this process.

Figure 22:
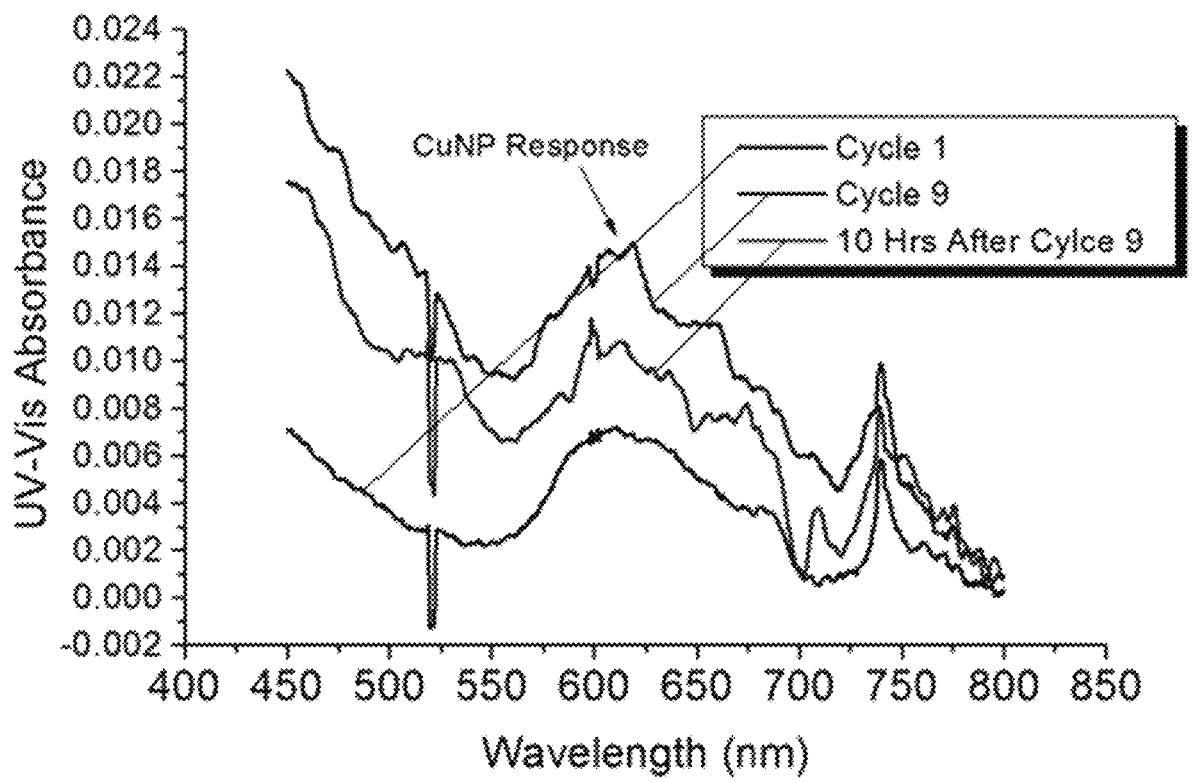
FIG. 22 provides absorption spectra of nanoparticles in solution coating cycles.

Silica substrates were prepared by coating with MPTMS and the substrates were dipped for 1 hour in the copper nanoparticle and ethanol solution. The surfaces were cleaned with $N_2$ and then dipped in ethane dithiol for 1 hour. This process was repeated 9 times and UV-Vis spectra of the solution were obtained at each cycle (FIG. 22).

The film formed in the first cycle exhibited a conductivity of $2.96 \times 10^6$ S/m, consistent with a thin layer of approximately 10 nm to 25 nm in thickness. The conductivity measured in cycles 3-9 decreased to between $10^{-9}$ to $10^{-12}$ S/m indicating that the film may have delaminated from the surface.

Example 13: Solution Cycle Coating of CuNPs

Copper nanoparticles were created as in Example 2 and concentrated by mixing with ethanol, centrifuging for 30 minutes and repeating 3 times. The experimental setup was the same as in Example 13 in all aspects except that it included an ethanol rinse for 30 seconds between each dipping cycle.

Figure 23:
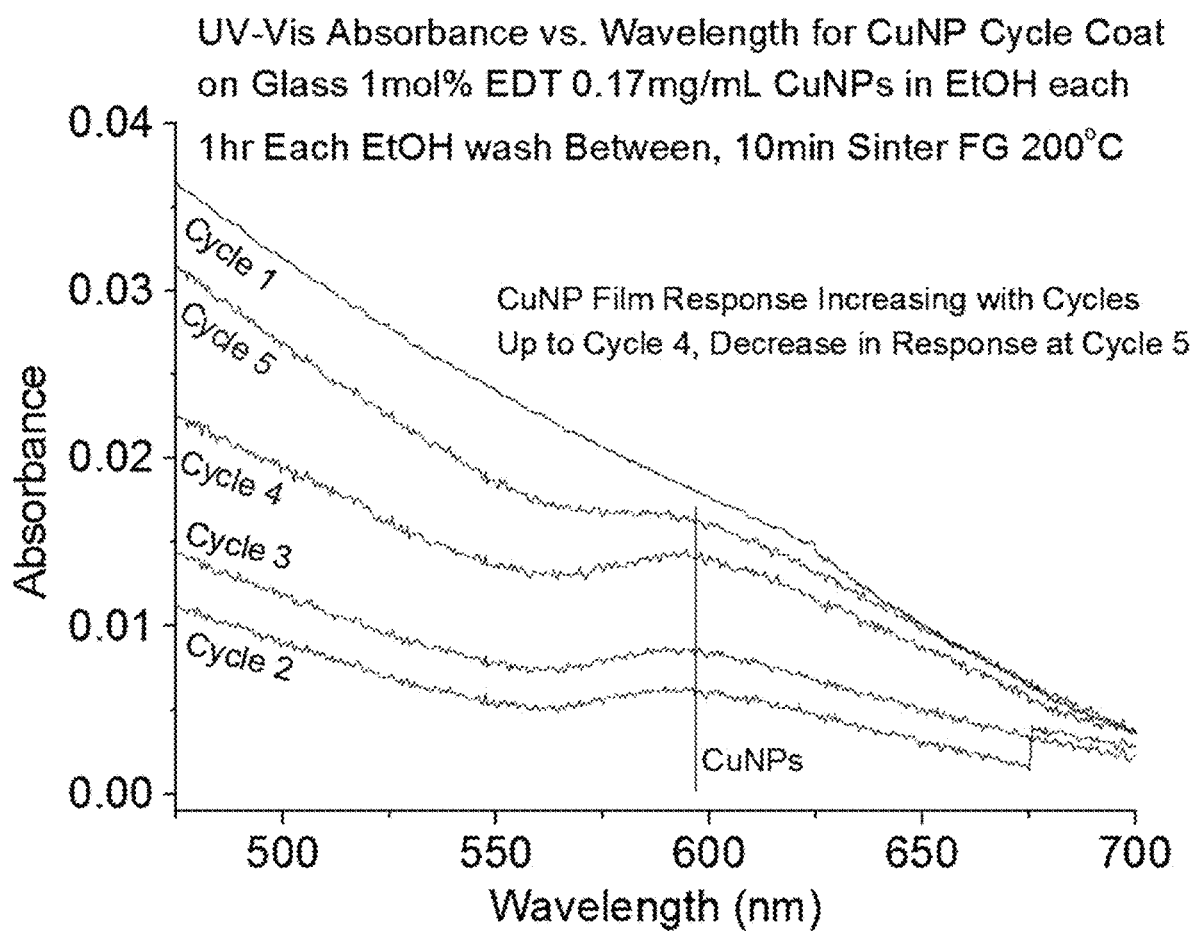
FIG. 23 provides absorbance data for nanoparticle solution coating cycles.

Glass substrates were prepared by coating with MPTMS and the substrates were dipped for 1 hour in the copper nanoparticle and ethanol solution. The surfaces were cleaned with $N_2$ and then dipped in ethane dithiol for 1 hour. This process was repeated 5 times and the carbon nanoparticle surface plasmon resonance (SPR) response was measured (FIG. 23). Each of the first four cycles exhibited an increase in SPR response, although the $5^{th}$ cycle exhibited a decreased response.

Example 14: Copper Nanoparticle Oxidation

Nanoparticle oxidation times were improved from minutes to months by changing the solvent from diphenyl ether to ethylene glycol, adding μL amounts of ionic liquid as a charge compensator. The NP solutions were bottled under ambient conditions and were not re-opened during the experiment. All solutions were kept at ambient conditions.

Figure 24A:
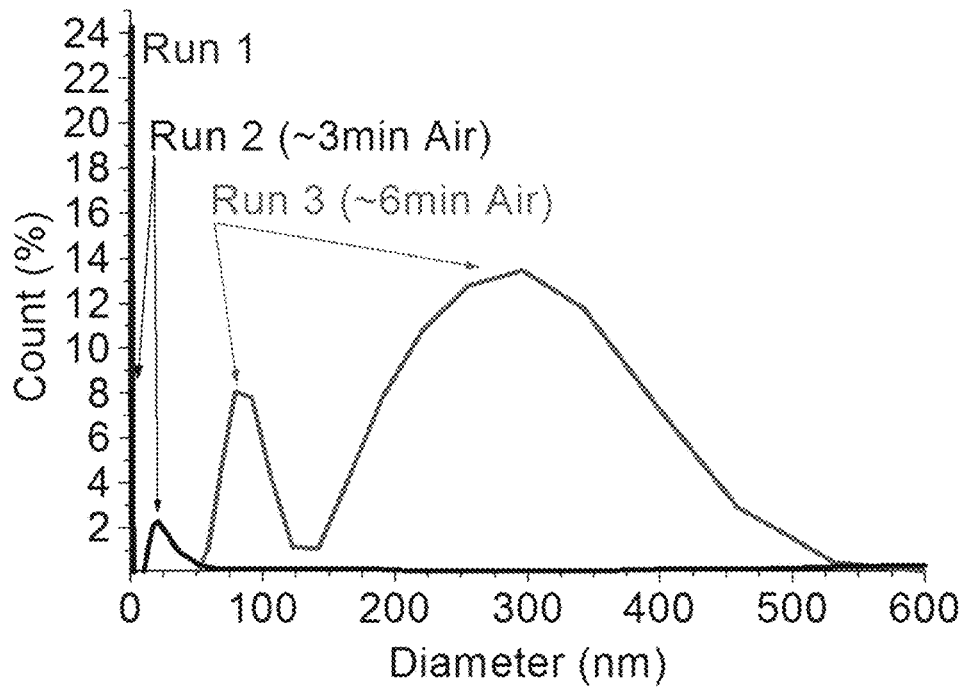
FIGS. 24A and 24B provide particle diameter distributions showing the growth and/or oxidation of copper nanoparticles over time.
Figure 24B:
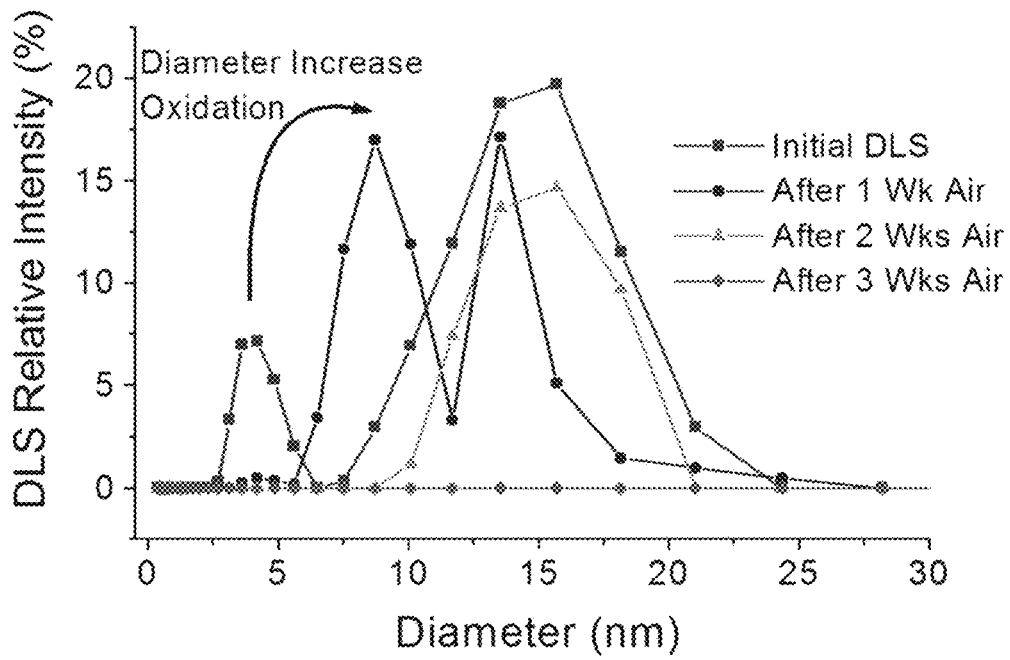
Figure 24C:
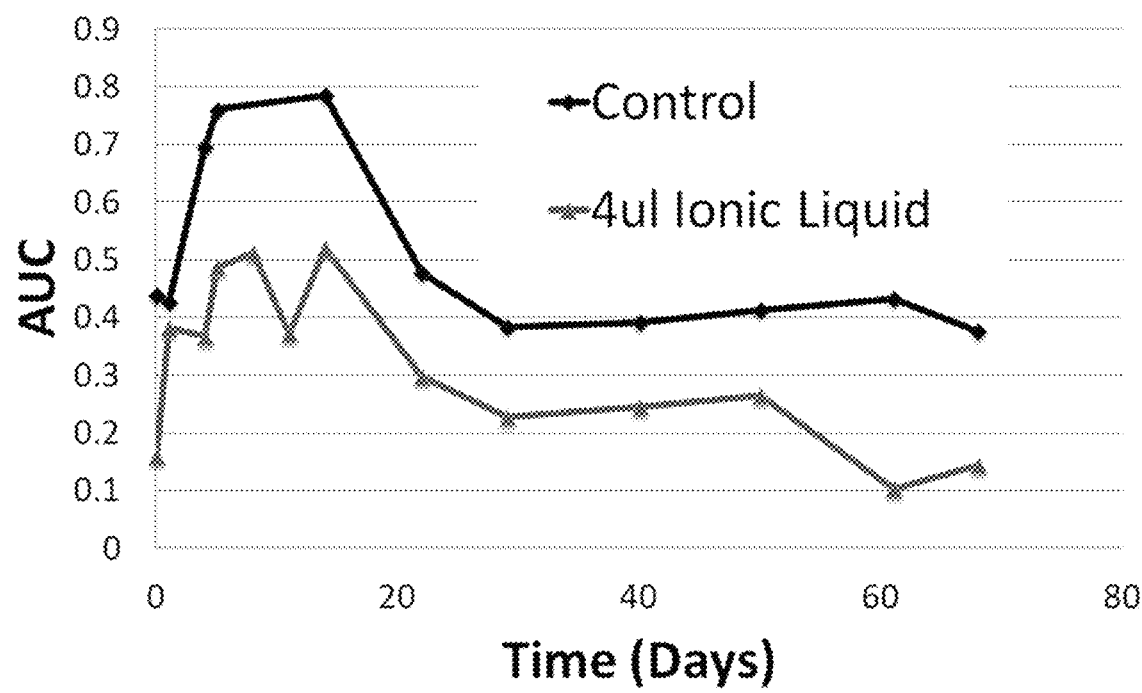
FIG. 24C provides data showing the reduction in oxidation achieved by including ionic liquid in nanoparticle synthesis.

These changes provide the ability to produce CuNPs in ambient environment instead of nitrogen. Results showing the reduction in oxidation time frames are shown in FIGS. 24A, 24B and 24C.

Example 15: pH Surface Preparation: Electrostatic Attraction

Figure 25A:
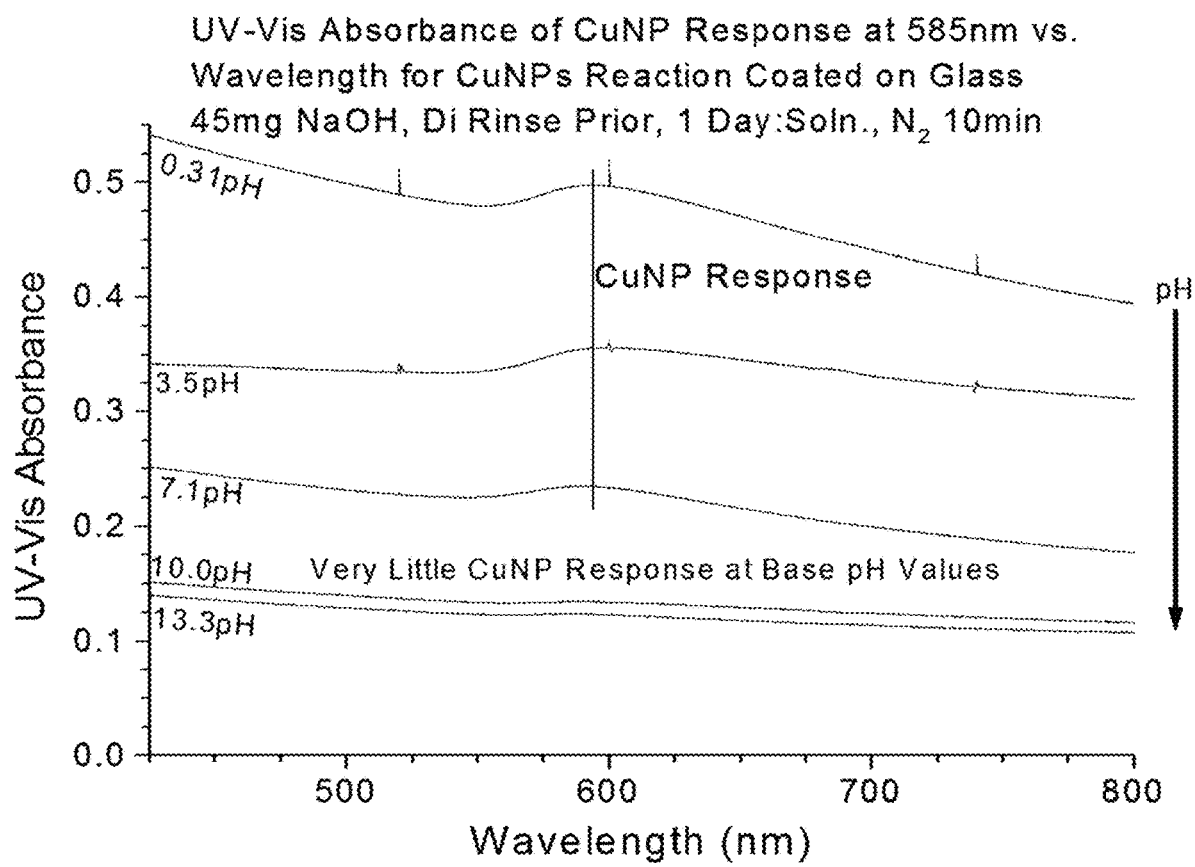
FIG. 25A provides absorbance of nanoparticle response data for various glass surface pH treatments.
Figure 25B:
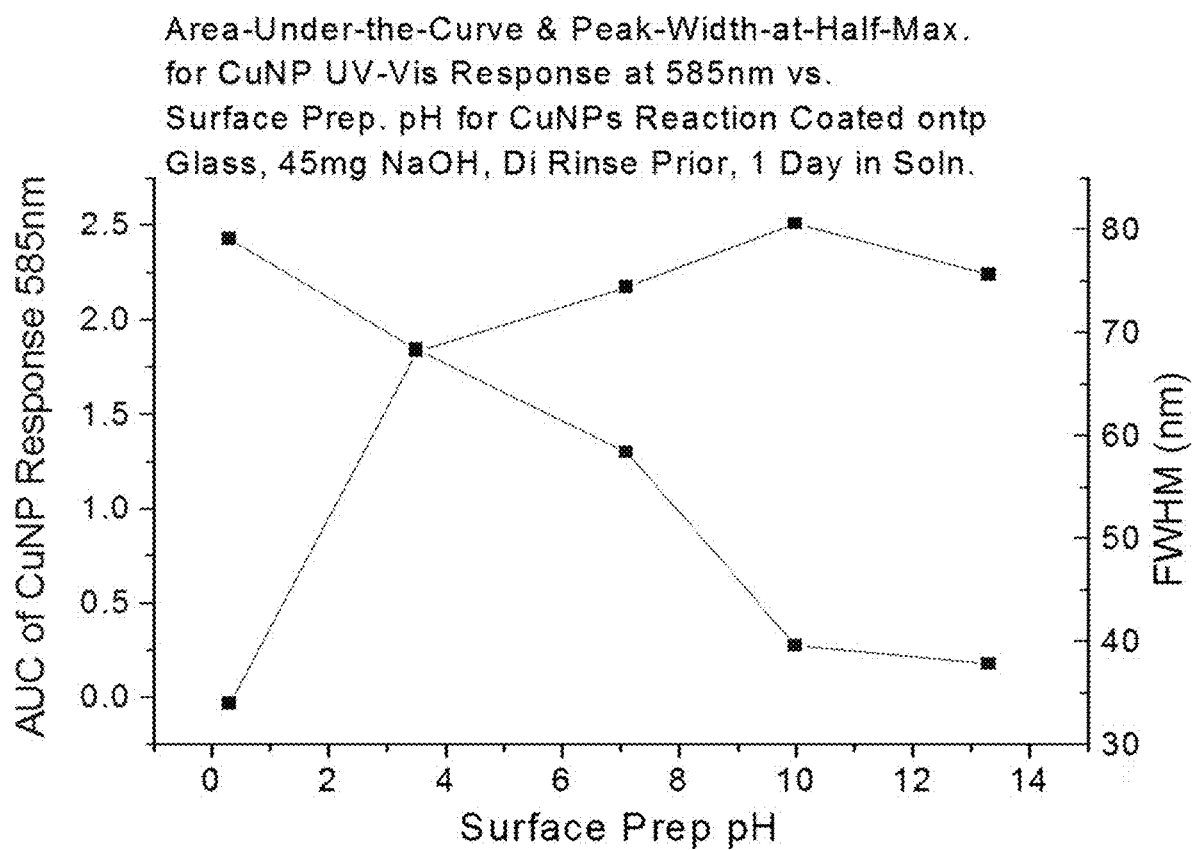
FIG. 25B provides analyses of the data from FIG. 25A.

Experiments were performed to show the electrostatic attraction of particles to substrate. 5 glass samples were exposed to solutions of varying pH for 1 day. The samples were then rinsed with deionized water and reaction coated with CuNPs as in Example 2. A UV-Vis SPR measurement was used to determine the presence of nanophase copper (FIGS. 25A and 25B). Acidic and neutral exposures show CuNP response while the basic cases show much less, indicating that the CuNPs are attracted to a positive surface and are thus negatively charged, and that solvent adsorption to the surface does not significantly inhibit Cu NP film growth.

Figure 39:
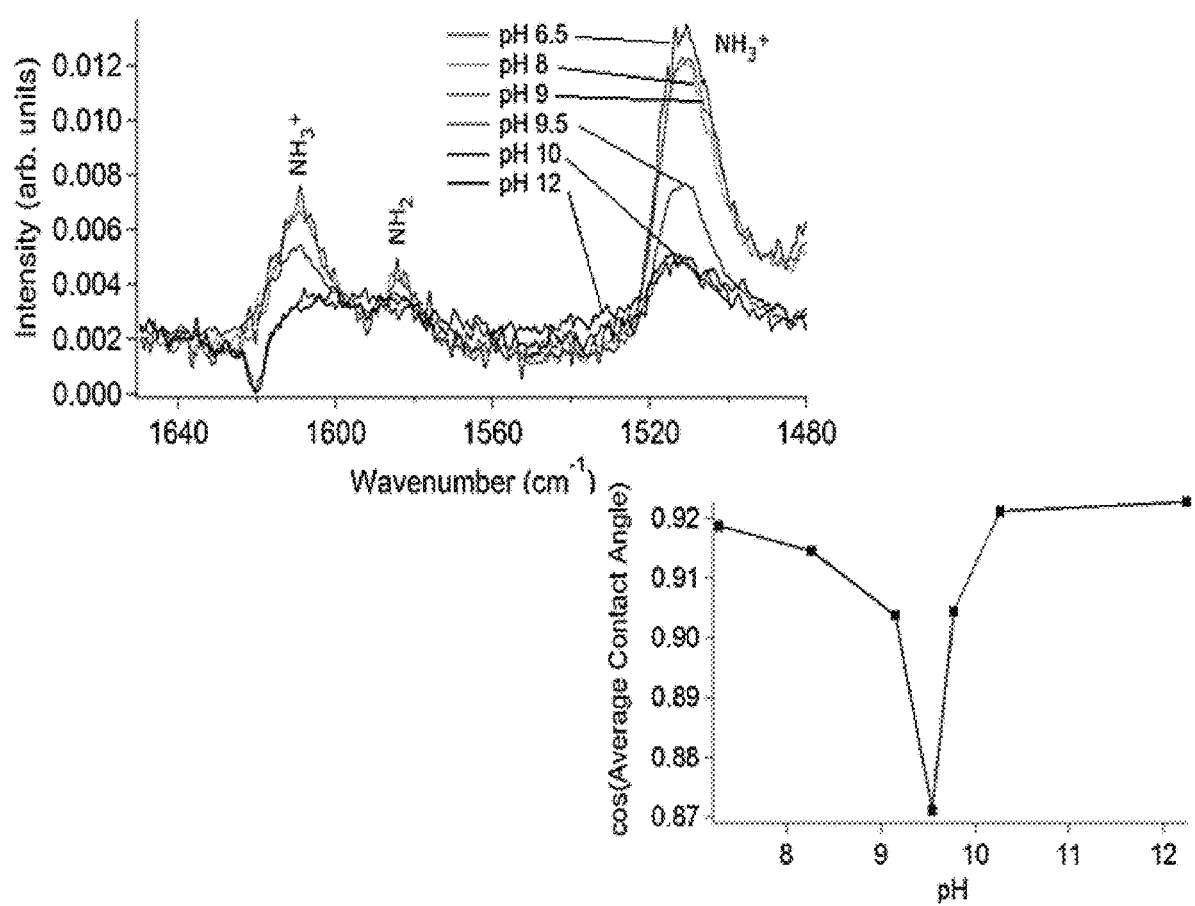
FIG. 39 provides data on the effect positive charges have on film formation based on FTIR and contact angle data.
Figure 40:
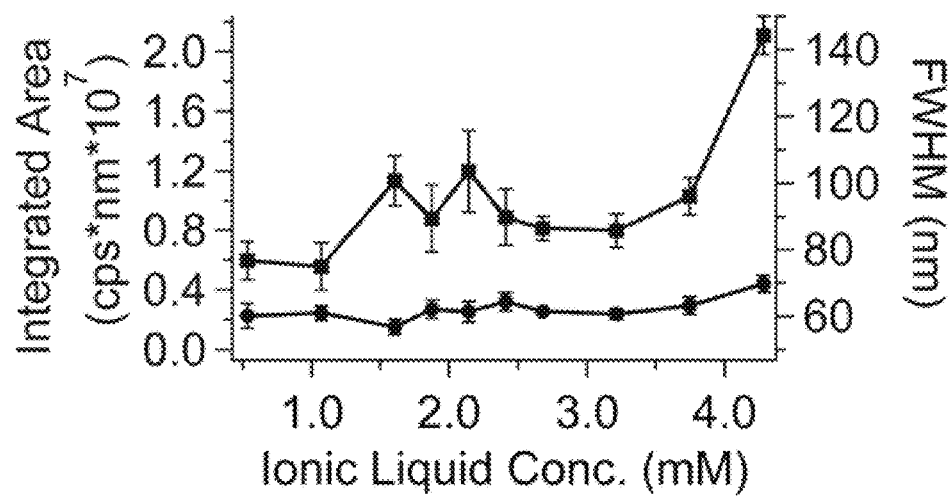
FIG. 40 provides data showing photoluminescence and FWHM in relation to concentration of the ionic liquid. The lower graphs show the photoluminescence intensity across different wavelengths for different concentrations.
Figure 40:
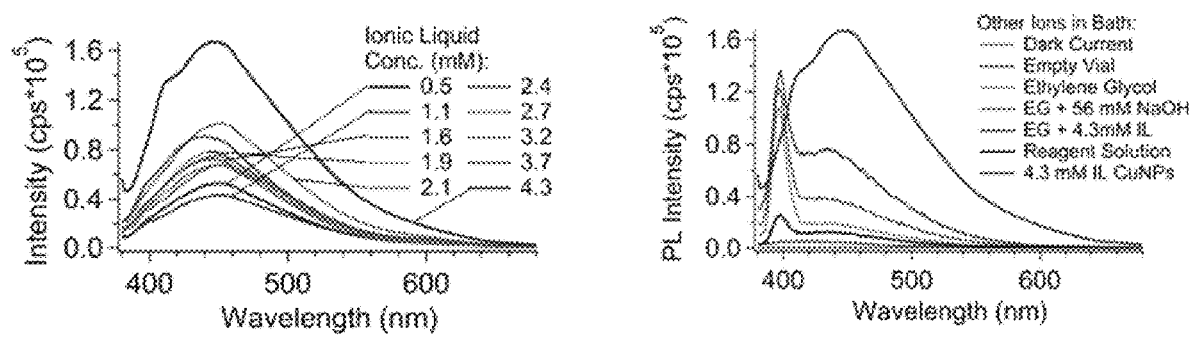

Experiments were also conducted to determine the effect of positive charges on the substrate, as determined via pH, on film formation. FIG. 39 provides infrared spectra corresponding to various pH conditions over the range of 6.5 to 12. Both plots in FIG. 39 demonstrate the the surface is positively charged from a pH of 9.75-9.4. The initial pH of the ELD reagents is 12.5, as the reaction procedes the pH drops to 9.4. The amine terminated surface is mostly negative from a pH of 12.5 to 9.75 as seen in the FTIR (multiple lines) by the lack of $NH_3+$ response at these pHs. From 9.75 onward the surface picks up a positive charge as seen in the increased $NH_3+$ response in the FTIR data. The single line graph is a compilation of contact angle measurements using a drop of glycol across the reaction pH range to demonstrate that the amino surface has a point of zero charge between pH 9.75-9.65. This is significant because it confirms the FTIR in the adjacent plot showing a switch from negative to positive charge on the amine surface as the pH is reduced past 9.75.

Example 16: Reaction Coating CuNPs on Polysaccharide

Figure 26:
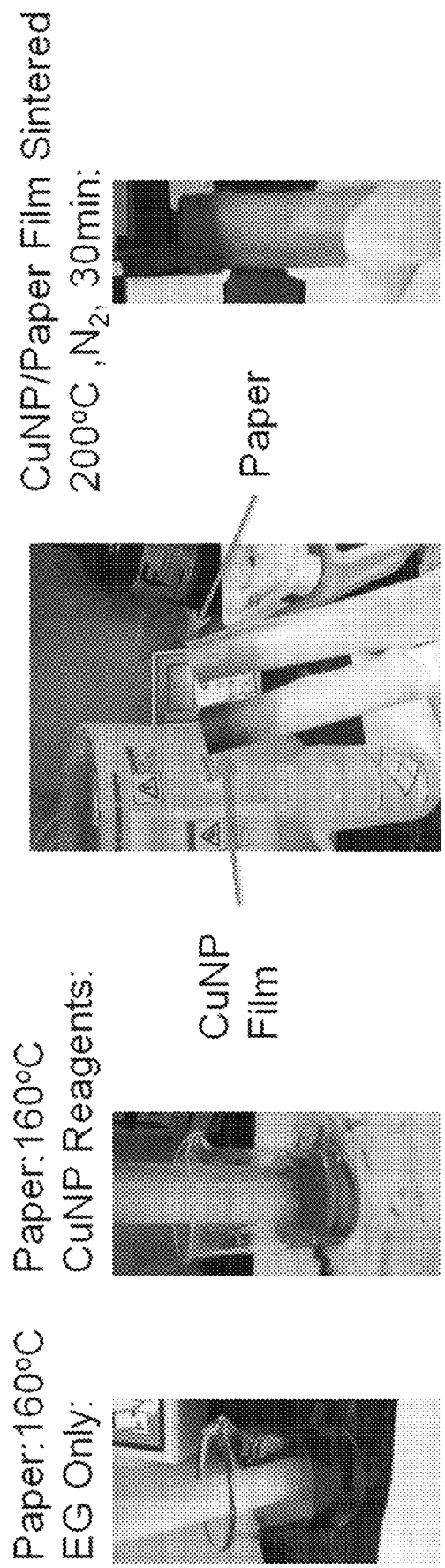
FIG. 26 provides images of a process of coating nanoparticles on paper.

A polysaccharide (i.e., copy paper) was reaction coated with CuNPs, as described above (FIG. 26). An approximately micron scale film was formed on the paper surface by exposing the paper to the copper nanoparticle reagents at 160° C. The film appeared to be uniform on the outer surface of the paper. The film was sintered at 200° C. in $N_2$ for 30 minutes and little island growth was observed upon sintering.

Example 17: Electrostatic Coating with Ligandless Copper Nanoparticles

Physical vapor deposition is currently used to deposit copper seed layers in through Si vias, but this approach is already close to its limit and may not be an option for future scaling of high performance integrated circuits. An alternative is electroless deposition (ELD) since it produces conformal, selective coatings at low temperature. ELD occurs by chemical reduction of metal ions without an externally applied potential. In the conventional approach, a metal catalyst such as Pt, Pd, or Ni is used that can be both expensive and increase the resistance of interconnect lines. Eliminating the catalyst reduces the cost and a possible source of contamination. As discussed above, previous work was done using aqueous solutions and demonstrated low sheet resistance and good film continuity, but used a complexing agent or polymer to protect the particles (Armini and Caro, J. Electrochem. Soc. 2010, 157(1), D74-D80, doi: 10.1149/1.3258026 and Inoue et al. J. Electrochem. Soc. 2012, 159(7), D437-D441, doi: 10.1149/2.070207jes).

Aspects of the present invention provide methods using a nonaqueous ELD process that uses a charge compensator, but not a ligand or complexing agent. In these embodiments, weak electrostatic attachment of the charge compensator to the ions and particles in solution and the high pH conditions improve the driving force for metal deposition. Si(100) coupons were hydroxylated using sulfuric acid-hydrogen peroxide mixture (SPM or piranha). The surface was terminated with an amine by immersion in a 4 mM solution of either (3-aminopropyl)-trimethoxysilane (APTMS) or (3-mercaptopropyl)-trimethoxysilane (MPTMS) in methanol followed by a 150° C. anneal. Metal films were deposited by suspending samples in a coating bath made by dissolving Cu(II) chloride in ethylene glycol, which also served as the reducing agent, and adding 1-butyl-3-methylimidazolium tetrafluoroborate as a charge compensator.

Figure 20A:
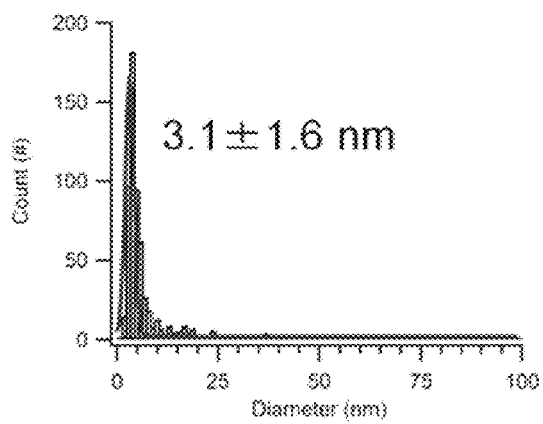
FIGS. 20A and 20B provide data showing size distribution of copper nanoparticles in a bath and deposited metal film, and FIG. 20C provides data showing the attraction of the copper core-ion shell to positively charged amine groups at high pH depositing a thin metal film.
Figure 20B:
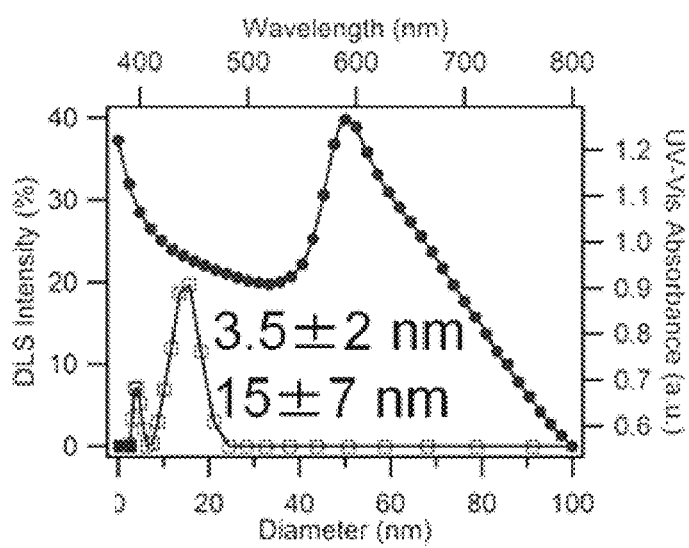
Figure 20C:
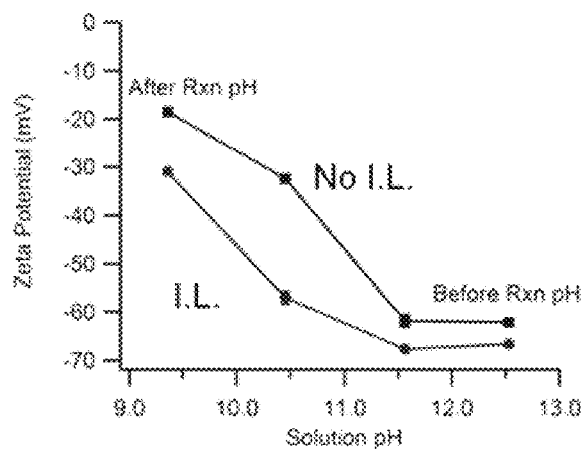

The surface plasmon resonance (SPR) peak of the copper nanoparticles in the bath and film was at 585 nm (FIG. 20B). Transmission electron microscopy (TEM) images (FIGS. 19A and 19B) and light scattering measurements and yielded a size distribution of 3.1±1.56 nm (FIGS. 20A and 20B). The Cu particle core-ion shell complex is attracted to the positively charged amine groups at high pH depositing a thin metal film that is both continuous and cohesive (FIG. 20C). FIGS. 19A and 19B shows that the film increases in conformality and decreases in thickness variance when 1 micromole/ml of the ionic liquid is added to the reagent bath prior to ELD. The film thins and conforms to the substrate as can be seen by comparing the 2 TEM cross sectional images of the the ELD film with and without ionic liquid. FIG. 20 is an compilation of graphs showing that the particles have an average diameter of 3.1 nm and that they are nanophase copper which is negatively charges across the pH range of the reaction. The zeta potential measurement in the bottom right corner of FIG. 20 shows that the addition of the ionic liquid at a concentration of 1 micromole/ml increases the negative charge of the NPs in solution across the entire pH range of the reaction when compared to the control without ionic liquid.

Figure 27:
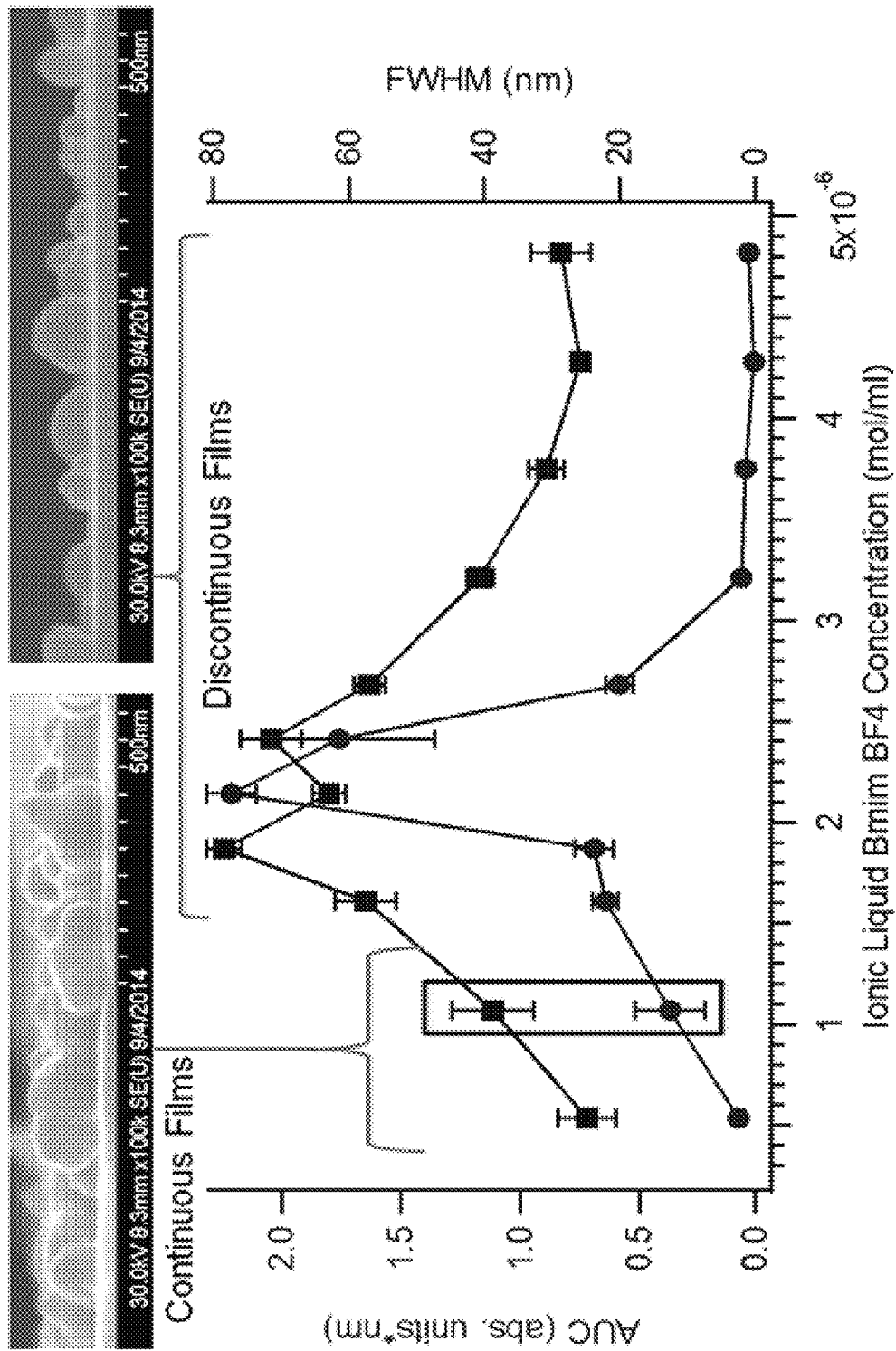
FIG. 27 provides SEM images showing film continuity at concentrations of ionic liquid of about 1 µmol/ml and film discontinuities at concentrations above 2 µmol/ml. The plot shows that Cu SPR peak area and FWHM as a function of the concentration of ionic liquid.
Figure 28:
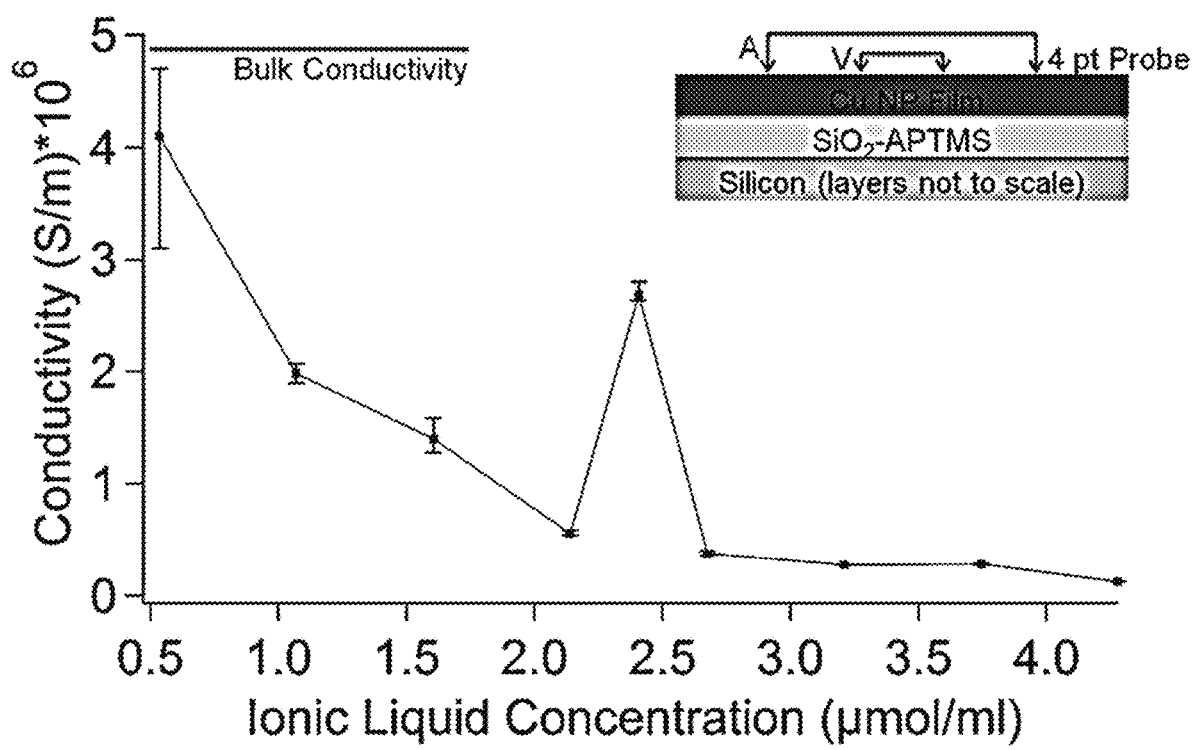
FIG. 28 provides data showing electrical conductivity in relation to concentration of the ionic liquid.

In methods where an ionic liquid is utilized, the concentration of the ionic liquid can influence the density of the particles and the continuity of the film. For example, FIG. 27 provides SEM images and data for one experiment where an ionic liquid concentration of approximately 1 mol/ml and less produced a higher particle density. Moreover, FIG. 28 provides data showing that electrical conductivity of the films generally decreased as the concentration of the ionic liquid increased. FIG. 27 shows that the absorbance of the color green (585 nm) increases at an ionic liquid concentration of 2-2.75 micromole/ml. Also shown is that the initial short time (15 s) deposition of the film is discontinuous past 1 micromole/ml ionic liquid, longer deposition times are required to grow a continuous ELD film at these concentrations FIG. 28 shows that the electrical conductivity of the resultant films ranges from 80% that of bulk copper in the case of 0.5 micromole/ml ionic liquid to 10% that of bulk for 3-4 micromole/ml ionic liquid concentrations. This is an updated graph and should replace FIGS. 13A and 14A as they give a lower conductivity than the current results for this process.

Example 18: Three Dimensional SEM Images of Trench Coatings

Samples having trenches or three dimensional morphologies were prepared for coating with nanoparticle films using a similar method to the above coating procedures.

Figure 29:
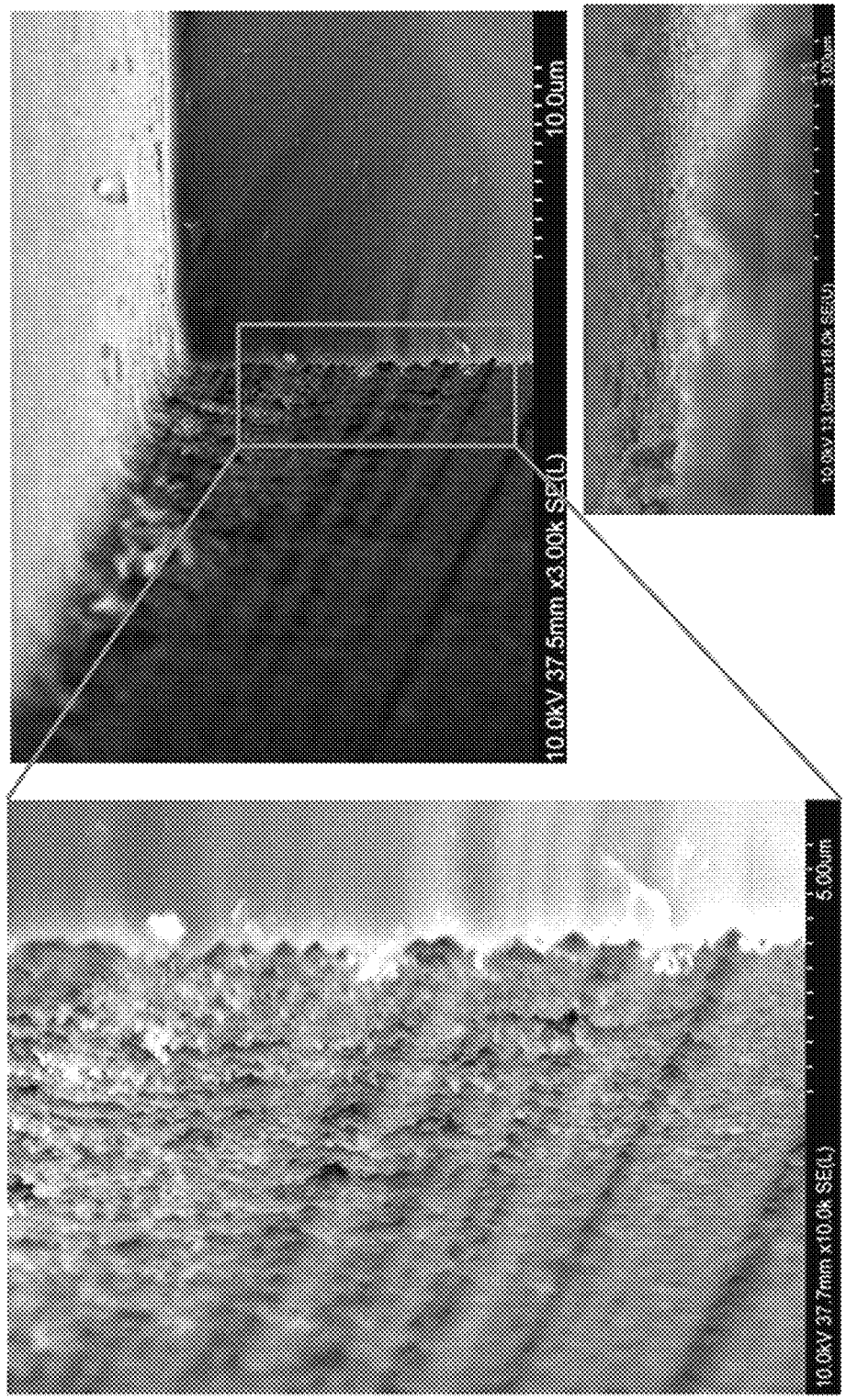
FIGS. 29 and 30 provide SEM images showing continuous films deposited in trenches of a substrate using methods of the present invention.
Figure 30:
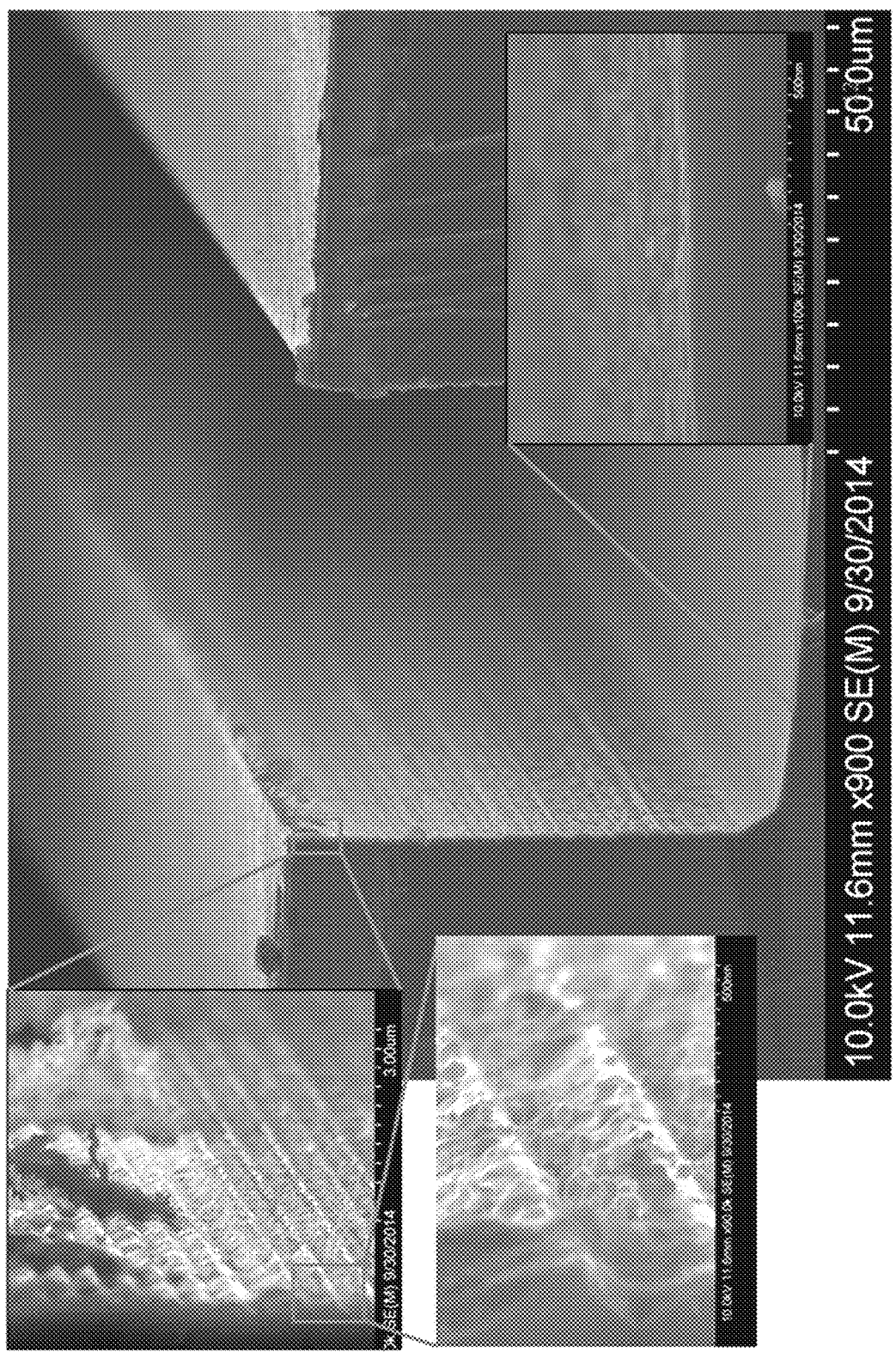
Figure 31:
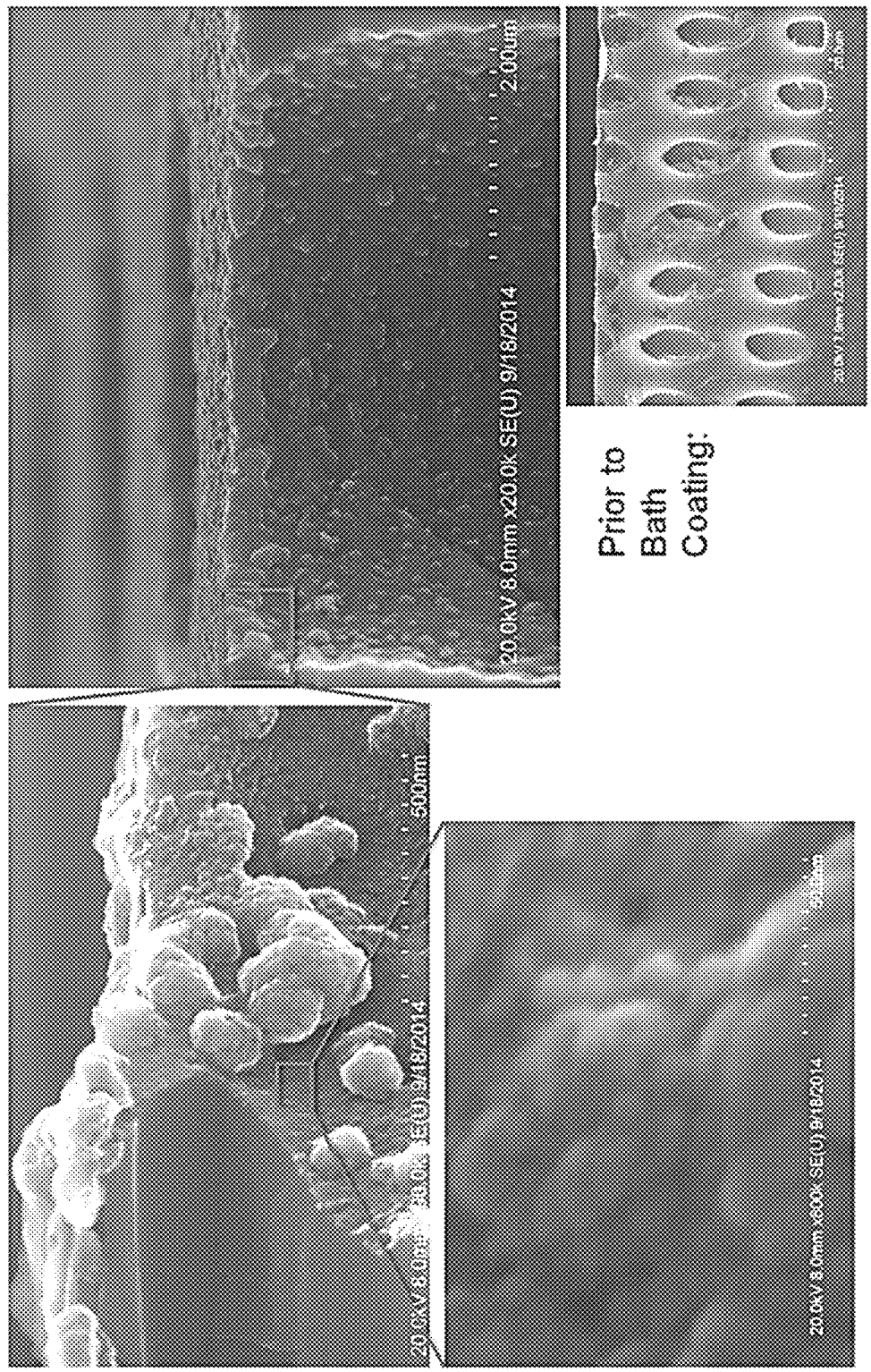
FIG. 31 provides SEM images showing the surface of a film deposited using the present methods. Pinholes observable in the surface prior to application of the bath coating are not observable after the bath coating.
Figure 32:
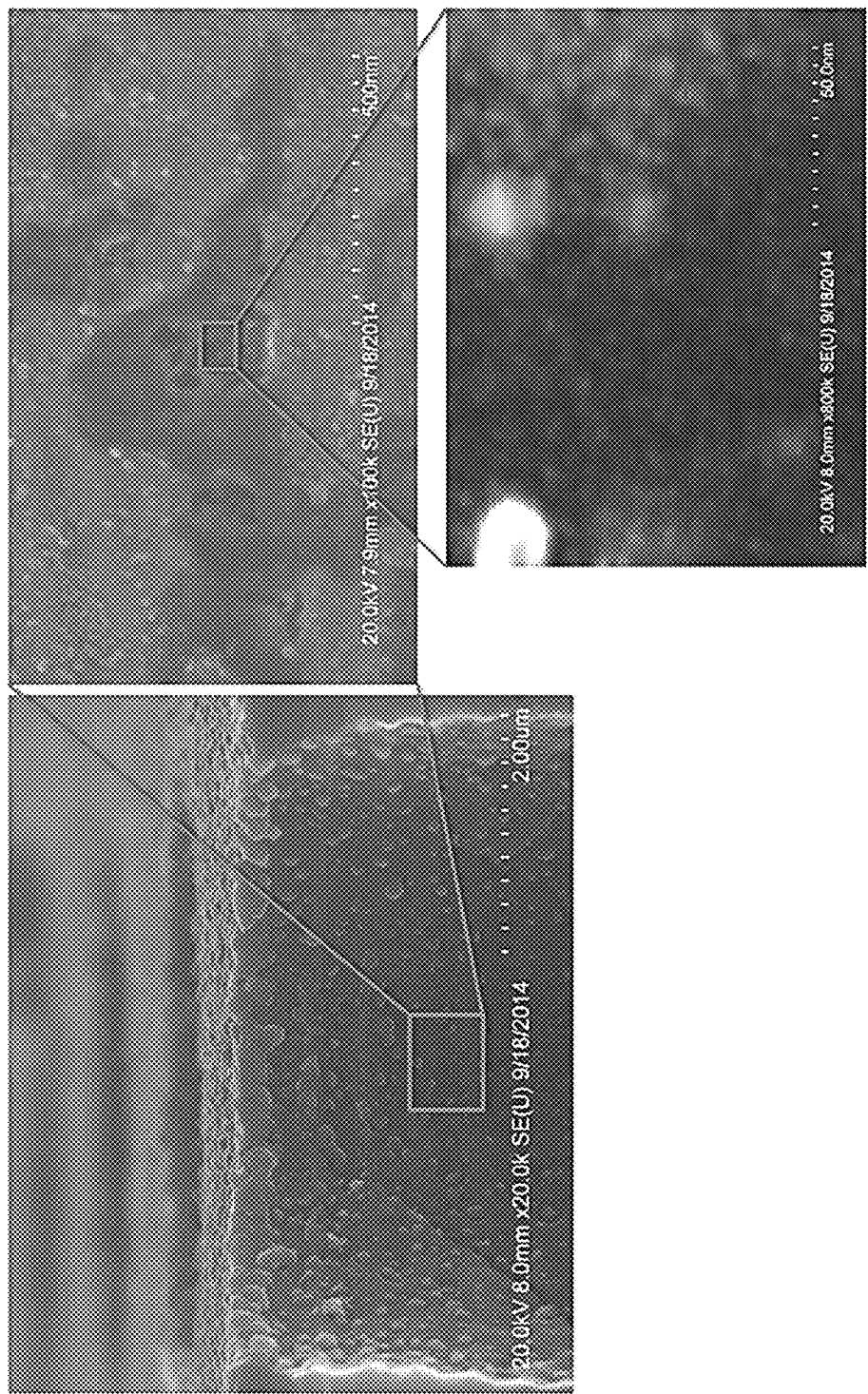
FIG. 32 provides SEM images showing deposition of a film on a surface area of a substrate with a carbon material on the surface from the previous step used to create the feature.
Figure 33:
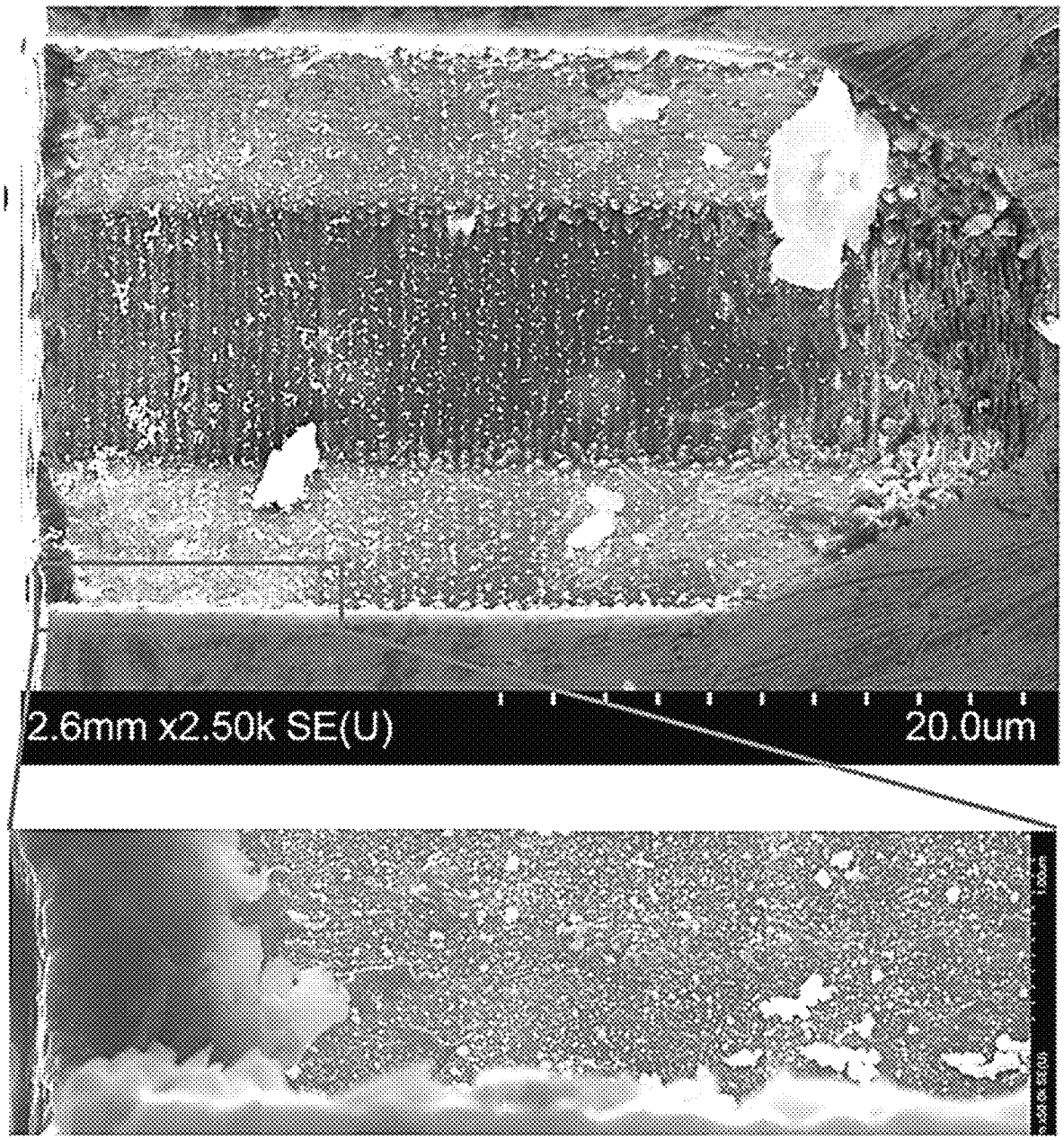
FIGS. 33 and 34 provide SEM images showing a feature coated with a film formed on a substrate using a three dimensional bath coating of the present methods. The feature was formed using photolithography and plasma etching, which leaves a carbon residue (fluoropolymer) on the surface. The copper coating is continuous near the opening (left) where the carbon contamination was removed but becomes discontinuous at the bottom (right) of the feature where the carbon contamination was not removed.
Figure 34:
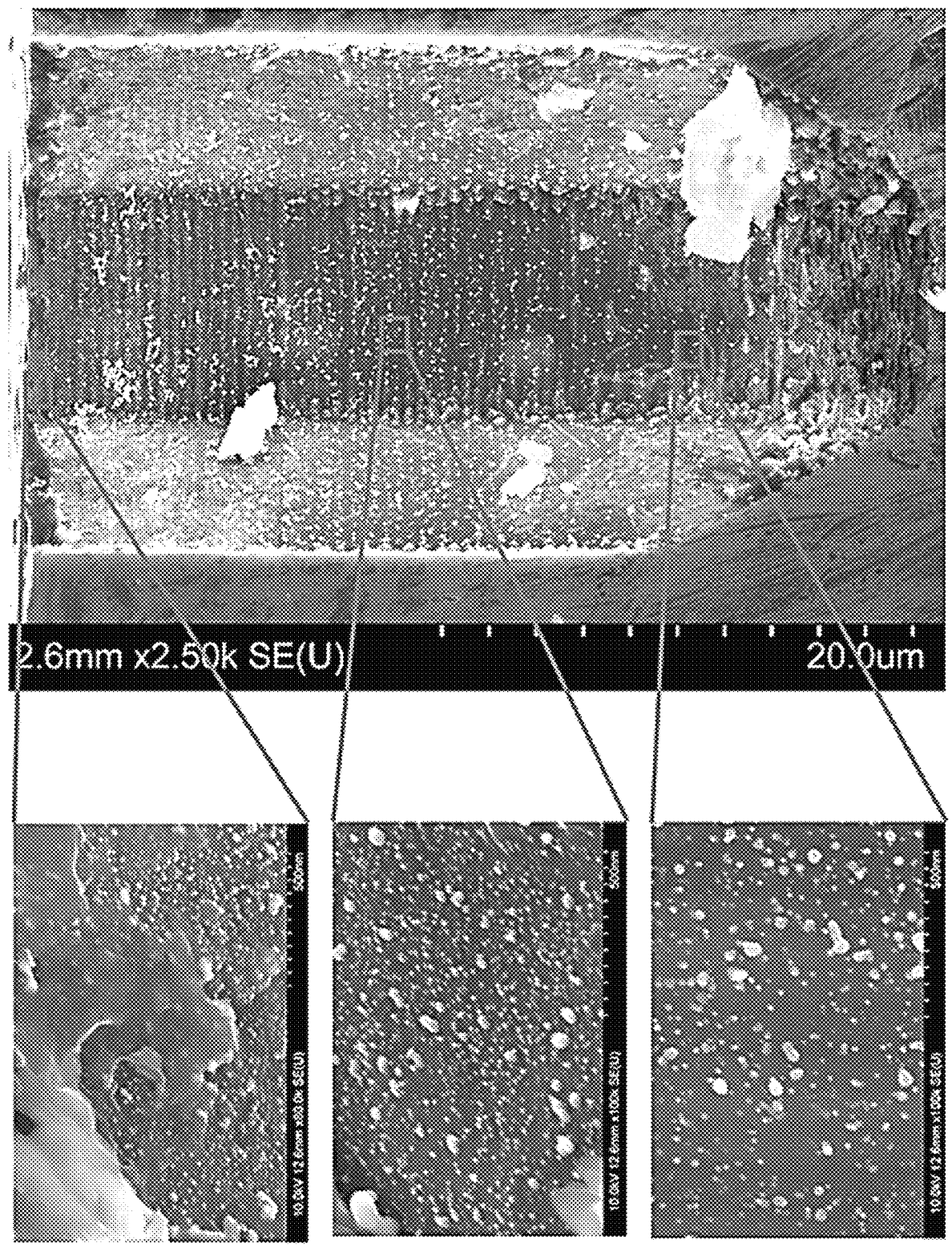

FIGS. 29-34 and 38 provide electron micrograph images of metallic films on substrates generated via the present methods illustrating the ability to generate smooth films substantially free of voids, pinholes and grains even on three dimensional surfaces. FIG. 31 shows the surface of a film deposited using the present methods, where pinholes observable in the surface prior to the deposition of the metallic film are not observable after the deposition. FIG. 32 shows a surface area of the substrate having a carbon material on this area. Because of the reduced charge available at this area due to the presence of the carbon material, a lower density of particles were deposited. FIGS. 33 and 34 provide more detailed images of the pores of the resulting film. ELD on both tranches and pores/holes has is demonstrated in FIGS. 29-34. FIGS. 29 and 30 show continuous ELD film growth in a trench that measures 50 um deep and wide. FIGS. 31 and 32 show that in a hole there is continuous ELD deposition up to 3 microns deep into the hole. FIGS. 33 and 34 show that the ELD process can de driven into holes via sonication (the white dots are Cu NP agglomerates). FIGS. 33 and 34 show also that the fluoropolymer contamination in the holes is impeding the ELD process and may need to be removed as they don't show a continuous ELD film. All of these FIGS. 29-34) show that the ELD process applies to the creation of 3D ELD films.

Example 19: Effects of Ionic Liquid Concentration

The effects of varying ionic liquid concentration on the optical properties and electrical properties, as well as the morphology, of the nanoparticle films were analyzed. Optimizing the ionic liquid concentration when forming the nanoparticle films resulted in thin blanket nanoparticle films with smooth layers. Moreover, utilizing ionic liquid concentrations in the range of approximately 2.0 mM to 2.5 mM resulted in nanoparticle films having increased light absorbance, photoluminescence, conductivity and improved interparticle interactions.

FIGS. 27, 28, 40 and 47 show absorbance, photoluminescence and electrical conductivity in relation to different ionic liquid concentrations. As can be seen in these figures, there is an increase in each of these properties at approximately 2 mM to 2.5 mM.

Figure 41:
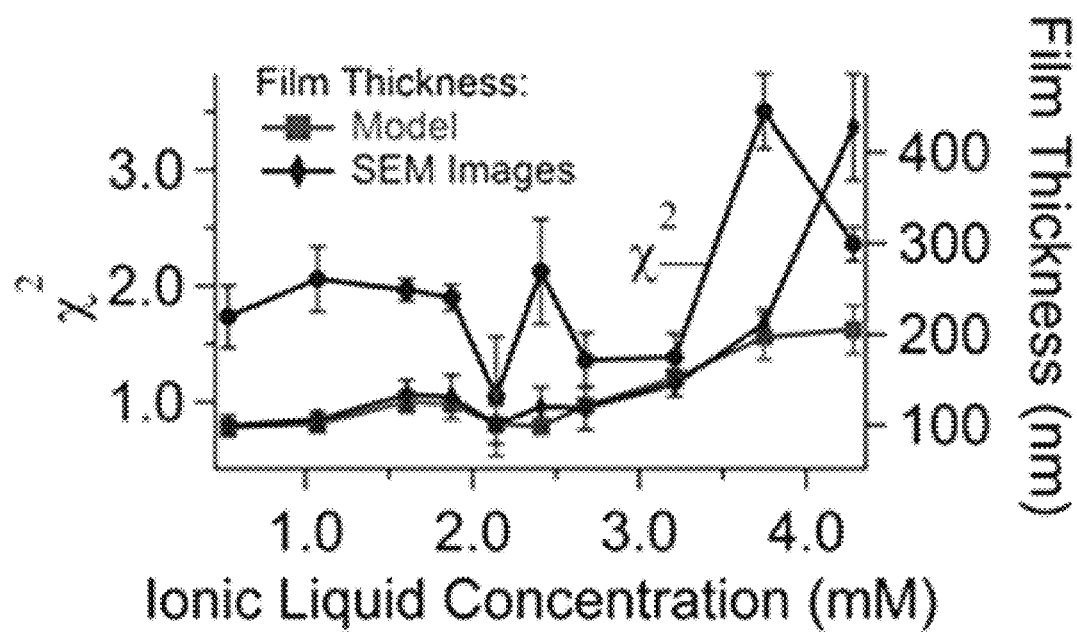
FIG. 41 shows results from ellipsometry models used to analyze a copper nanoparticle film (e.g., Woolam's copper Palik layer, Infrared: Lorentz; Visible: Tauc-Lorentz; Ultra Violet: Tauc-Lorentz; Ultra Violet: Gauss). The copper nanoparticle film is illustrated in the top graph. Film thickness data in relation to ionic liquid concentration is provided in the lower graph.
Figure 42:
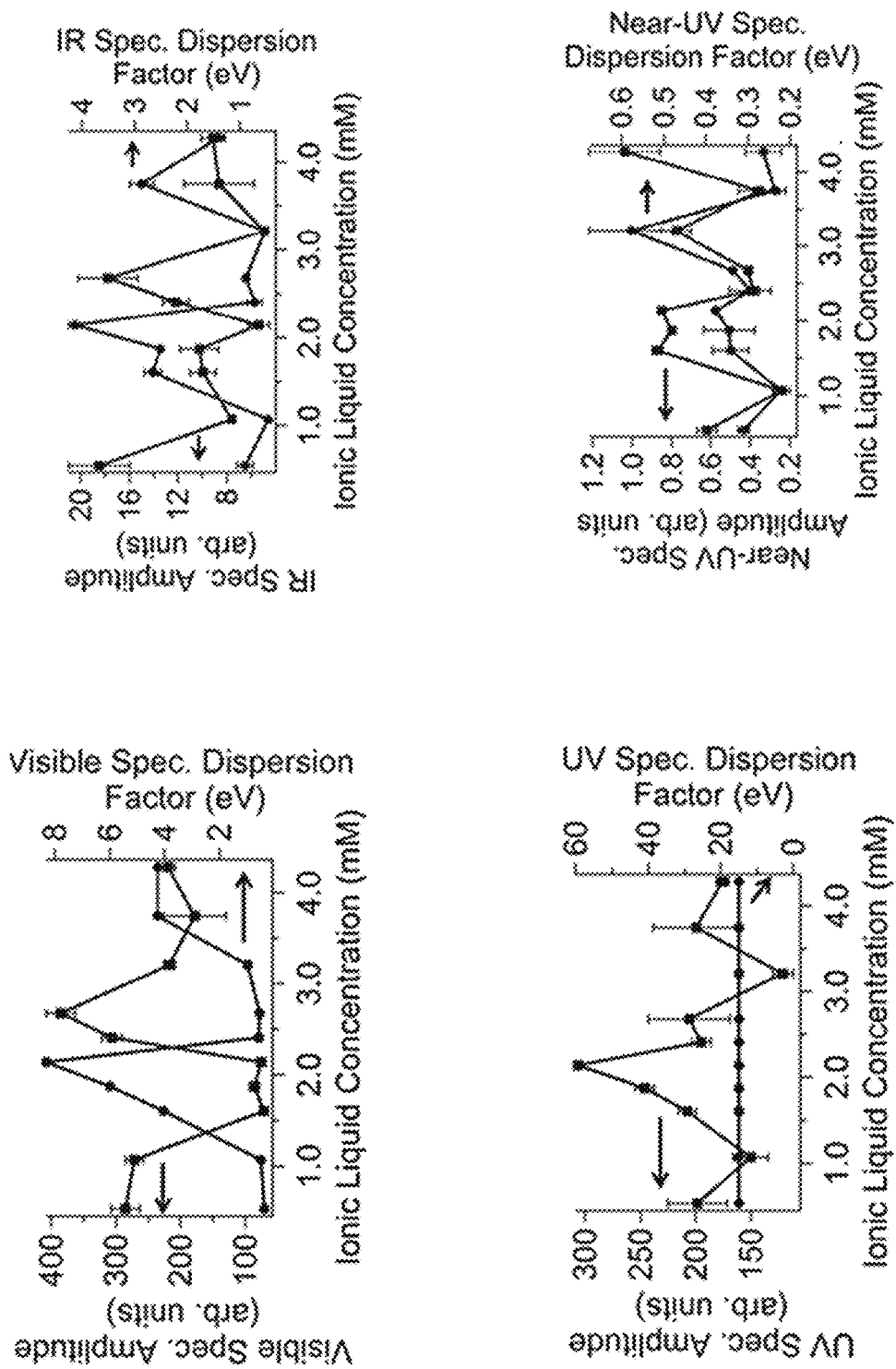
FIG. 42 provides ellipsometry data for a nanoparticle film including data for infrared, visible, near ultra-violet, and ultra-violet light absorption and dispersion data in relation to ionic liquid concentration.
Figure 46:
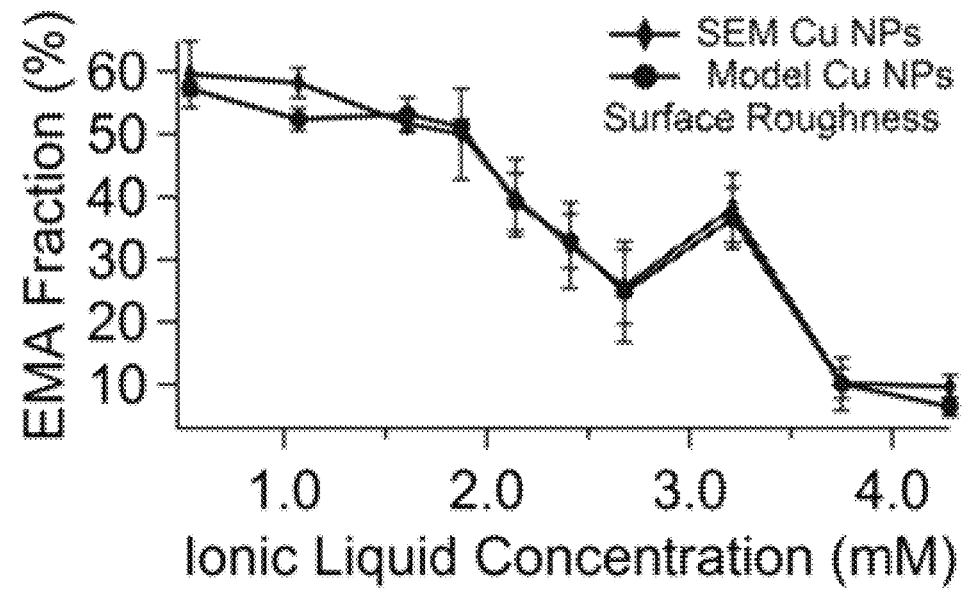
FIG. 46 provides data for EMA fractions and depolarization of a copper nanoparticle film in relation to ionic liquid concentration.
Figure 46:
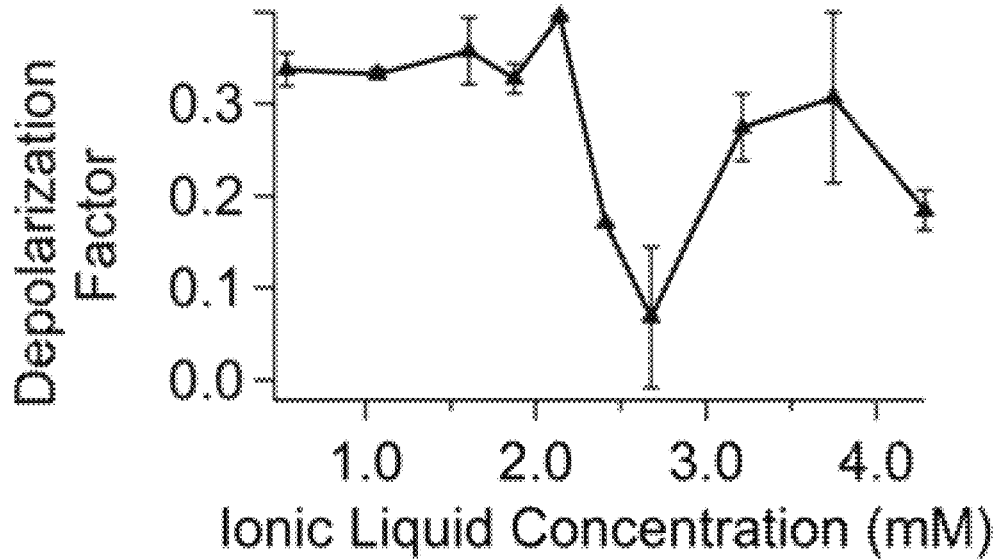
Figure 47:
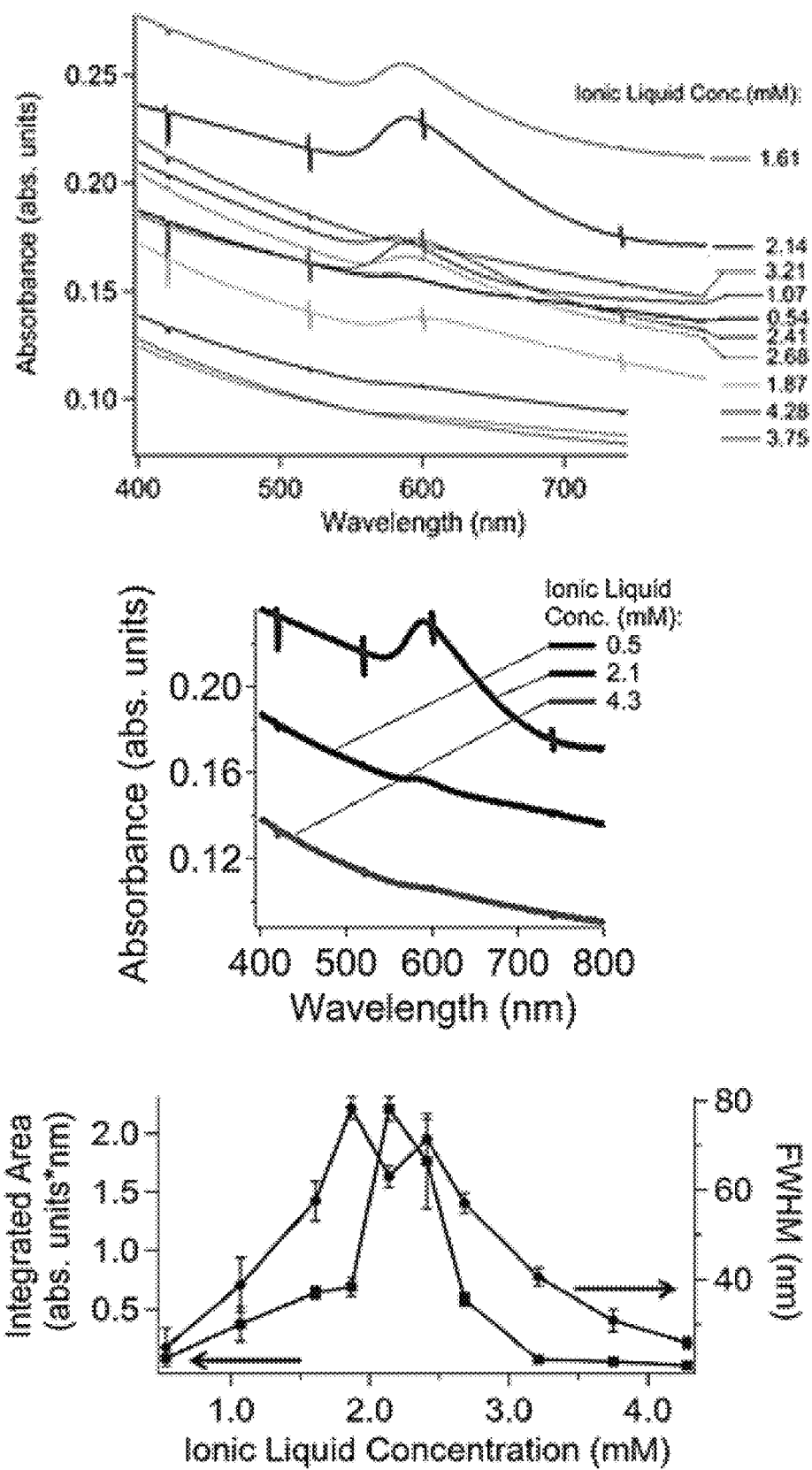
FIG. 47 provides data for absorbance of ultra-violet and visible light by a nanoparticle film in relation to ionic liquid concentration. The center graph is a close up of the top graph showing only concentrations of 0.5 mM, 2.1 mM, and 4.3 mM. There is an increase in absorbance 2.1 mM to 2.4 mM ionic liquid concentration.

Copper nanoparticle films were further analyzed using ellipsometry (see FIG. 41) and imaged using scanning electron microscopy (SEM) and transmission electron microscopy (TEM). These experiments indicated that ionic liquid concentrations from 2.1 mM to 2.5 mM resulted in polydiverse nanoparticle films having improved particle interactions, bulk like behavior and ultra-violet intensity (see FIGS. 41, 42 and 46). Ellipsometry mode parameters are provided below in Table 1.

TABLE 1

| Ellipsometry Model Parameters | | | | | |
|---|---|---|---|---|---|
| IL Conc. (mM) | MSE | Film Thickness (Å) | Cu NP (%) | Void (%) | Depolarization (0-1) |
| 0.54 | 1.74 ± 0.27 | 978.36 ± 38.13 | 57.26 ± 1.13 | 42.74 ± 1.13 | 0.34 ± 0.02 |
| 1.07 | 2.06 ± 0.28 | 1012.58 ± 95.41 | 52.36 ± 1.75 | 47.64 ± 1.75 | 0.33 ± 0.01 |
| 1.61 | 1.97 ± 0.1 | 1257.68 ± 119.92 | 53.19 ± 2.62 | 46.81 ± 2.62 | 0.30 ± 0.04 |
| 1.87 | 1.90 ± 0.11 | 1231.8 ± 56.72 | 51.14 ± 1.2 | 48.86 ± 1.20 | 0.33 ± 0.02 |
| 2.14 | 1.05 ± 0.52 | 1014.25 ± 356.24 | 39.19 ± 4.56 | 60.81 ± 4.56 | 0.39 ± 0.00 |
| 2.41 | 2.13 ± 0.45 | 990.38 ± 92.19 | 32.96 ± 4.31 | 65.08 ± 2.67 | 0.17 ± 0.00 |
| 2.68 | 1.36 ± 0.24 | 1216.68 ± 41.04 | 24.81 ± 8.08 | 75.19 ± 8.08 | 0.07 ± 0.00 |
| 3.21 | 1.39 ± 0.21 | 1517.63 ± 105.15 | 36.59 ± 4.85 | 63.41 ± 4.84 | 0.27 ± 0.04 |
| 3.75 | 3.50 ± 0.32 | 1960.23 ± 246.71 | 10.08 ± 4.18 | 89.92 ± 4.18 | 0.31 ± 0.09 |
| 4.28 | 2.36 ± 0.15 | 2050.45 ± 265.8 | 6.44 ± 1.47 | 93.56 ± 1.47 | 0.18 ± 0.02 |

| IL Conc. (mM) | Red Spec. Amplitude (arb. units) | Lorentz Energy (eV) | Broadness (eV) | Green Spec. Amplitude (arb. units) | Tauc-Lorentz Energy (eV) | Broadness (eV) | Transition Energy (eV) |
|---|---|---|---|---|---|---|---|
| 0.54 | 18.47 ± 2.5 | 1.66 ± 0.06 | 0.9 ± 0.15 | 285.69 ± 22.56 | 2.11 ± 0.00 | 0.37 ± 0.03 | 2.09 ± 0.00 |
| 1.07 | 7.61 ± 0.27 | 1.67 ± 0.03 | 0.46 ± 0.01 | 271.71 ± 13.64 | 2.02 ± 0.04 | 0.5 ± 0.04 | 2.09 ± 0.01 |
| 1.61 | 9.95 ± 1.96 | 2.13 ± 0.12 | 2.66 ± 0.17 | 71.33 ± 2.31 | 2.01 ± 0.00 | 4.04 ± 0.00 | 2.05 ± 0.11 |
| 1.87 | 10.26 ± 1.57 | 2.00 ± 0.08 | 2.51 ± 0.03 | 85.81 ± 7.71 | 2.01 ± 0.00 | 6.00 ± 0.00 | 1.91 ± 0.00 |
| 2.14 | 5.41 ± 0.86 | 1.70 ± 0 | 4.13 ± 0.12 | 75.26 ± 1.06 | 1.98 ± 0.00 | 8.31 ± 0.00 | 2.09 ± 0.00 |
| 2.41 | 12.16 ± 1.08 | 1.81 ± 0 | 0.72 ± 0.14 | 306.82 ± 15.5 | 2.06 ± 0.00 | 0.57 ± 0.07 | 2.09 ± 0.00 |
| 2.68 | 17.76 ± 2.43 | 1.77 ± 0.02 | 0.89 ± 0.06 | 385.29 ± 22.23 | 2.06 ± 0.00 | 0.54 ± 0.05 | 2.09 ± 0.00 |
| 3.21 | 4.93 ± 0.28 | 2.07 ± 0.01 | 0.53 ± 0.02 | 216.74 ± 8.52 | 1.98 ± 0.00 | 0.97 ± 0.08 | 2.09 ± 0.00 |
| 3.75 | 8.63 ± 2.88 | 1.80 ± 0.1 | 2.87 ± 0.23 | 178.02 ± 48.38 | 1.98 ± 0.00 | 4.26 ± 0.00 | 2.09 ± 0.00 |
| 4.28 | 9.14 ± 0.95 | 1.90 ± 0.03 | 1.39 ± 0.11 | 219.24 ± 11.36 | 1.93 ± 0.00 | 4.26 ± 0.00 | 2.09 ± 0.00 |

| IL Conc. (mM) | Violet Spec. Amplitude (arb. units) | Gauss Energy (eV) | Broadness (eV) | UV Spec. Amplitude (arb. units) | Tauc-Lorentz Energy (eV) | Broadness (eV) | Transition Energy (eV) |
|---|---|---|---|---|---|---|---|
| 0.54 | 0.62 ± 0.05 | 3.54 ± 0.04 | 0.31 ± 0.01 | 198.38 ± 26.91 | 2.27 ± 0.05 | 15 ± 0.00 | 2.2 ± 0.05 |
| 1.07 | 0.24 ± 0.04 | 3.52 ± 0.03 | 0.22 ± 0.02 | 150.39 ± 15.79 | 2.47 ± 0.09 | 15 ± 0.00 | 2.46 ± 0.03 |
| 1.61 | 0.87 ± 0.03 | 3.5 ± 0.03 | 0.34 ± 0.04 | 207.81 ± 8.24 | 3.53 ± 0.11 | 15 ± 0.00 | 3.39 ± 0.00 |
| 1.87 | 0.8 ± 0.01 | 3.55 ± 0.03 | 0.34 ± 0.06 | 246.25 ± 8.62 | 3.67 ± 0.14 | 15 ± 0.00 | 3.75 ± 0.00 |
| 2.14 | 0.85 ± 0.00 | 3.55 ± 0.00 | 0.38 ± 0.01 | 306.49 ± 1.93 | 3.75 ± 0.00 | 15 ± 0.00 | 3.75 ± 0.00 |
| 2.41 | 0.39 ± 0.03 | 3.55 ± 0.03 | 0.3 ± 0.05 | 194.97 ± 8.75 | 2.51 ± 0.02 | 15 ± 0.00 | 3.25 ± 0.00 |
| 2.68 | 0.41 ± 0.02 | 3.54 ± 0.00 | 0.34 ± 0.00 | 205.86 ± 37.05 | 2.38 ± 0.05 | 15 ± 0.00 | 3.25 ± 0.00 |
| 3.21 | 0.78 ± 0.08 | 3.5 ± 0.00 | 0.58 ± 0.1 | 121.3 ± 9.38 | 3.05 ± 0.00 | 15 ± 0.00 | 3.05 ± 0.00 |

TABLE 1-continued

| | | | Ellipsometry Model Parameters | | | | |
|---|---|---|---|---|---|---|---|
| 3.75 | 0.35 ± 0.10 | 3.56 ± 0.00 | 0.24 ± 0.03 | 199.63 ± 38.94 | 3.44 ± 0.4 | 15 ± 0.00 | 3.77 ± 0.00 |
| 4.28 | 1.04 ± 0.18 | 3.53 ± 0.03 | 0.26 ± 0.04 | 175.77 ± 5.66 | 3.18 ± 0.16 | 15 ± 0.00 | 3.77 ± 0.00 |

Figure 43:
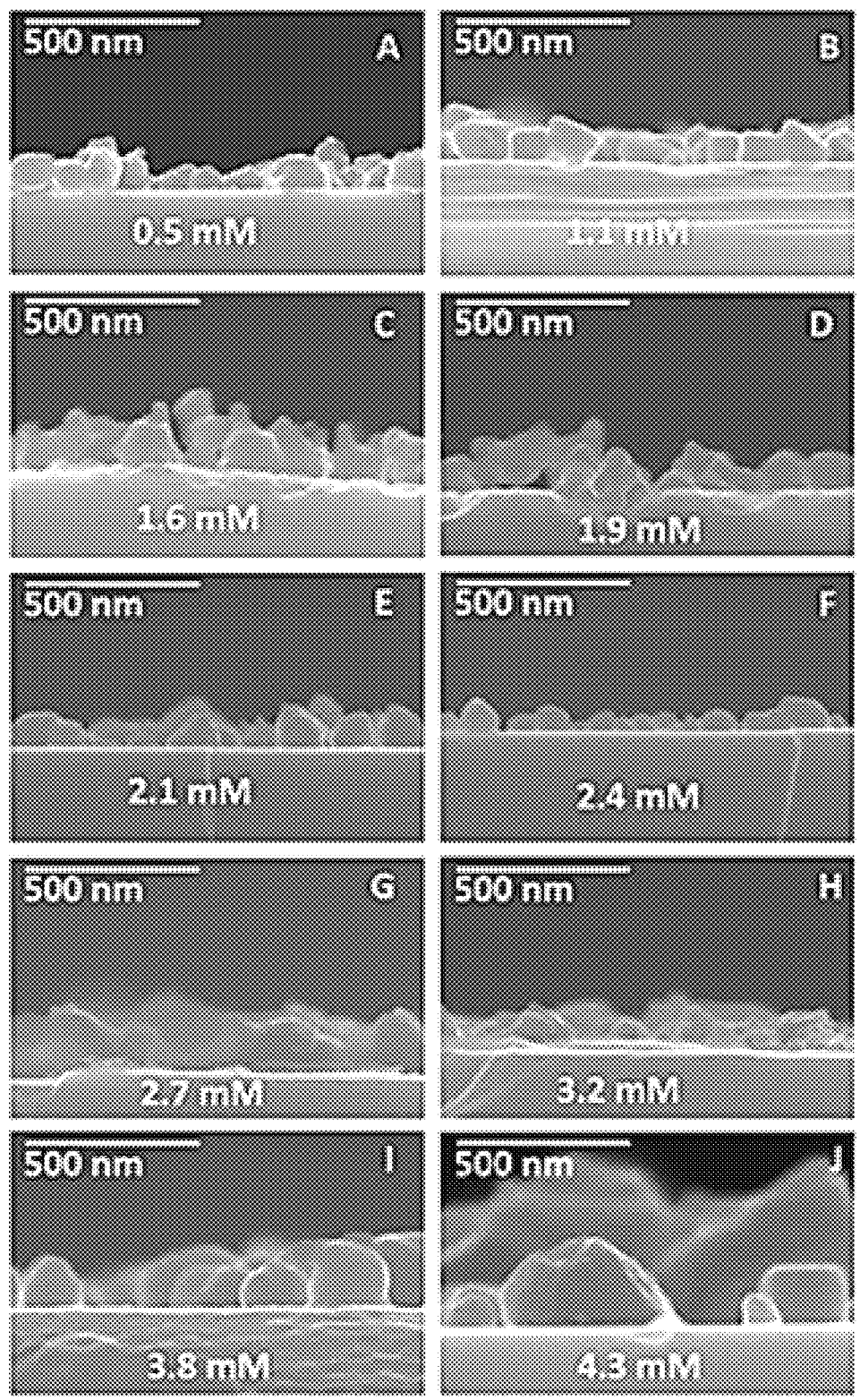
FIG. 43 provides SEM cross-section images for nanoparticle films for different ionic liquid concentrations.
Figure 44:
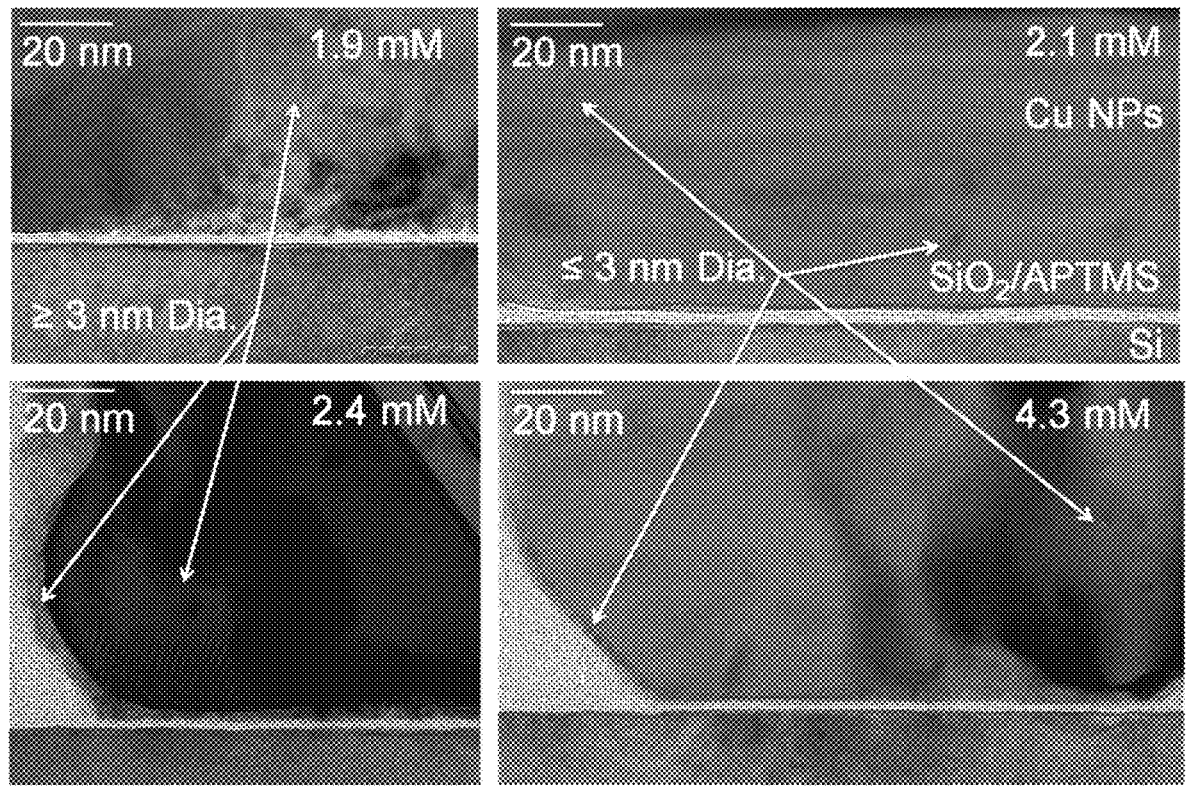
FIG. 44 provides TEM cross-section images for nanoparticles formed using ionic liquid concentrations ranging from 1.9 mM to 4.3 mM.
Figure 45:
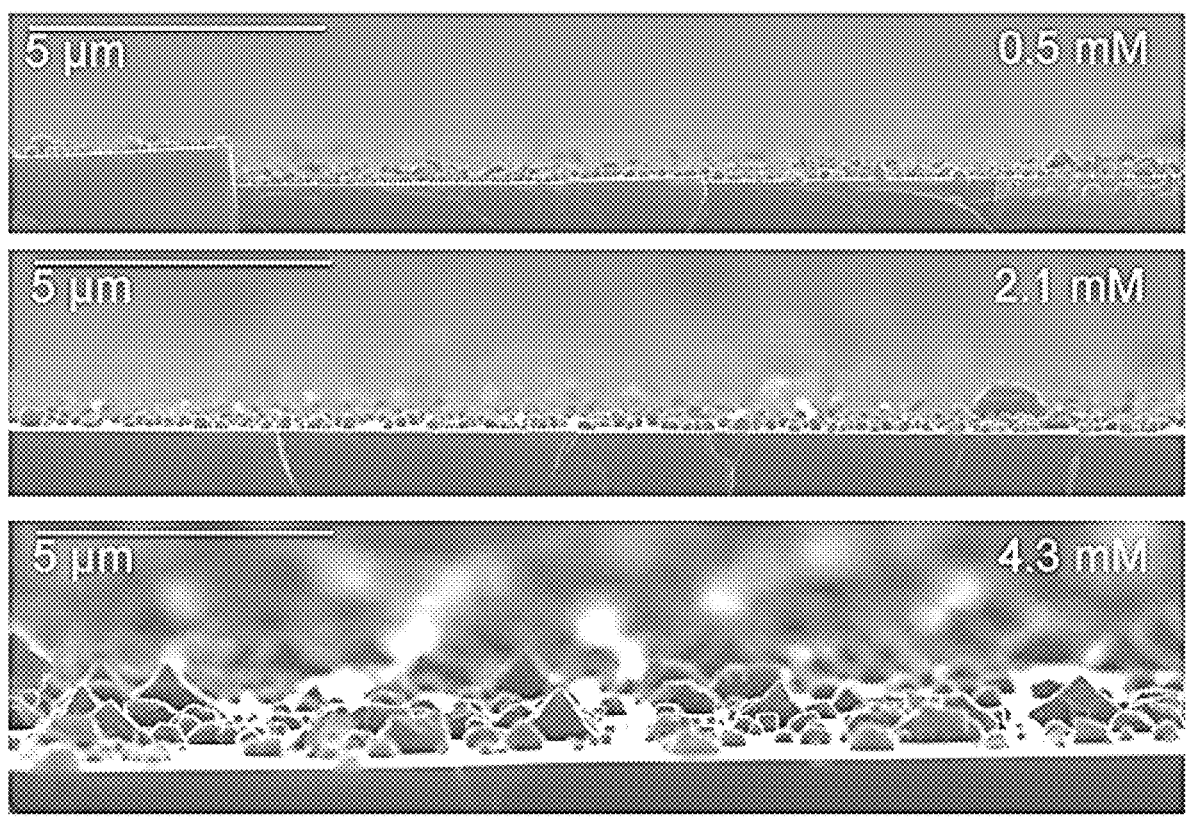
FIG. 45 provides SEM cross-section images of a nanoparticle film showing void sizes within the film in relation to ionic liquid concentration.

SEM and TEM images further show smoother layers with ionic liquid concentrations between 2.1 mM and 2.4 mM (see FIGS. 43, 44 and 45).

Statements Regarding Incorporation by Reference and Variations

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of forming a conformal metal layer on a surface of a substrate, the method comprising steps of:
   contacting said surface with a nonaqueous solution; wherein said surface has a net positive charge; and wherein said nonaqueous solution comprises a nonaqueous polar solvent, a metal particle precursor and an ionic liquid;
   generating a plurality of metal nanoparticles in said nonaqueous solution in contact with said surface, wherein said metal nanoparticles have cross sectional dimensions less than 30 nm and are at least partially coated with a negatively charged outer layer comprising said ionic liquid or a reaction product thereof;
   depositing said metal nanoparticles onto said surface, thereby forming said conformal metal layer; and
   adjusting the ionic liquid in the nonaqueous solution during the generating step, deposition step, or both, to an ionic liquid concentration corresponding to a desired one or more optical properties, electrical properties, or morphological properties, the optical properties, electrical properties, or morphological properties including one or more of electrical conductivity, light absorbance, photoluminescence, presence and amount of voids, surface roughness, and interparticle interactions;
   wherein said ionic liquid has a concentration in said nonaqueous solution between 0 mM and 5.0 mM.

2. The method of claim 1, wherein said ionic liquid has a concentration in said nonaqueous solution between 0.5 mM and 4.5 mM.

3. The method of claim 1, wherein said ionic liquid has a concentration in said nonaqueous solution between 2.0 mM and 2.5 mM.

4. The method of claim 1, wherein the conformal metal layer has a thickness between about 20 nm to 500 nm.

5. The method of claim 1, wherein the conformal metal layer has an electrical conductivity between 0.5 S/m*$10^7$ and 3.0 S/m*$10^7$.

6. The method of claim 1, wherein the conformal metal layer has an electrical conductivity between 1.0 S/m*$10^7$ and 2.8 S/m*$10^7$.

7. The method of claim 1, wherein the conformal metal layer has a light absorbance of 0.16 AU or greater for wavelengths from 400 nm to 800 nm.

8. The method of claim 1, wherein the conformal metal layer has a light absorbance of 0.12 AU or less for wavelengths from 500 nm to 800 nm.

9. The method of claim 1, wherein said ionic liquid comprises one or more of: 1-butyl-3-methylimidazolium tetrafluoroborate ([bmim][BF$_4$]), 1-butyl-3-methylimidazolium bromide ([bmim][Br]), 1-butyl-3-methylimidazolium chloride ([bmim][Cl]), 1-butyl-3-methylimidazolium hexafluorophosphate ([bmim][PF$_6$]), 1-ethyl-3-methylimidazolium tetrafluoroborate ([emim][BF$_4$]), 1-ethyl-3-methylimidazolium nitrate ([emim][NO$_3$]), 1-ethyl-3-methylimidazolium perchlorate ([emim][ClO$_4$]), 1-ethyl-3-methylimidazolium triflate ([emim][CF$_3$SO$_3$]), 1-ethyl-3-methylimidazolium hexafluorophosphate ([emim][PF$_6$]), 1-(2-hydroxyethyl)-3-methylimidazolium tetrafluoroborate ([hydemim][BF$_4$]), 1-butylpyridinium chloride ([bpy][Cl]) and 1-butyl-3-methypyridinuim tetrafluoroborate ([bmpy][BF$_4$]).

10. The method of claim 1, wherein said ionic liquid comprises a cation and an anion; wherein said cation is selected from the group consisting of 1-butyl-3-methylimidazolium ([bmim]), 1-ethyl-3-methylimidazolium ([emim]), 1-(2-hydroxyethyl)-3-methylimidazolium ([hydemim]), 1-butylpyridinium ([bpy]), 1-butyl-3-methypyridinuim ([bmpy]) and any combination of these; and wherein said anion is selected from the group consisting of tetrafluoroborate, bromide, chloride, hexafluorophosphate, nitrate, perchlorate, triflate and any combination of these.

11. The method of claim 1, wherein said metal particle precursor comprises metal ions or a source of metal ions.

12. The method of claim 11, wherein said metal ions are selected from the group consisting of copper ions, $Cu^{2+}$ ions, nickel ions, $Ni^{2+}$ ions, aluminum ions, $Al^{3+}$ ions, cobalt ions, $Co^{2+}$ ions, Au ions, Pt ions, Pd ions, Ru ions, Fe ions, Ti ions, Fe-Pt ions, Ir ions, Os ions, Re ions, W ions, Ta ions, Hf ions, and aggregates and clusters of these and any combination of these.

13. The method of claim 11, wherein said source of metal ions is dissolution of a metal salt in said nonaqueous polar solvent, wherein said metal salt is selected from the group consisting of $CuCl_2$, $CuBr_2$, $NiCl_2$, $NiBr_2$, $AlCl_3$, $AlBr_3$, $CoCl_2$, $CoBr_2$, $PtCl_2$, $PdCl_2$, $RuCl_2$, $FeCl_2$, and $IrCl_2$ and any combination of these.

14. The method of claim 1, wherein said step of depositing said metal nanoparticles is carried out in an absence of an applied electric field or an applied voltage.

15. The method of claim 1, wherein said nonaqueous solution is substantially free of dissolved oxygen.

16. The method of claim 1 wherein said substrate comprises one or more materials selected from the group consisting of $SiO_2$, silicon, glass, paper, ceramic, polymer, plastic, metal, metal oxide, dielectric, semiconductor, and biopolymers.

17. The method of claim 1, wherein said surface comprises a component of an integrated circuit or electronic device.

18. The method of claim 1, wherein said step of providing said substrate comprises functionalizing said surface so as to generate said surface having said net positive charge.

19. The method of claim 1, further comprising a step of stopping said step of depositing said metal nanoparticles onto said surface after formation of a conformal metal layer having a preselected thickness; wherein said stopping step comprises one or more of: decreasing a concentration of said ionic liquid in said nonaqueous solution; flushing said nonaqueous solution with a solvent; or removing said surface from said nonaqueous solution.

20. The method of claim 1, further comprising a step of sintering or annealing said conformal metal layer, thereby fusing at least a portion of said deposited metal nanoparticles.

21. The method of claim 1, the conformal layer including a mixture of two or more metals.

22. A method of tuning one or more optical properties, electrical properties, or morphological properties of a conformal metal layer formed on a surface of a substrate, the method comprising steps of:
contacting said surface with a nonaqueous solution; wherein said surface has a net positive charge; and wherein said nonaqueous solution comprises a nonaqueous polar solvent, a metal particle precursor and an ionic liquid;
generating a plurality of metal nanoparticles in said nonaqueous solution in contact with said surface, wherein said metal nanoparticles are at least partially coated with a negatively charged outer layer comprising said ionic liquid or a reaction product thereof; and
depositing said metal nanoparticles onto said surface, thereby forming said conformal metal layer,
wherein the one or more optical properties, electrical properties, or morphological properties of the conformal metal layer are tuned to a desired level by adjusting the concentration of the ionic liquid in the nonaqueous solution during the generating step, deposition step, or both, to an ionic liquid concentration corresponding to the desired one or more optical properties, electrical properties, or morphological properties;
wherein the optical properties, electrical properties, or morphological properties include one or more of electrical conductivity, light absorbance, photoluminescence, presence and amount of voids, surface roughness, and interparticle interactions.

23. The method of claim 22, the conformal layer including a mixture of two or more metals.

* * * * *